(12) United States Patent
Nakamura et al.

(10) Patent No.: US 7,598,578 B2
(45) Date of Patent: Oct. 6, 2009

(54) MAGNETIC ELEMENT AND SIGNAL PROCESSING DEVICE

(75) Inventors: Shiho Nakamura, Fujisawa (JP); Hirofumi Morise, Kawasaki (JP); Shigeru Haneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 332 days.

(21) Appl. No.: 11/390,475

(22) Filed: Mar. 28, 2006

(65) Prior Publication Data
US 2007/0064342 A1 Mar. 22, 2007

(30) Foreign Application Priority Data
Sep. 20, 2005 (JP) ............................. 2005-272794

(51) Int. Cl.
*H01L 41/00* (2006.01)
(52) U.S. Cl. .............................. 257/421; 257/E29.323; 257/E43.001; 977/933
(58) Field of Classification Search ................. 257/421, 257/422, 423, 424, 425, 426, 427, E29.323, 257/E43.001; 977/933, 935
See application file for complete search history.

(56) References Cited

U.S. PATENT DOCUMENTS

| | | | |
|---|---|---|---|
| 5,864,498 A | 1/1999 | Womack | |
| 6,480,412 B1 | 11/2002 | Bessho et al. | |
| 6,646,530 B2 | 11/2003 | Ruhrig | |
| 6,717,843 B1 | 4/2004 | Thewes et al. | |
| 6,754,100 B1 * | 6/2004 | Hayakawa | 365/173 |
| 6,762,954 B1 | 7/2004 | Edelstein | |
| 6,914,807 B2 | 7/2005 | Nakamura et al. | |
| 2003/0227807 A1* | 12/2003 | Nakamura et al. | 365/202 |
| 2004/0136120 A1* | 7/2004 | Hayakawa et al. | 360/324.2 |

FOREIGN PATENT DOCUMENTS

JP 2004-6775 1/2004

OTHER PUBLICATIONS

Ney et al., "Programmable computing with a single magnetoresistive element", Nature, vol. 425, Oct. 2, 2003.

(Continued)

*Primary Examiner*—Anh Phung
*Assistant Examiner*—Michael Lulis
(74) *Attorney, Agent, or Firm*—Nixon & Vanderhye, PC

(57) ABSTRACT

A magnetic element includes a channel layer, a first magnetic electrode which is in contact with the channel layer, a second magnetic electrode which is in contact with the channel layer and is insulated from the first magnetic electrode, a first intermediate layer which is provided adjacent to the first magnetic electrode and has a first insulating layer, a first magnetic layer which is provided in contact with a surface of the first intermediate layer on an opposite side to a surface contacting the first magnetic electrode to transfer magnetization to the first magnetic electrode, a first electrode which is connected to the first magnetic electrode, and a second electrode which is connected to the second magnetic electrode, at least one of the first electrode and the second electrode outputting a first signal which changes depending on a magnetic arrangement of the first magnetic electrode and the second magnetic electrode.

16 Claims, 35 Drawing Sheets

OTHER PUBLICATIONS

Meyners et al., "Submicron-sized magnetic tunnel junctions in field programmable logic gate arrays", Journal of Applied Physics 99, pp. 023907-1-023907-4, Jan. 27, 2006.

Meng et al., "A Spintronics Full Adder For Magnetic CPU", IEEE Electron Device Letters, vol. 26, No. 6, Jun. 2005.

Sugahara et al., "A spin metal-oxide-semiconductor field-effect transistor using half-metallic-ferromagnet contacts for the source and drain", Applied Physics Letters, vol. 84, No. 13, Mar. 29, 2004.

Matsuno et al., "Novel Reconfigurable Logic Gates Using Spin Metal-Oxide-Semiconductor Field-Effect Transistors", Japanese Journal of Applied Physics, vol. 43, No. 9A, 2004, pp. 6032-6037.

\* cited by examiner

Direct exchange coupling method

Interlayer exchange coupling method

Magnetostatic coupling method

Precession method

Magnetization state when no
current flows (antiparallel state)
(a)

Direction of e
(b)

Magnetization state when no
current flows (parallel state)
(a)

Direction of e
(b)

Spin-injection magnetization reversal method
(a) 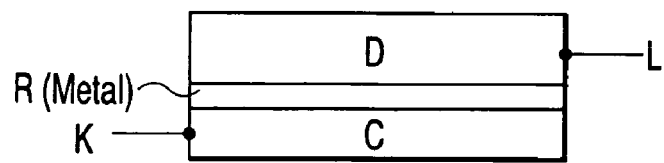
(b) 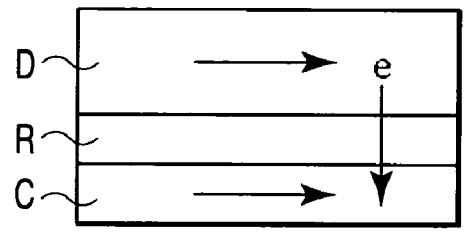
When electrons e flow from magnetic layer D to magnetic layer C
(c) 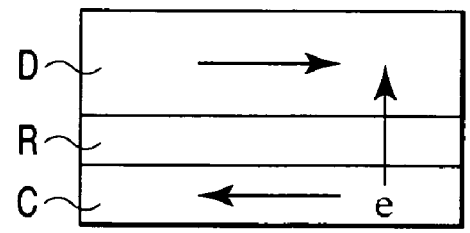
When electrons e flow from magnetic layer C to magnetic layer D
FIG. 13

Voltage-controlled magnetic method
(a) (Layered film of insulator and metal)
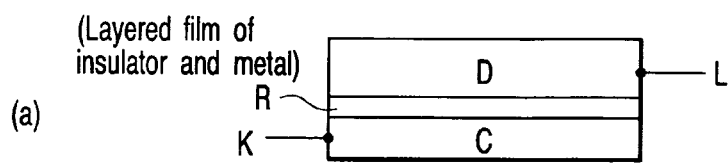
(b) 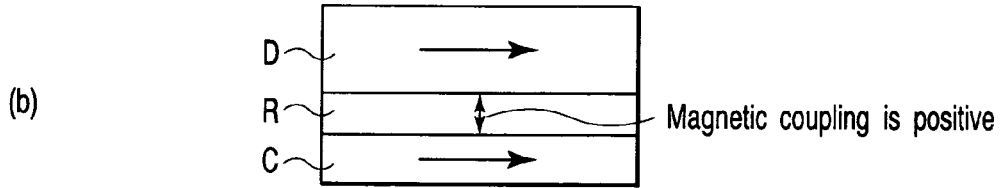
— Magnetic coupling is positive
(c) 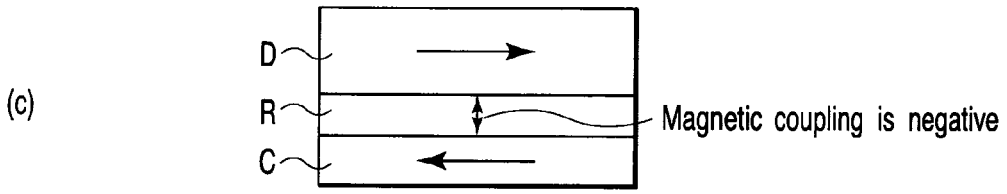
— Magnetic coupling is negative
(d) 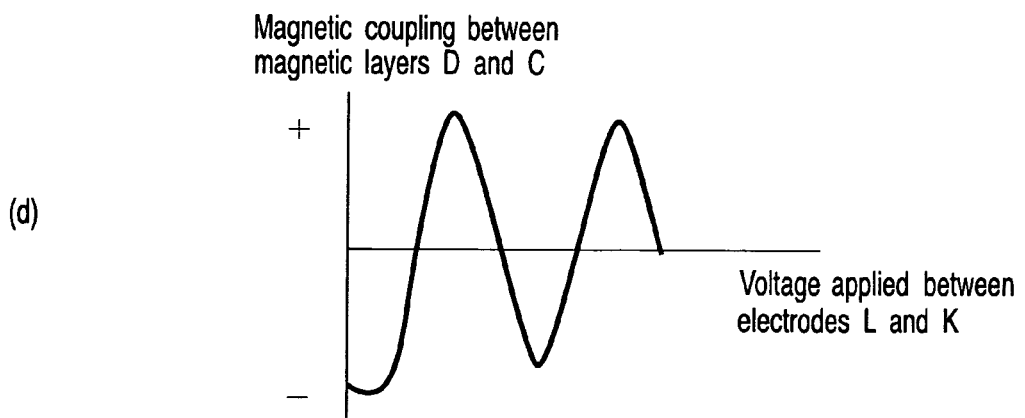
F I G. 1 4

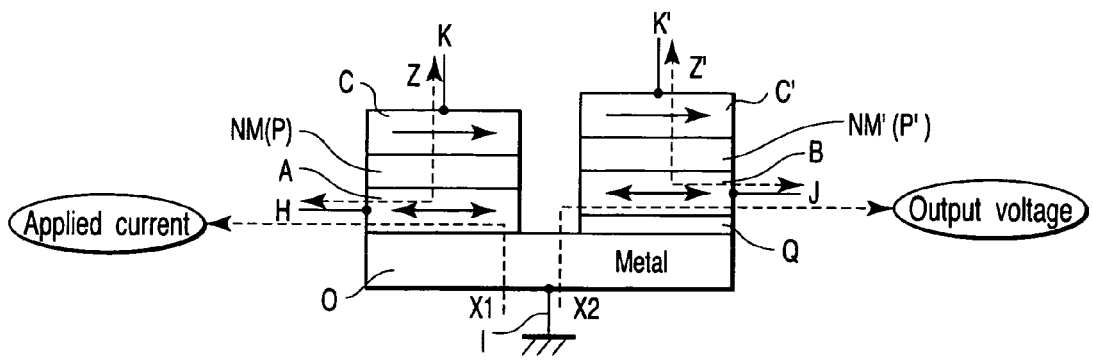
F I G. 2 1 C
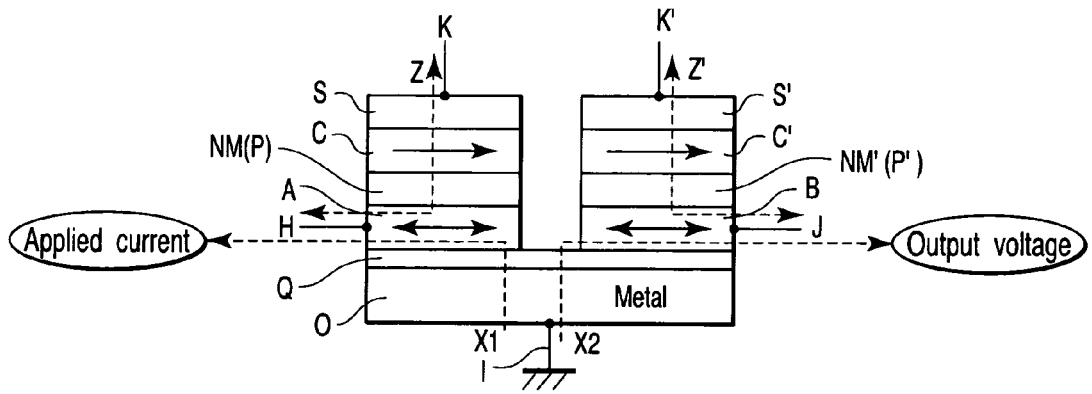
F I G. 2 1 D
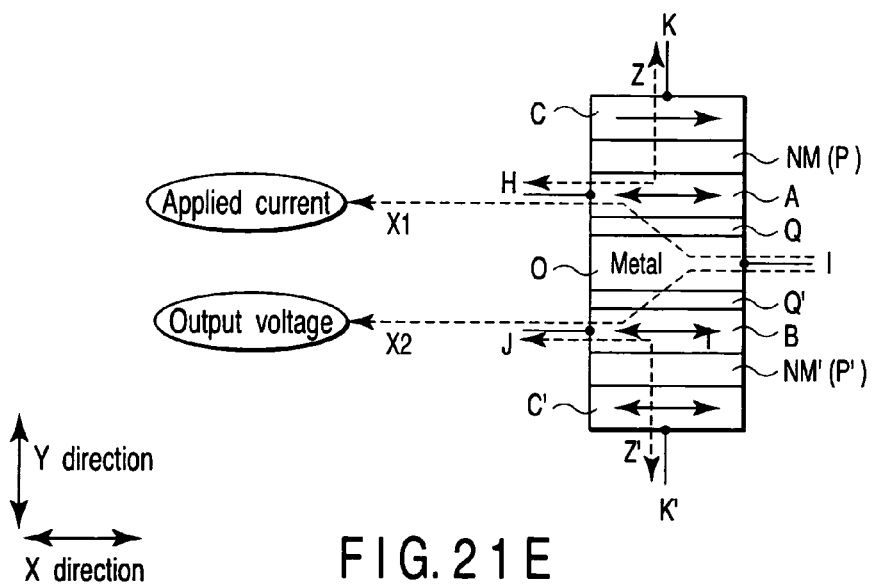
F I G. 2 1 E

MAGNETIC ELEMENT AND SIGNAL PROCESSING DEVICE

CROSS-REFERENCE TO RELATED APPLICATIONS

This application is based upon and claims the benefit of priority from prior Japanese Patent Application No. 2005-272794, filed Sep. 20, 2005, the entire contents of which are incorporated herein by reference.

BACKGROUND OF THE INVENTION

1. Field of the Invention

The present invention relates to a magnetic element which outputs a signal depending on the magnetic arrangement of two magnetic electrodes, and a magnetic signal processing device using the magnetic element.

2. Description of the Related Art

In the conventional electronics, the degree of freedom of "charges" is used as the degree of freedom of electrons. Recently, however, a field called spin electronics is rapidly rising, which positively uses "spin", i.e., another degree of freedom of electrons. When the degree of freedom of spin is used, a single element can have multiple functions. As a result, various kinds of devices are expected to become compact, and an energy saving effect is expected to be obtained. In addition, the nonvolatility of spin also contributes to energy saving.

Various kinds of spin transistors such as a spin MOSFET, spin SET, and spin resonance transistor have conventionally been designed by adding the degree of freedom of spin by changing the electrode portion of a MOSFET, single-electron transistor (SET), or resonance tunneling transistor to a magnetic material (e.g., S. Sugawara and M. Tanaka, Appl. Phys. Lett. 84, 2307 (2004), T. Matsuno, S. Sugawara, and M. Tanaka, Jpn. J. APPL. Phys. (2004)). Additionally, signal processing devices using the MR effect (TMR) between magnetic electrodes placed on and under a tunnel barrier have been proposed (e.g., A. Ney, et al., Nature, 425 (2003) 485, Jpn. Pat. Appln. KOKAI No. 2004-006775). These devices are fundamentally based on the spin dependent conduction phenomenon between two magnetic electrodes.

In these spin devices, how to control magnetization of the magnetic material serving as the electrode is of extreme importance in driving the devices. However, only a few devices are designed in consideration of magnetization control. The mainstream method controls magnetization of a magnetic material by a magnetic field, as is proposed by A. Ney, et al. However, in the magnetization control method using a magnetic field, since a nanolevel magnetic material is hard to select because of the nature of the magnetic field, crosstalk readily occurs. Also, the smaller the size becomes, the higher the required power is. Hence, size reduction of the element and power saving are expected to be difficult. To solve this problem, Jpn. Pat. Appln. KOKAI No. 2004-006775 discloses a device using switching by spin-injection magnetization reversal. However, in the technique of Jpn. Pat. Appln. KOKAI No. 2004-006775, it is difficult to operate signals of magnetization reversal and signal processing independently. Hence, devices are hard to integrate.

BRIEF SUMMARY OF THE INVENTION

According to a first aspect of the present invention, there is provided a magnetic element comprising a channel layer, a first magnetic electrode which is in contact with the channel layer, a second magnetic electrode which is in contact with the channel layer and is insulated from the first magnetic electrode, a first intermediate layer which is provided adjacent to the first magnetic electrode and has a first insulating layer, a first magnetic layer which is provided in contact with a surface of the first intermediate layer on an opposite side to a surface contacting the first magnetic electrode to transfer magnetization to the first magnetic electrode, a first electrode which is connected to the first magnetic electrode, and a second electrode which is connected to the second magnetic electrode, at least one of the first electrode and the second electrode outputting a first signal which changes depending on a magnetic arrangement of the first magnetic electrode and the second magnetic electrode.

According to a second aspect of the present invention, there is provided a magnetic signal processing device comprising a first magnetic element, and a second magnetic element, the first magnetic element comprising, a first channel layer, a first magnetic electrode which is in contact with the first channel layer, a second magnetic electrode which is in contact with the first channel layer and is insulated from the first magnetic electrode, a first intermediate layer which is provided adjacent to the first magnetic electrode and has a first insulating layer, a first magnetic layer which is provided in contact with a surface of the first intermediate layer on an opposite side to a surface contacting the first magnetic electrode to transfer magnetization to the first magnetic electrode, a first electrode which is connected to the first magnetic electrode, and a second electrode which is connected to the second magnetic electrode, the second magnetic element comprising a second channel layer, a third magnetic electrode which is in contact with the second channel layer, a fourth magnetic electrode which is in contact with the second channel layer and is insulated from the third magnetic electrode, a second intermediate layer which is provided adjacent to the third magnetic electrode and has a second insulating layer, a second magnetic layer which is provided in contact with a surface of the second intermediate layer on an opposite side to a surface contacting the third magnetic electrode to transfer magnetization to the third magnetic electrode, a third electrode which is connected to the third magnetic electrode, and a fourth electrode which is connected to the fourth magnetic electrode, at least one of the first electrode and the second electrode outputting a first signal which changes depending on a magnetic arrangement of the first magnetic electrode and the second magnetic electrode and inputting the first signal to the second magnetic layer.

According to a third aspect of the present invention, there is provided a magnetic signal processing device comprising a magnetic element, the magnetic element comprising a channel layer, a first magnetic electrode which is in contact with the channel layer a second magnetic electrode which is in contact with the channel layer and is insulated from the first magnetic electrode, a first intermediate layer which is provided adjacent to the first magnetic electrode and has a first insulating layer, a first magnetic layer which is provided in contact with a surface of the first intermediate layer on an opposite side to a surface contacting the first magnetic electrode to transfer magnetization to the first magnetic electrode, a second magnetic layer to transfer magnetization to the second magnetic electrode, a second intermediate layer which is provided between the second magnetic layer and the second magnetic electrode and has a second insulating layer, and a first electrode which is connected to the first magnetic electrode, and a second electrode which is connected to the second magnetic electrode, at least one of the first electrode and the second electrode outputting a first signal which changes depending on a magnetic arrangement of the first magnetic electrode and the second magnetic electrode, and a magnetization direction of the second magnetic layer being transferred to a magnetization direction of the second magnetic electrode by a magnetic coupling which acts between the second magnetic electrode and the second magnetic layer through the second intermediate layer.

According to a fourth aspect of the present invention, there is provided a magnetic signal processing device comprising a magnetic element, the magnetic element comprising, a channel layer, a first magnetic electrode which is in contact with the channel layer, a second magnetic electrode which is in contact with the channel layer and is insulated from the first magnetic electrode, a first intermediate layer which is provided adjacent to the first magnetic electrode and has a first insulating layer, a first magnetic layer which is provided in contact with a surface of the first intermediate layer on an opposite side to a surface contacting the first magnetic electrode to transfer magnetization to the first magnetic electrode, a second magnetic layer to transfer magnetization to the second magnetic electrode, a second intermediate layer which is provided between the second magnetic layer and the second magnetic electrode and has a second insulating layer, a first electrode which is connected to the first magnetic electrode, and a second electrode which is connected to the second magnetic electrode, at least one of the first electrode and the second electrode outputting a first signal which changes depending on a magnetic arrangement of the first magnetic electrode and the second magnetic electrode, negative or affirmative arithmetic processing being executed by inputting an input signal of 1 or 0 to the first magnetic layer, and an execution result being output as the first signal.

BRIEF DESCRIPTION OF THE SEVERAL VIEWS OF THE DRAWING

FIGS. 13(*a*) to 13(*c*) are views for explaining a magnetic element which uses a spin-injection magnetization reversal method according to the example of the present invention;

FIGS. 14(*a*) to 14(*d*) are views for explaining a magnetic element which uses the voltage-controlled magnetic method according to the example of the present invention;

FIGS. 21A, 21B, 21C, 21D, and 21E are schematic views of a magnetic element according to the seventh embodiment of the present invention;

DETAILED DESCRIPTION OF THE INVENTION

[1] Outline

Figure 1:
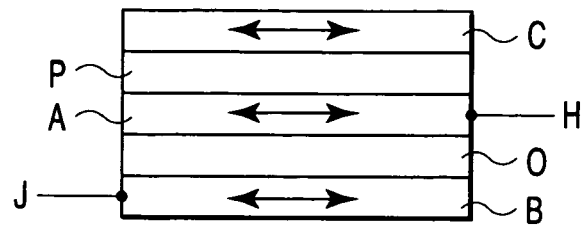
FIG. 1 is a schematic view for explaining the outline of a magnetic element according to an example of the present invention.
Figure 2A:
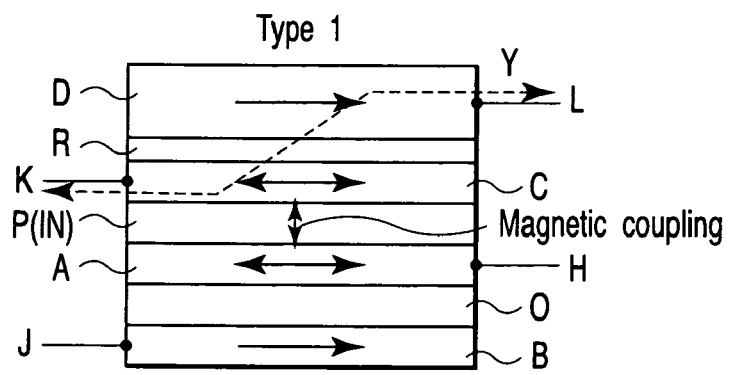
FIG. 2A is a schematic view for explaining the outline of a magnetic element according to an example (type 1) of the present invention.
Figure 2B:
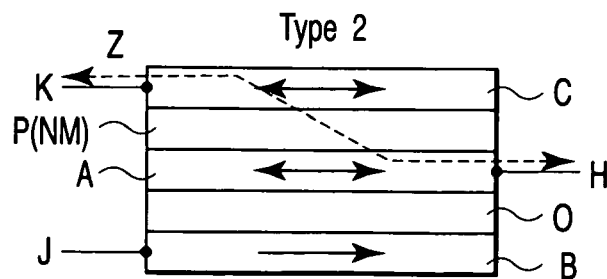
FIG. 2B is a schematic view for explaining the outline of a magnetic element according to another example (type 2) of the present invention.

FIG. 1 is a schematic view for explaining the outline of a magnetic element according to an example of the present invention. FIG. 2A is a schematic view for explaining the outline of a magnetic element according to an example (type 1) of the present invention. FIG. 2B is a schematic view for explaining the outline of a magnetic element according to another example (type 2) of the present invention. The outline of the magnetic element according to the example of the present invention will be described below.

As shown in FIG. 1, the magnetic element according to the example of the present invention comprises a channel layer O, magnetic electrodes A and B which contact the channel layer O without contacting each other, an intermediate layer P which has an insulating layer provided adjacent to the magnetic electrode A, a magnetic layer C which is provided in contact with a surface of the intermediate layer P on the opposite side to the magnetic electrode A, an electrode H connected to the magnetic electrode A, and an electrode J connected to the magnetic electrode B.

When a voltage or current is supplied to at least one of the electrodes H and J, a signal which changes depending on the magnetic arrangement of the magnetic electrodes A and B is output. The magnetic layer C is used for magnetic transfer to the magnetic electrode A. The magnetization direction of the magnetic electrode A is controlled in accordance with the magnetization direction of the magnetic layer C.

Such magnetic elements according to the example of the present invention can be classified into, e.g., type 1 or type 2 to be described below. However, all magnetic elements according to the example of the present invention are not always classified into type 1 or type 2.

As shown in FIG. 2A, in type 1, a magnetic layer D is provided on a side of the magnetic layer C opposite to the magnetic electrode A. The magnetization direction of the magnetic layer D is fixed. An intermediate layer R is provided between the magnetic layers C and D. An electrode L is connected to the intermediate layer R. The intermediate layer P includes a nonmagnetic or magnetic insulating layer IN. The magnetic electrode A and magnetic layer C are magnetically coupled via the insulating layer IN.

In type 1, the magnetization direction of the magnetic layer C is transferred to the magnetization direction of the magnetic electrode A by transmitting the magnetic information of the magnetic layer C to the magnetic electrode A by magnetic coupling through the intermediate layer P having an insulating layer. The magnetic layer C itself has free magnetization that can be reversed. When a signal Y is supplied between the electrodes L and K, the magnetization direction of the magnetic layer C is controlled. When a voltage or current is supplied to at least one of the electrodes H and J, a signal which changes depending on the magnetic arrangement of the magnetic electrodes A and B is output.

As shown in FIG. 2B, in type 2, the magnetic layer D and intermediate layer R of type 1 may be provided but need not always be provided. The magnetization direction of the magnetic layer C is fixed. The intermediate layer P having an insulating layer includes a nonmagnetic layer NM and is formed from, e.g., a layered film of a nonmagnetic insulating layer and nonmagnetic metal layer.

In type 2, the magnetization direction of the magnetic layer C is transferred to the magnetization direction of the magnetic electrode A by supplying a signal Z between the electrodes K and H. In type 2, the magnetization direction to be transferred depends on the magnitude of the signal Z so that the magnetization direction of the magnetic layer C and that of the magnetic electrode A become parallel or antiparallel. When a voltage or current is supplied to at least one of the electrodes H and J, a signal which changes depending on the magnetic arrangement of the magnetic electrodes A and B is output.

In the above description, the magnetic layer D of type 1 and the magnetic layer C of type 2 have a fixed magnetization direction. The term "fixed" is used in the following sense. In type 1, while the signal Y is supplied between the electrodes L and K to reverse the magnetization of the magnetic layer C, the magnetization of the magnetic layer D does not reverse under this condition. In type 2, while the signal Z is supplied between the electrodes H and K to reverse the magnetization of the magnetic layer A, the magnetization of the magnetic layer C does not reverse under this condition.

However, both the magnetic layer D of type 1 and the magnetic layer C of type 2 can also change the magnetization direction when the calculation function of the magnetic element is to be rewritten (made reconfigurable). This will be described later in detail in the 10th embodiment.

Figure 3A:
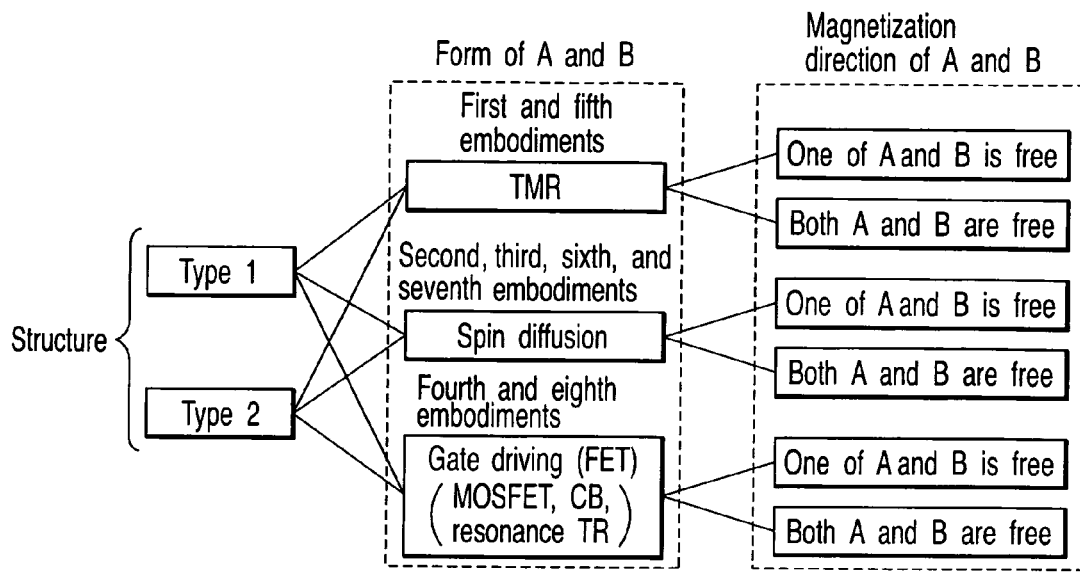
FIG. 3A is a view showing the magnetic elements of the example of the present invention, which are classified by the structure.

FIG. 3A is a view showing the magnetic elements of the example of the present invention, which are classified by the structure. The outline of classification of the magnetic elements according to the example of the present invention by the structure will be described below.

As shown in FIG. 3A, in the magnetic elements of types 1 and 2 according to the example of the present invention, the forms of the magnetic electrodes A and B can be classified into three types, e.g., TMR, spin diffusion, and gate driving (FET). The forms of the magnetic electrodes A and B are not limited to the three types.

In the magnetic elements of types 1 and 2 according to the example of the present invention, the magnetic arrangements of the magnetic electrodes A and B can be classified into two types, e.g., a case wherein one of the magnetic electrodes A and B is free and a case wherein both of the magnetic electrodes A and B are free. That "the magnetic electrodes A and B are free" indicates that the magnetization directions of the magnetic electrodes A and B can be reversed.

Figure 3B:
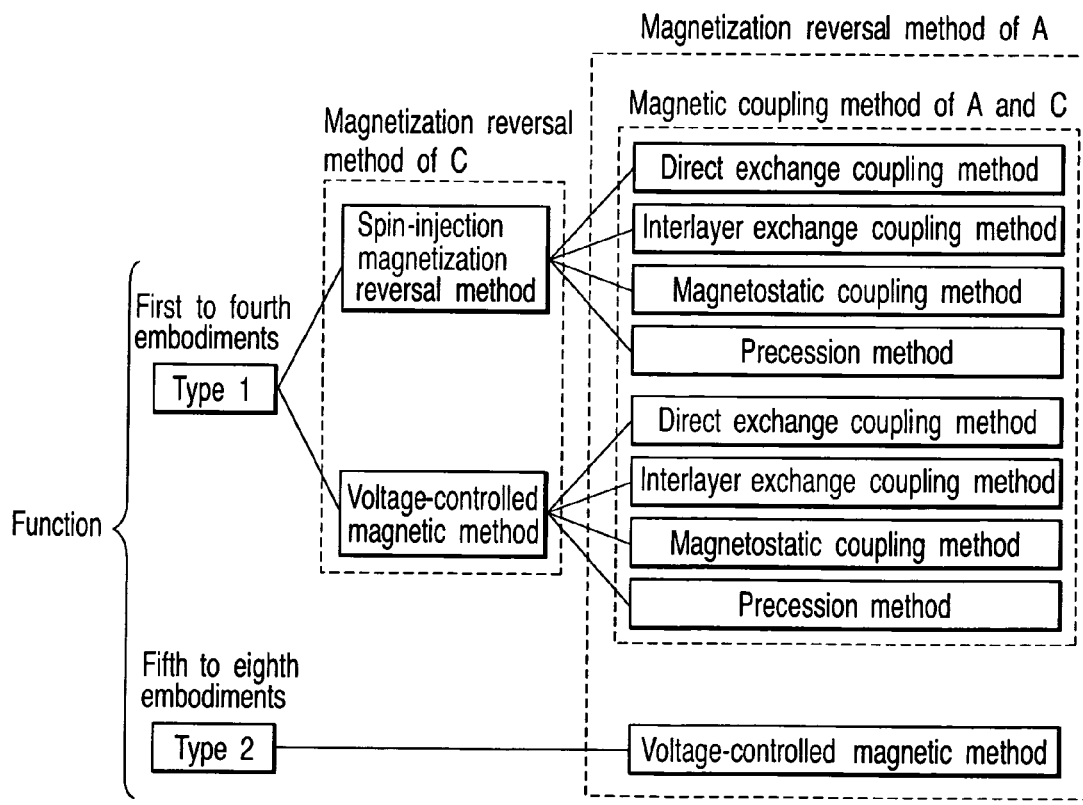
FIG. 3B is a view showing the magnetic elements of the example of the present invention, which are classified by the function.

FIG. 3B is a view showing the magnetic elements of the example of the present invention, which are classified by the function. The outline of classification of the magnetic elements according to the example of the present invention by the structure will be described below.

As shown in FIG. 3B, in the magnetic elements of type 1 according to the example of the present invention, e.g., two methods: a spin-injection magnetization reversal method and voltage-controlled magnetic method can be used for magnetization reversal of the magnetic layer C. The magnetization reversal method of the magnetic layer C is not limited to the two methods.

In the magnetic elements of type 1 according to the example of the present invention, the magnetization reversal of the magnetic electrode A uses magnetic coupling between the magnetic electrode A and the magnetic layer C. The magnetic coupling method between the magnetic electrode A and the magnetic layer C can be classified into four types, e.g., a direct exchange coupling method, interlayer exchange coupling method, magnetostatic coupling method, and precession method. The magnetic coupling method between the magnetic electrode A and the magnetic layer C is not limited to the four methods.

In the magnetic elements of type 2 according to the example of the present invention, the magnetization reversal method of the magnetic electrode A is a voltage-controlled magnetic method of applying a voltage between the magnetic electrode A and the magnetic layer C. The method is not limited to the voltage-controlled magnetic method.

[2] Forms of Magnetic Electrodes A and B

To change the output signal depending on the magnetic arrangement of the magnetic electrodes A and B, three well-known methods, i.e., [2-1] TMR, [2-2] spin diffusion, and [2-3] gate driving (FET) are used.

[2-1] TMR

Figure 4:
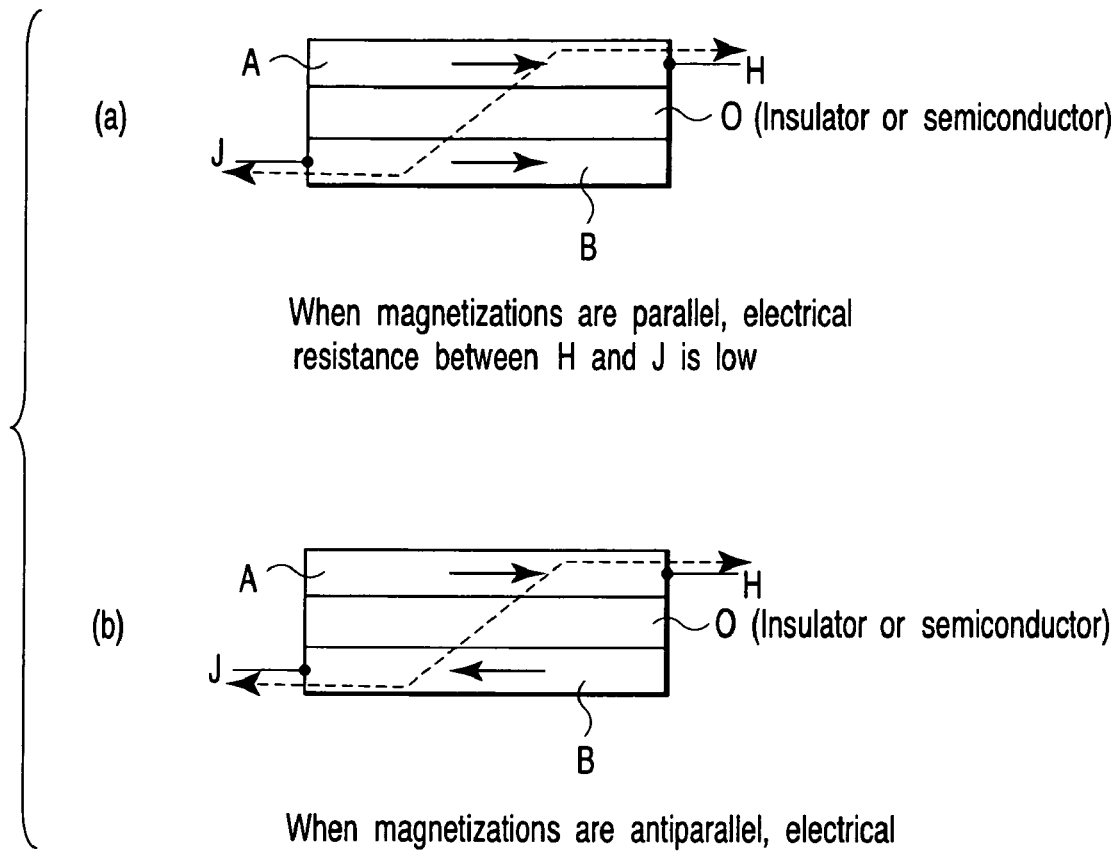
FIGS. 4(*a*) and 4(*b*) are schematic views of a TMR magnetic element according to the example of the present invention.

FIGS. 4(a) and 4(b) are schematic views of a TMR magnetic element according to the example of the present invention. The outline of the TMR magnetic element according to the example of the present invention will be described below.

As shown in FIGS. 4(a) and 4(b), in TMR, an insulating material or a semiconductor serving as a tunnel barrier is used as the channel layer O. A TMR effect which changes the electrical resistance depending on the relative angle between the magnetization directions of the magnetic electrodes A and B is used. Generally, when the magnetizations are parallel, the electrical resistance between the electrodes H and J is minimum. When the magnetizations are antiparallel, the electrical resistance between the electrodes H and J is maximum. A voltage is applied between the electrodes H and J to obtain a current as an output signal. Alternatively, a current is supplied between the electrodes H and J to obtain a voltage as an output signal.

[2-2] Spin Diffusion

Figure 5A:
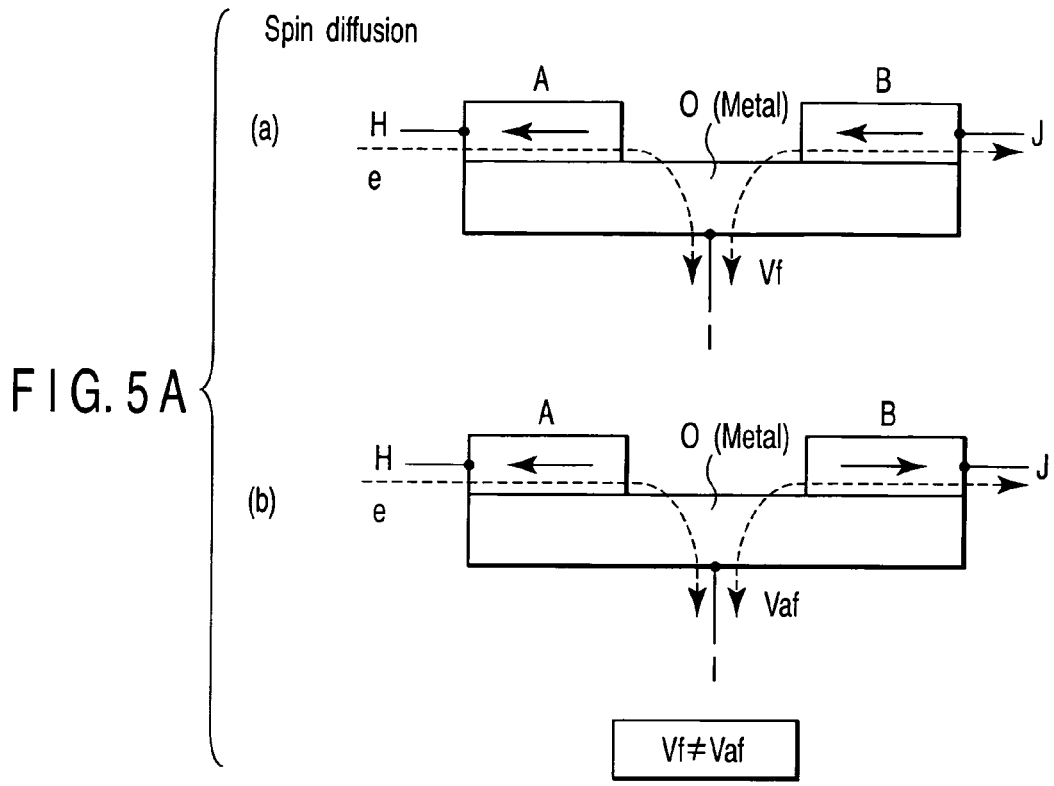
FIGS. 5A(a) and 5A(b) are schematic views of a spin diffusion magnetic element according to the example of the present invention, which has one output electrode.
Figure 5B:
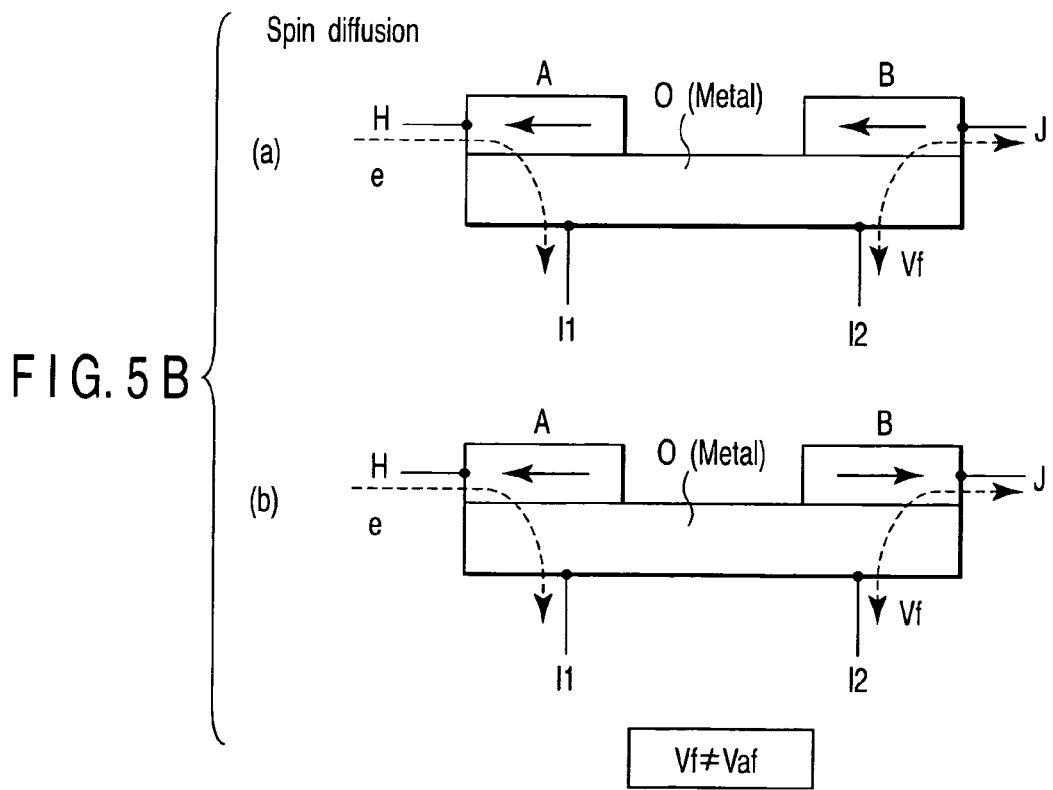
FIGS. 5B(a) and 5B(b) are schematic views of a spin diffusion magnetic element according to the example of the present invention, which has two output electrodes.
Figure 6A:
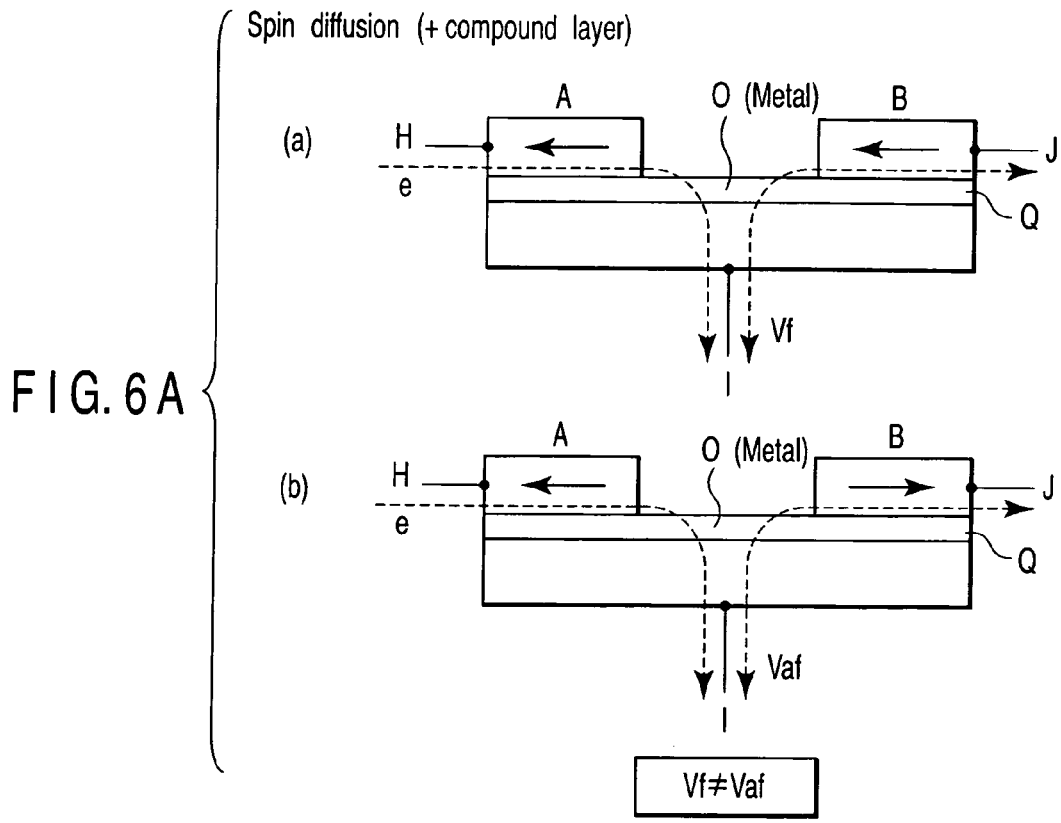
FIGS. 6A(a) and 6A(b) are schematic views of a spin diffusion magnetic element according to the example of the present invention, which has one output electrode and a compound layer.
Figure 6B:
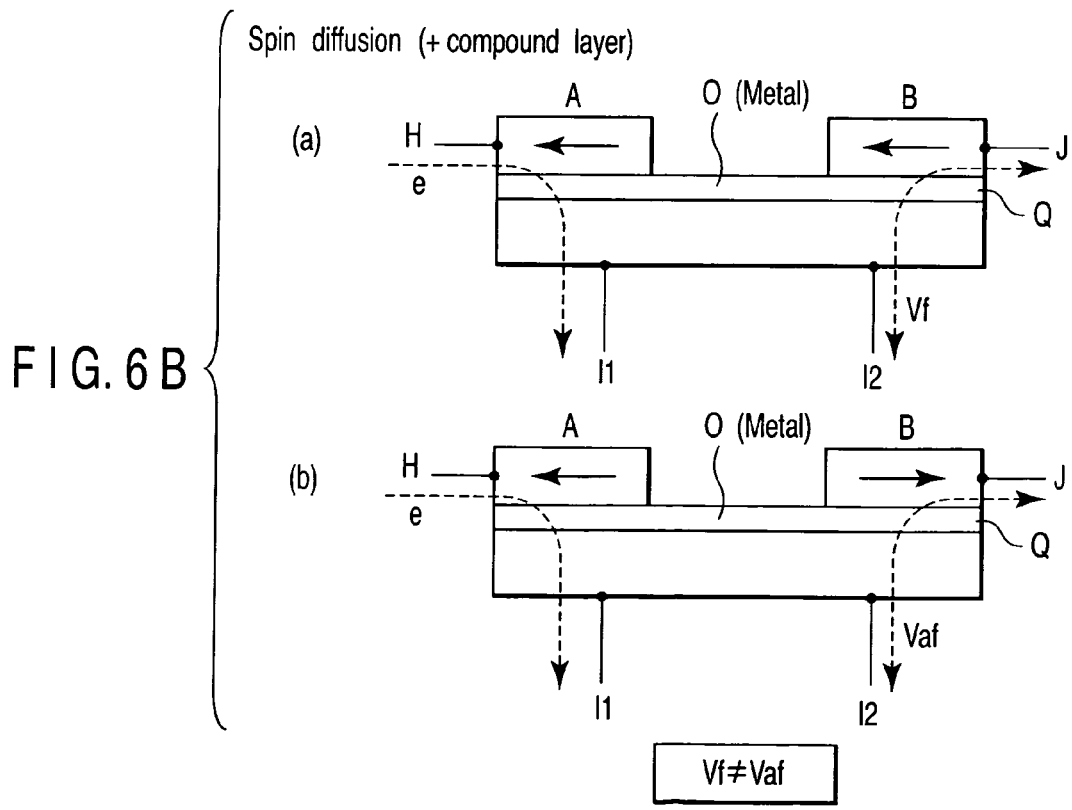
FIGS. 6B(a) and 6B(b) are schematic views of a spin diffusion magnetic element according to the example of the present invention, which has two output electrodes and a compound layer.

FIGS. 5A(a) and 5A(b) are schematic views of a spin diffusion magnetic element according to the example of the present invention, which has one output electrode. FIGS. 5B(a) and 5B(b) are schematic views of a spin diffusion magnetic element according to the example of the present invention, which has two output electrodes. FIGS. 6A(a) and 6A(b) are schematic views of a spin diffusion magnetic element according to the example of the present invention, which has one output electrode and a compound layer. FIGS. 6B(a) and 6B(b) are schematic views of a spin diffusion magnetic element according to the example of the present invention, which has two output electrodes and a compound layer. The outline of the spin diffusion magnetic elements according to the example of the present invention will be described below.

As shown in FIGS. 5A(a), 5A(b), 5B(a), and 5B(b), in spin diffusion, a metal is used for the channel layer O. An electrode I (one or a plurality of electrodes) is provided on the channel layer O. A current source (not shown) is connected to the electrode H or I. Electrons (to be referred to as spin-polarized electrons hereinafter) e which are spin-polarized are supplied between the electrodes H and I. Simultaneously, a voltage is applied between the electrodes J and I to obtain output voltages Vf and Vaf. The output voltages Vf and Vaf change depending on the magnetic arrangement of the magnetic electrodes A and B. A current flowing between the electrodes J and I can also be obtained as an output by applying a voltage between the electrodes H and I.

As shown in FIGS. 6A(a), 6A(b), 6B(a), and 6B(b), a compound layer Q containing at least one of oxygen, nitrogen, and fluorine may be provided between the channel layer O and the magnetic electrodes A and B. With this structure, the output voltages Vf and Vaf can be further increased.

[2-3] Gate Driving (FET)

Figure 7A:
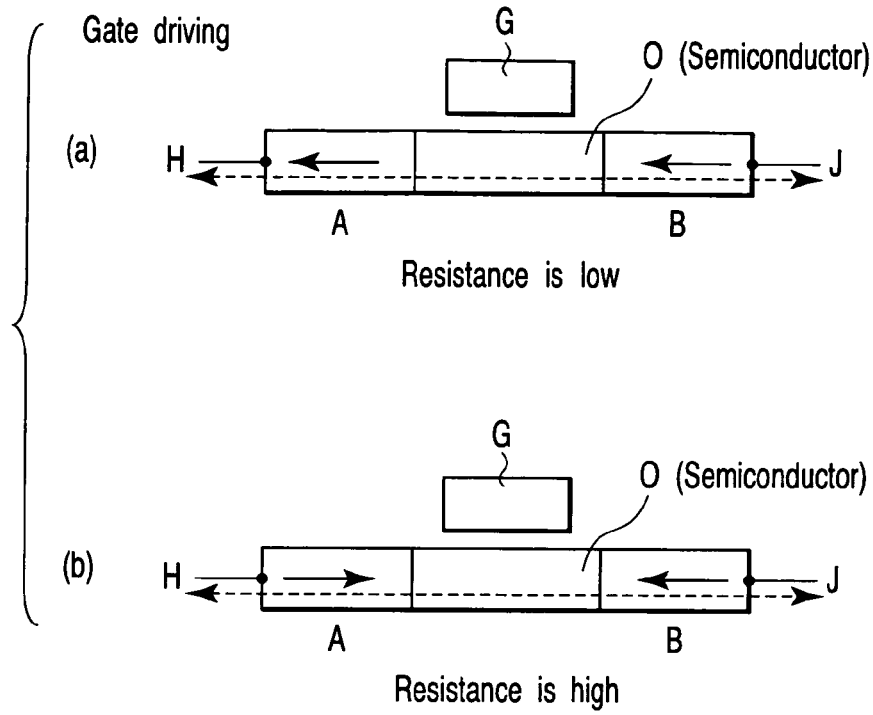
FIGS. 7A(a) and 7A(b) are schematic views of a gate driving magnetic element according to the example of the present invention, which has a channel of a semiconductor layer.
Figure 7B:
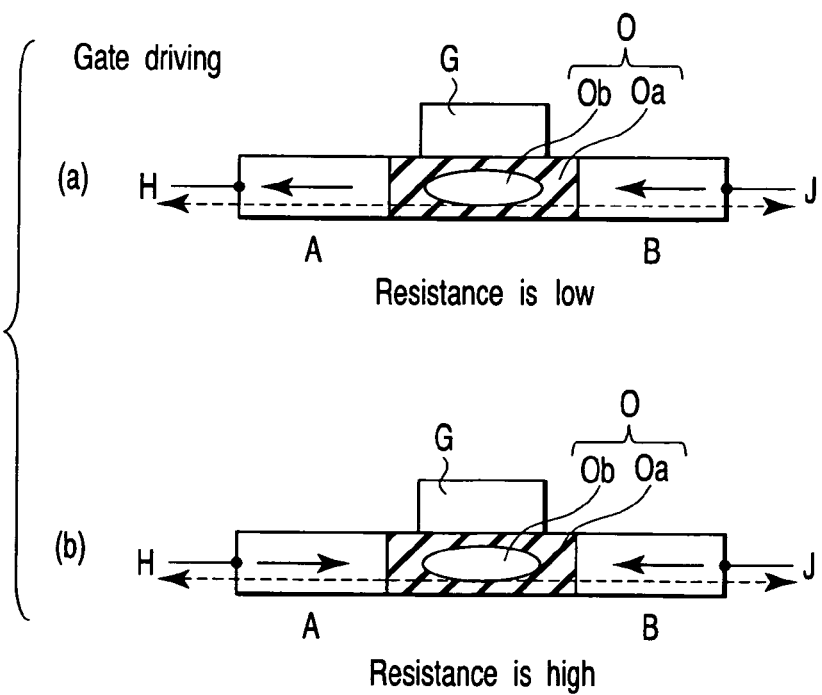
FIGS. 7B(a) and 7B(b) are schematic views of a gate driving magnetic element according to the example of the present invention, which has a channel made of a combination of an insulating material and a conductive material.

FIGS. 7A(a) and 7A(b) are schematic views of a gate driving magnetic element according to the example of the present invention, which has a channel of a semiconductor layer. FIGS. 7B(a) and 7B(b) are schematic views of a gate driving magnetic element according to the example of the present invention, which has a channel made of a combination of an insulating material and a conductive material. The outline of the gate driving magnetic elements according to the example of the present invention will be described below.

As shown in FIGS. 7A(a), 7A(b), 7B(a), and 7B(b), in gate driving, a semiconductor or a combination of an insulator Oa and conductor Ob is used for the channel layer O. The channel opens depending on the gate voltage. The resistance when the channel is open changes depending on the magnetic arrangement of the magnetic electrodes A and B. In a parallel magnetic arrangement, the resistance is minimum. In an antiparallel state, the resistance is maximum.

[3] Magnetization Reversal Method of Magnetic Electrode A

[3-1] Magnetic Coupling Method Between Magnetic Electrode A and Magnetic Layer C In the magnetic element of the example (type 1) of the present invention, the magnetization direction of the magnetic electrode A is controlled to a desired direction by using magnetic coupling between the magnetic electrode A and the magnetic layer C. For example, the following four magnetic coupling methods are used.

(a) Direct Exchange Coupling Method

Figure 8:
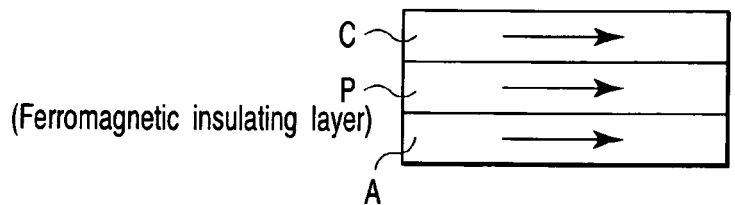
FIG. 8 is a schematic view of a magnetic element by a direct exchange coupling method according to the example of the present invention, which uses an intermediate layer P made of a ferromagnetic insulating material.

FIG. 8 is a schematic view of a magnetic element by a direct exchange coupling method according to the example of the present invention, which uses the intermediate layer P made of a ferromagnetic insulating material. The direct exchange coupling method according to the example of the present invention will be described below.

As shown in FIG. 8, in the direct exchange coupling method, a ferromagnetic insulating layer is used as the intermediate layer P. The ferromagnetism includes ferrimagnetism. In this case, the magnetic layer C, intermediate layer P, and magnetic electrode A are magnetically coupled to each other parallelly by the direct exchange interaction. Hence, the magnetization direction of the magnetic layer C can be magnetically parallelly transferred to the magnetic electrode A.

Figure 9:
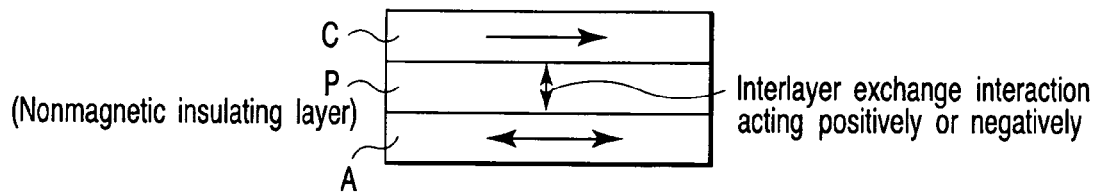
FIG. 9 is a schematic view of a magnetic element by an interlayer exchange coupling method according to the example of the present invention, which uses an intermediate layer P made of an insulating nonmagnetic material.

(b) Interlayer Exchange Coupling Method FIG. 9 is a schematic view of a magnetic element by an interlayer exchange coupling method according to the example of the present invention, which uses the intermediate layer P made of an insulating nonmagnetic material. The interlayer exchange coupling method according to the example of the present invention will be described below.

As shown in FIG. 9, in the interlayer exchange coupling method, a nonmagnetic insulating layer having a thickness of, e.g., 2 nm or less is used as the intermediate layer P. In this case, since negative or positive interlayer exchange interaction acts through the intermediate layer P (nonmagnetic insulating layer), the magnetic electrode A and magnetic layer C are antiferromagnetically or ferromagnetically coupled. As the intermediate layer P (nonmagnetic insulating layer) becomes thin, magnetic coupling becomes strong. When the intermediate layer P is thicker than 2 nm, coupling rarely acts. A nonmagnetic conductive layer having a thickness of 1 nm or less may be provided adjacent to the nonmagnetic insulating layer. With this structure, the magnetization direction of the magnetic layer C is parallelly or antiparallelly transferred to the magnetization direction of the magnetic electrode A. The parallel or antiparallel state is determined by the material and thickness of the intermediate layer P.

(c) Magnetostatic Coupling Method

Figure 10:
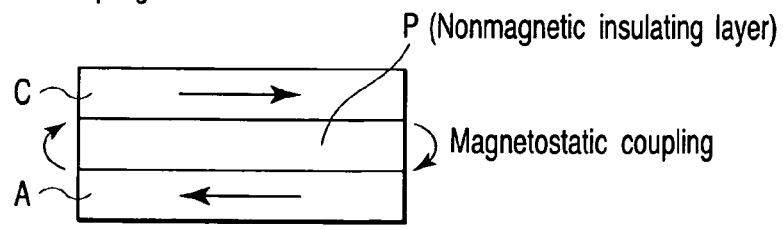
FIG. 10 is a schematic view of a magnetic element by a magnetostatic coupling method according to the example of the present invention, which uses an intermediate layer P made of an insulating nonmagnetic material.

FIG. 10 is a schematic view of a magnetic element by a magnetostatic coupling method according to the example of the present invention, which uses the intermediate layer P made of an insulating nonmagnetic material. The magnetostatic coupling method according to the example of the present invention will be described below.

As shown in FIG. 10, a nonmagnetic insulating layer is used as the intermediate layer P. The magnetic layer C and magnetic electrode A are magnetically coupled by magnetostatic coupling. This method is effective when the size of the magnetic layer C is small. With this structure, the magnetization direction of the magnetic layer C is magnetically antiparallelly transferred to the magnetization direction of the magnetic electrode A. The desirable size of the magnetic layer C is 200 nm or less. If the size is larger, no sufficient magnetostatic force acts on the magnetic electrode A.

(d) Precession Method

Figure 11A:
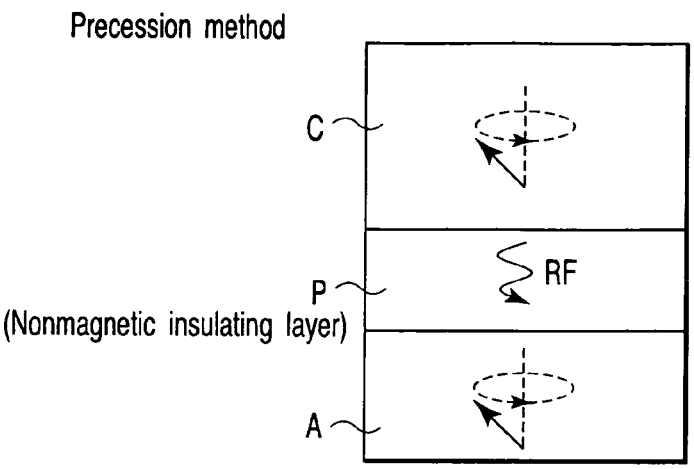
FIG. 11A is a schematic view of a magnetic element which uses a precession method according to the example of the present invention.
Figure 11B:
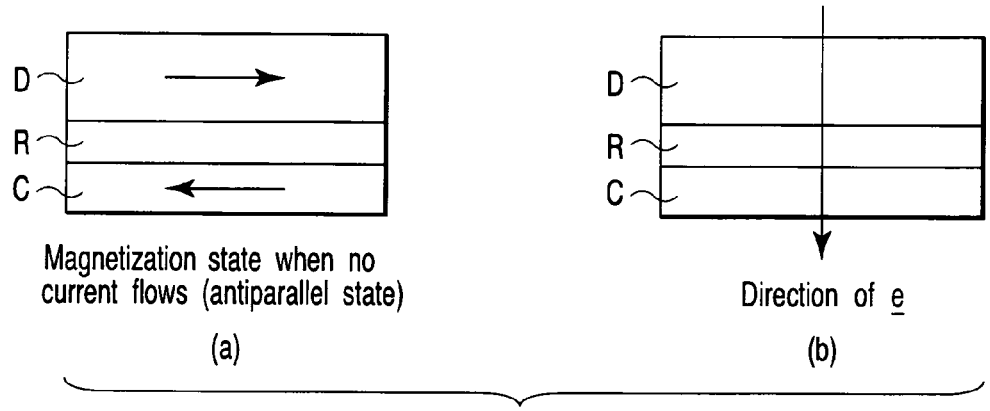
FIGS. 11B(a) and 11B(b) are schematic views of a magnetic element 1 which uses the precession method according to the example of the present invention.
Figure 11C:
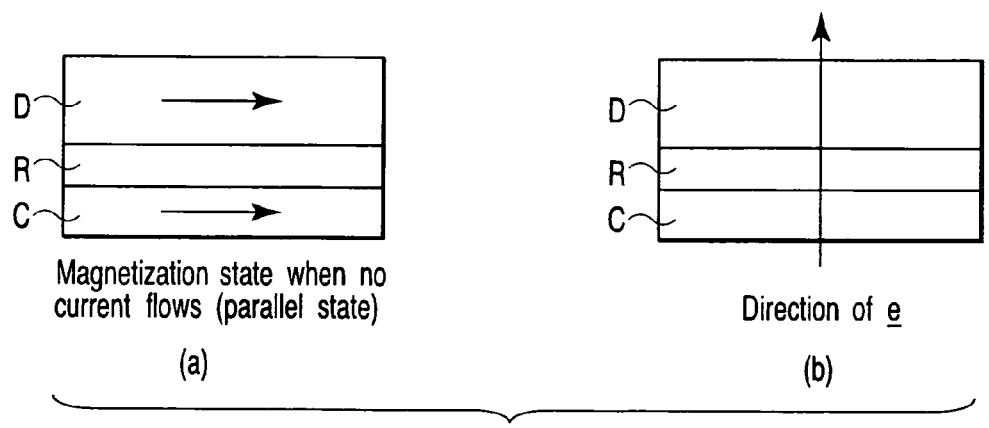
FIGS. 11C(a) and 11C(b) are schematic views of a magnetic element 2 which uses the precession method according to the example of the present invention.

FIG. 11A is a schematic view of a magnetic element which uses a precession method according to the example of the present invention. FIGS. 11B(a) and 11B(b) are schematic views of a magnetic element 1 which uses the precession method according to the example of the present invention. FIGS. 11C(a) and 11C(b) are schematic views of a magnetic element 2 which uses the precession method according to the example of the present invention. The precession method through a microwave according to the example of the present invention will be described below.

As shown in FIGS. 11B(a) and 11C(a), in the precession method, the intermediate layer R and the magnetically fixed magnetic layer D are provided on the magnetic layer C. As shown in FIG. 11A, the spin-polarized electrons e are supplied between the magnetic layers C and D to cause precession of the magnetization of the magnetic layer C. When a microwave RF output from the magnetic layer C at this time is absorbed by the magnetic electrode A, the magnetic layer C and magnetic electrode A are coupled by the precession. In this case, the effect can be increased by applying an external field simultaneously.

The magnetic element 1 shown in FIG. 11B(a) is formed when a negative interlayer exchange interaction acts between the magnetic layers D and C through the intermediate layer R or when the magnetic layers C and D are magnetostatically coupled. In these cases, when no current is supplied, the magnetization of the magnetic layer D and that of the magnetic layer C are antiparallel.

In this state, as shown in FIG. 11B(b), when a current is supplied to flow the spin-polarized electrons e from the magnetic layer D to the magnetic layer C, the magnetization of the magnetic layer C causes precession at a current of a predetermined threshold value or more. In addition, the microwave RF is generated by the precession.

The magnetic element 2 shown in FIG. 11C(a) is formed when a positive interlayer exchange interaction acts between the magnetic layers D and C through the intermediate layer R. In this case, when no current is supplied, the magnetization of the magnetic layer D and that of the magnetic layer C are parallel.

In this state, as shown in FIG. 11C(b), when a current is supplied to flow the spin-polarized electrons e from the magnetic layer C to the magnetic layer D, the magnetization of the magnetic layer C causes precession at a current of a predetermined threshold value or more. In addition, the microwave RF is generated by the precession.

[3-2] Voltage-Controlled Magnetic Method

In the magnetic element of the example (type 2) of the present invention, the magnetization direction of the magnetic electrode A is controlled to a desired direction by controlling the voltage to be applied between the magnetic electrode A and the magnetic layer C.

FIGS. 12(a) to 12(d) are schematic views showing a magnetic element which uses the voltage-controlled magnetic method according to the example of the present invention. The voltage-controlled magnetic method according to the example of the present invention will be described below.

As shown in FIG. 12(a), in the voltage-controlled magnetic method, the intermediate layer P having an insulating layer includes a nonmagnetic insulating layer. The nonmagnetic layer NM including an insulating layer and metal layer is used. As the nonmagnetic layer NM, for example, MgO+Au, MgO+Ag, or MgO+Cr can be used.

In the voltage-controlled magnetic method, a phenomenon wherein the magnetic coupling between the magnetic electrode A and the magnetic layer C is changed, as shown in FIG. 12(d), by the voltage applied between the electrodes H and K is used. That is, the applied voltage is controlled to cause positive magnetic coupling (FIG. 12(b)) or negative magnetic coupling (FIG. 12(c)) between the magnetic electrode A and the magnetic layer C. With this method, the magnetization direction of the magnetic layer C is transferred to the magnetization direction of the magnetic electrode A.

[4] Magnetization Reversal Method of Magnetic Layer C

As the magnetization reversal method of the magnetic layer C according to the example (type 1) of the present invention, two methods, e.g., [4-1] spin-injection magnetization reversal method and [4-2] voltage-controlled magnetic method can be used.

[4-1] Spin-Injection Magnetization Reversal Method

FIGS. 13(a) to 13(c) are views for explaining a magnetic element which uses a spin-injection magnetization reversal method according to the example of the present invention. The spin-injection magnetization reversal method according to the example of the present invention will be described below.

As shown in FIG. 13(a), in the spin-injection magnetization reversal method, the intermediate layer R is made of a conductive material and, preferably, a metal with a low resistance. However, the material of the intermediate layer R may be a semiconductor or insulator theoretically.

In the spin-injection magnetization reversal method, when the spin-polarized electrons e are injected from the magnetic layer D to the magnetic layer C, a parallel magnetic arrangement is obtained (FIG. 13(b)). When the spin-polarized electrons e are injected from the magnetic layer C to the magnetic layer D, an antiparallel magnetic arrangement is obtained (FIG. 13(c)). That is, in the spin-injection magnetization reversal method, the magnetization direction of the magnetic layer C is determined by the direction of the spin-polarized electrons e injected between the magnetic layers C and D.

However, when magnetostatic coupling is present between the magnetic layers C and D, the magnetic arrangement remains antiparallel at a weak current. When the current supplied from the magnetic layer D to the magnetic layer C becomes large, the magnetic arrangement changes to antiparallel.

[4-2] Voltage-Controlled Magnetic Method

FIGS. 14(a) to 14(d) are views for explaining a magnetic element which uses the voltage-controlled magnetic method according to the example of the present invention. The voltage-controlled magnetic method according to the example of the present invention will be described below.

As shown in FIG. 14(a), in the voltage-controlled magnetic method, the intermediate layer R uses a layered film including an insulating layer and metal layer.

In the voltage-controlled magnetic method, a phenomenon wherein the magnetic coupling between the magnetic layers D and C is changed, as shown in FIG. 14(d), by the voltage applied between the electrodes L and K is used. That is, the magnitude of the applied voltage is controlled to cause positive magnetic coupling (FIG. 14(b)) or negative magnetic coupling (FIG. 14(c)) between the magnetic layers D and C. With this method, the magnetization direction of the magnetic layer C is controlled.

The embodiments of the present invention will be described next in detail for each mode to detect an output changed based on the magnetic arrangement of the magnetic electrodes A and B. The first to fourth embodiments show examples of the magnetic element of type 1. The fifth to eighth embodiments show examples of the magnetic element of type 2. The ninth to 12th embodiments show examples of a magnetic signal processing device using the magnetic element of type 1 or 2.

[5] First Embodiment

In the first embodiment, an example of a TMR magnetic element of type 1 will be described.

[5-1] Structure

FIGS. 15A to 15H are schematic views showing a magnetic element according to the first embodiment of the present invention. The structure of the magnetic element according to the first embodiment of the present invention will be described below.

Figure 15A:
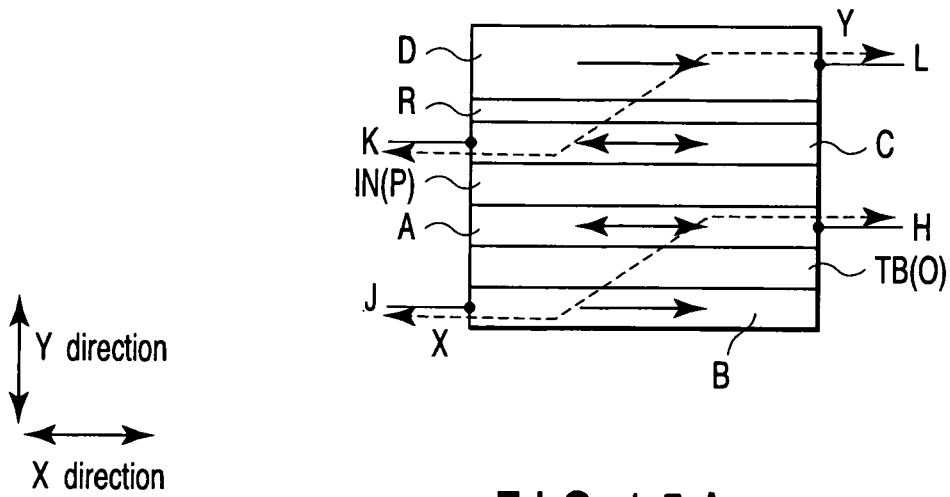
FIGS. 15A, 15B, 15C, 15D, 15E, 15F, 15G, and 15H are schematic views showing a magnetic element according to the first embodiment of the present invention.

As shown in FIG. 15A, the magnetic element according to the first embodiment comprises a channel layer O including a tunnel barrier layer TB, magnetic electrodes A and B which sandwich the channel layer O, a magnetic layer C provided on the side of the magnetic electrode A, a nonmagnetic or magnetic insulating layer IN (intermediate layer P) provided between the magnetic layer C and the magnetic electrode A, a magnetic layer D provided on a side of the magnetic layer C opposite to the magnetic electrode A, an intermediate layer R made of a metal or insulator and provided between the magnetic layers C and D, an electrode H connected to the magnetic electrode A, an electrode J connected to the magnetic electrode B, an electrode K connected to the magnetic layer C, and an electrode L connected to the magnetic layer D.

The magnetic electrodes A and B contact different surfaces of the tunnel barrier layer TB without contacting each other. The magnetic electrodes A and B, tunnel barrier layer TB, magnetic layers C and D, insulating layer IN, and intermediate layer R are stacked in the Y direction. In other words, the surfaces where the magnetic electrodes A and B, tunnel barrier layer TB, magnetic layers C and D, insulating layer IN, and intermediate layer R contact each other are parallel. The magnetic electrodes A and B, tunnel barrier layer TB, magnetic layers C and D, insulating layer IN, and intermediate layer R have almost the same area and coincident side surfaces.

To set the reference of magnetization direction, the magnetizations of the magnetic electrode B and magnetic layer D are fixed. On the other hand, the magnetic electrode A and magnetic layer C have reversible magnetizations and are magnetically coupled to each other. The magnetizations of the magnetic electrodes A and B and magnetic layers C and D can be either longitudinal magnetization or perpendicular magnetization.

At least one of the magnetic layer C and magnetic electrode A is made of a magnetic material that exhibits no hysteresis at room temperature. When such a magnetic material is used, magnetization reversal can occur at low power. When the magnetic electrode B is made of a material that exhibits hysteresis at room temperature, the arithmetic processing function can be rewritten as hardware.

A signal X which changes depending on the magnetic arrangement of the magnetic electrodes A and B is output by using the electrodes H and J. A signal Y to control the magnetization direction of the magnetic layer C is supplied by using the electrodes K and L. The electrodes H and J can be provided at any position of the magnetic electrodes A and B as far as the signal X can be supplied between the magnetic electrodes A and B. When the electrodes H and J are provided on different side surfaces, as shown in FIG. 15A, the read accuracy of a change in signal Y corresponding to the magnetic arrangement of the magnetic electrodes A and B can be increased. Similarly, the electrodes K and L can be provided at any position of the magnetic layers C and D as far as the signal Y can be supplied between the magnetic layers C and D. When the electrodes K and L are provided on different side surfaces, as shown in FIG. 15A, the controllability of the magnetization direction of the magnetic layer C can be increased.

The magnetic element according to the first embodiment is not limited to the structure shown in FIG. 15A and may variously be changed to, e.g., the structures shown in FIGS. 15B to 15H to be described below. The structures shown in FIGS. 15A to 15H may be combined.

Figure 15B:
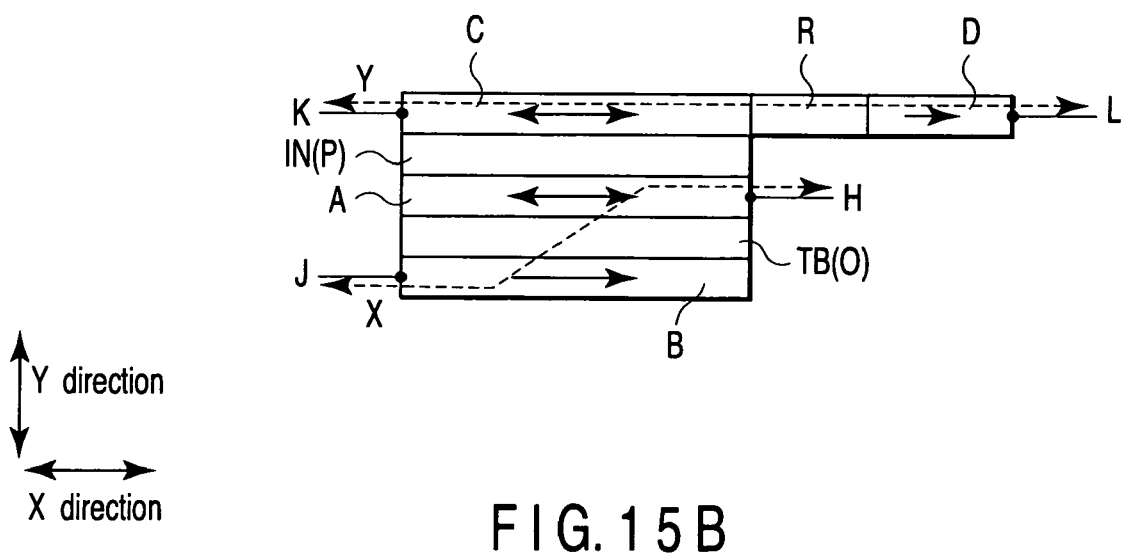

As shown in FIG. 15B, the intermediate layer R and magnetic layer D may be stacked in the X direction at an angle with respect to the magnetic electrodes A and B, tunnel barrier layer TB, insulating layer IN, and magnetic layer C which are stacked in the Y direction. In other words, the surfaces where the intermediate layer R and magnetic layers C and D contact each other are perpendicular to the surfaces where the magnetic electrodes A and B, tunnel barrier layer TB, insulating layer IN, and magnetic layer C contact each other. Even with this structure, the same effect as described above can be obtained.

Figure 15C:
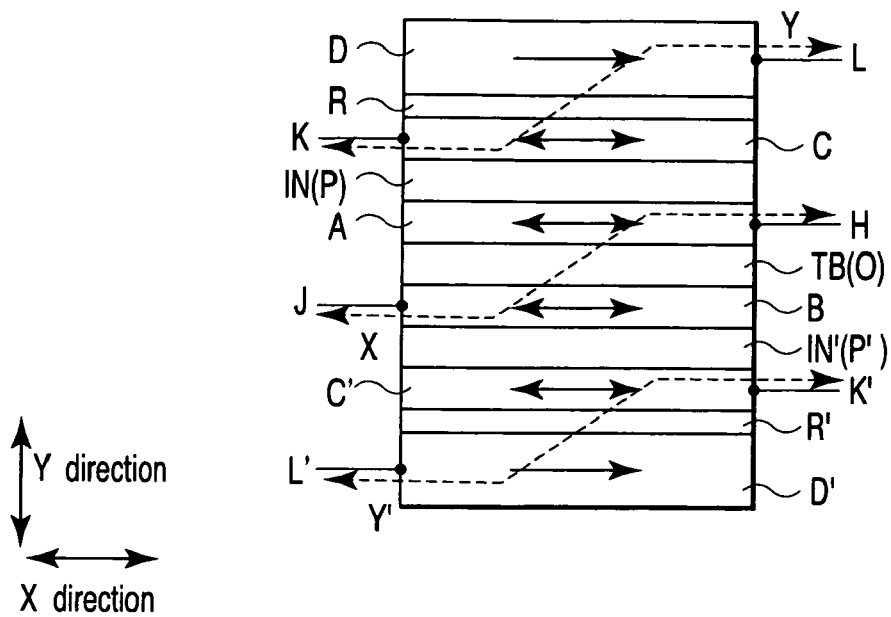

As shown in FIG. 15C, the magnetization of the magnetic electrode B may be reversible. In this case, a magnetic layer C' is provided on the side of the magnetic electrode B. An insulating layer IN' (intermediate layer P') is provided between the magnetic layer C' and the magnetic electrode B. A magnetic layer D' is provided on a side of the magnetic layer C' opposite to the magnetic electrode B. An intermediate layer R' is provided between the magnetic layers C' and D'. Electrodes K' and L' are connected to the magnetic layers C' and D', respectively. The electrodes K' and L' are used to supply a signal Y' to control the magnetization direction of the magnetic layer C'. In this structure, at least one of the magnetic layers C and C' and magnetic electrodes A and B is preferably made of a magnetic material that exhibits no hysteresis at room temperature.

Figure 15D:
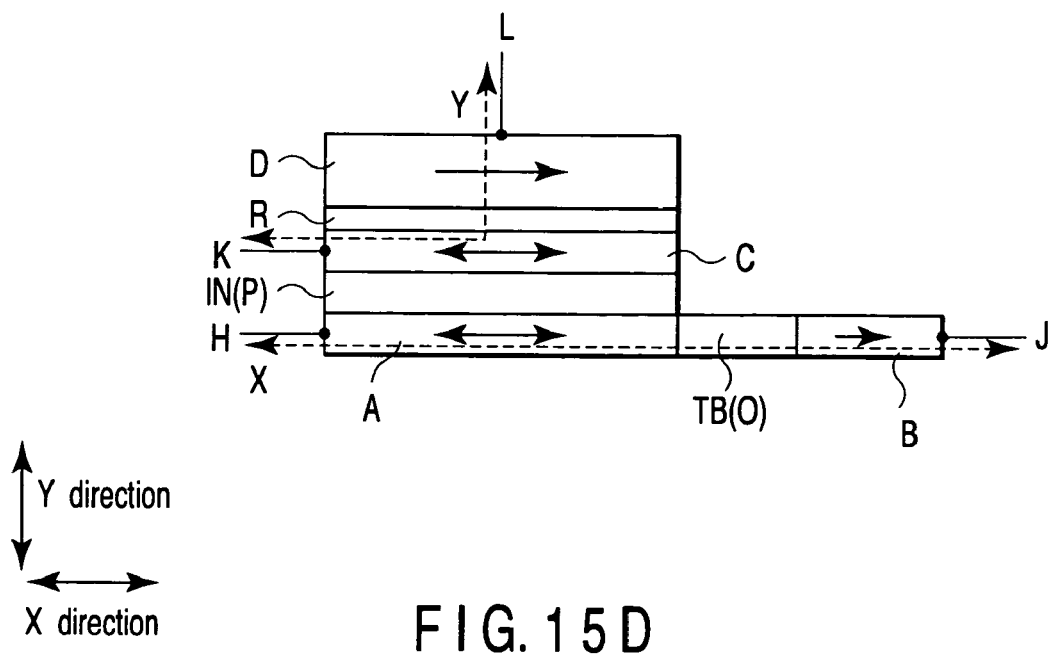

As shown in FIG. 15D, the magnetic electrode B and tunnel barrier layer TB may be stacked in the X direction at an angle with respect to the magnetic electrode A, insulating layer IN, magnetic layers C and D, and intermediate layer R which are stacked in the Y direction. In addition, the electrode L may be provided on the upper surface side of the magnetic layer D.

The magnetic electrodes A and B may have different areas. The magnetic electrode with a small area (the magnetic electrode B in FIG. 15D) has no hysteresis because of thermal fluctuation so that magnetic switching at low power is possible. As for the magnetic electrode with a large area (the magnetic electrode A in FIG. 15D), when recording is done in accordance with the magnetization direction while suppressing thermal fluctuation, the arithmetic processing function can be rewritten nonvolatilly by software.

One side of the magnetic electrodes A and B preferably has a length of 200 nm or less and, more preferably, 100 nm or less. If the size is larger than 200 nm, the influence of current field becomes large, and magnetization is hard to control.

Figure 15E:
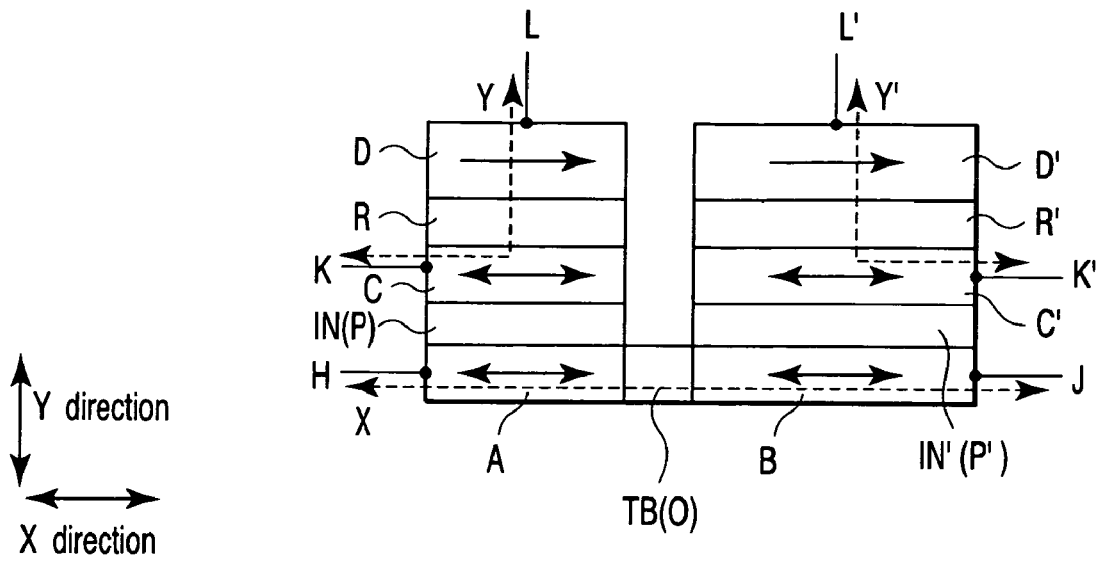

As shown in FIG. 15E, the magnetization of the magnetic electrode B may be reversible in the structure shown in FIG. 15D. In this case, the magnetic layer C' is provided above the magnetic electrode B. The insulating layer IN' (intermediate layer P') is provided between the magnetic layer C' and the magnetic electrode B. The magnetic layer D' is provided on a side of the magnetic layer C' opposite to the magnetic electrode B. The intermediate layer R' is provided between the magnetic layers C' and D'. The electrodes K' and L' are connected to the magnetic layers C' and D', respectively. The electrodes K' and L' are used to supply the signal Y' to control the magnetization direction of the magnetic layer C'.

Figure 15F:
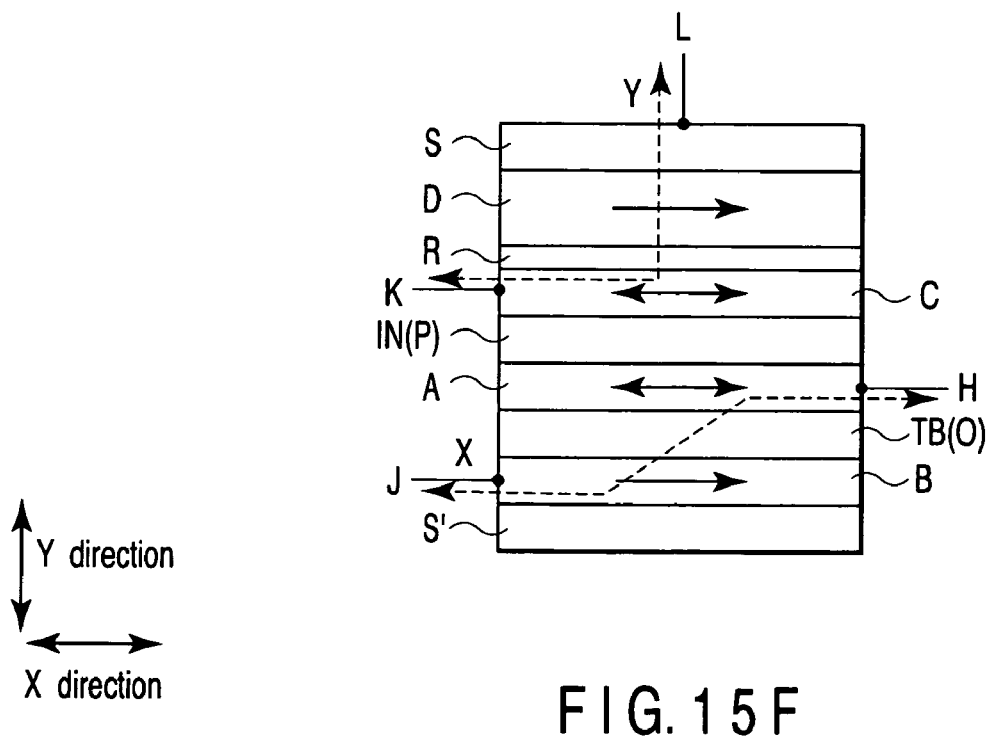

As shown in FIG. 15F, antiferromagnetic layers S and S' may be provided in contact with the magnetic electrode B and magnetic layer D, respectively, to fix their magnetizations. The electrode L can be provided on either the magnetic layer D or antiferromagnetic layer S. The electrode J is preferably provided on the magnetic electrode B, as shown in FIG. 15F, in consideration of the accuracy of the output signal X. However, the electrode J can be provided on the antiferromagnetic layer S'. When the antiferromagnetic layers S and S' are provided, a unidirectional magnetic anisotropy is given so that the magnetization is fixed. The magnetization can also be fixed by using a material with a large magnetocrystalline anisotropy without forming the antiferromagnetic layers S and S'.

Figure 15G:
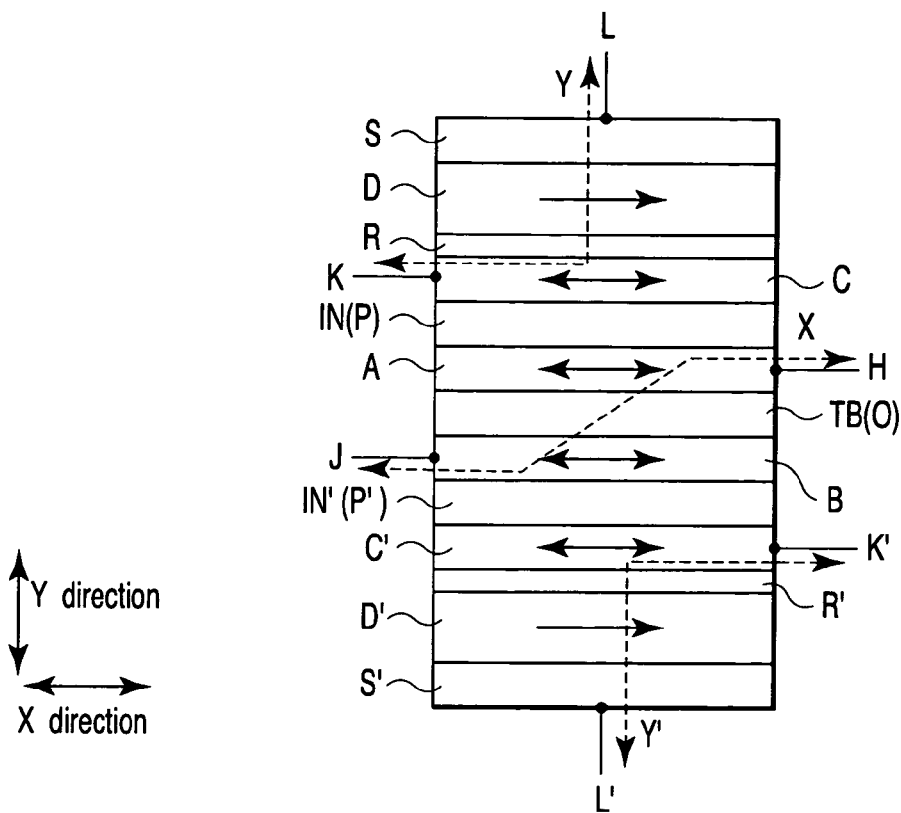

As shown in FIG. 15G, the magnetization of the magnetic electrode B may be reversible in the structure shown in FIG. 15F. In this case, the magnetic layer C' is provided under the magnetic electrode B. The insulating layer IN' (intermediate layer P') is provided between the magnetic layer C' and the magnetic electrode B. The magnetic layer D' is provided on a side of the magnetic layer C' opposite to the magnetic electrode B. The intermediate layer R' is provided between the magnetic layers C' and D'. The antiferromagnetic layer S' is provided in contact with the magnetic layer D'. The electrodes K' and L' are connected to the magnetic layer C' and antiferromagnetic layer S', respectively. The electrodes K' and L' are used to supply the signal Y' to control the magnetization direction of the magnetic layer C'.

Figure 15H:
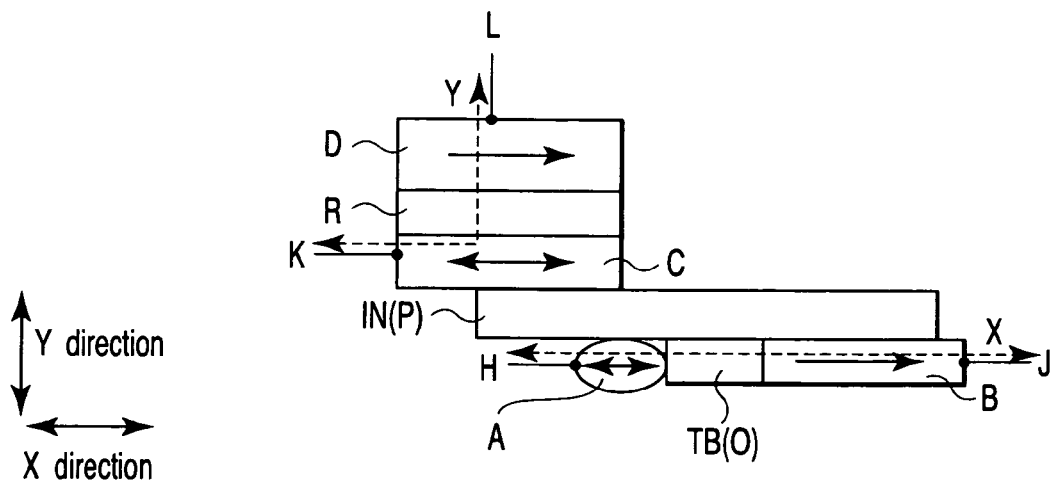

As shown in FIG. 15H, the in-plane shape of the magnetic electrodes A and B need not always be rectangular but can also be rhombic, elliptic, or circular. All the magnetic electrodes A and B, tunnel barrier layer TB, magnetic layers C and D, insulating layer IN, and intermediate layer R need not always have coincident side surfaces. The insulating layer IN may be extended to the magnetic electrode B if the insulating layer IN is provided between the magnetic electrode A and the magnetic layer C.

[5-2] Operation

The operation of the magnetic element according to the first embodiment of the present invention will be described below. The operation of the structure shown in FIG. 15A will be described here.

First, the signal Y is input between the electrodes K and L to control the magnetization of the magnetic layer C. As the method of controlling the magnetization of the magnetic layer C, the above-described spin-injection magnetization reversal method (FIG. 13) or voltage-controlled magnetic method (FIG. 14) can be used. More specifically, the magnetization direction of the magnetic layer C relative to the magnetic layer D is controlled by different mechanisms to be described below.

In the spin-injection magnetization reversal method, a conductive material and, preferably, a metal with a low resistance is used for the intermediate layer R. The magnetization direction of the magnetic layer C is controlled by the direction of the current to be supplied between the magnetic layers C and D. More specifically, when spin-polarized electrons are injected from the magnetic layer D to the magnetic layer C, the magnetization direction of the magnetic layer C is parallel to that of the magnetic layer D. When spin-polarized electrons are injected from the magnetic layer C to the magnetic layer D, the magnetization direction of the magnetic layer C is antiparallel to that of the magnetic layer D.

In the voltage-controlled magnetic method, a layered film including an insulating layer and metal layer is used as the intermediate layer R. A phenomenon wherein the magnetic coupling between the magnetic layers D and C is changed by the voltage applied between the electrodes L and K is used.

Second, the magnetic information of the magnetic layer C whose magnetization direction is controlled by the signal Y, as described above, is transferred to the magnetic electrode A by the magnetic coupling between the magnetic electrode A and the magnetic layer C through the insulating layer IN (by the magnetic coupling methods shown in FIGS. 8 to 11C). Since the insulating layer IN is provided between the magnetic layer C and the magnetic electrode A, only the magnetic information can be transmitted without any electrical signal interference.

Third, a voltage or current (called a driving voltage or driving current) is applied between the electrodes H and J to output a tunnel current or voltage (signal X) which changes depending on the magnetic arrangement of the magnetic electrodes A and B.

[5-3] Elements

The constituent elements (mainly materials) of the magnetic element will be described next in detail.

(a) Magnetic Electrodes A and B and Magnetic Layers C and D

As the material of the magnetic electrodes A and B and the magnetic layer C, for example, "iron (Fe) alone", "cobalt (Co) alone", "nickel (Ni) alone", an "alloy containing at least one element selected from the group containing of iron (Fe), cobalt (Co), nickel (Ni), manganese (Mn), and chromium (Cr)", an "NiFe-based alloy called a permalloy", a "soft magnetic material such as a CoNbZr-based alloy, FeTac-based alloy, CoTaZr-based alloy, FeAlSi-based alloy, FeB-based alloy, or CoFeB-based alloy", a "Heusler alloy, a magnetic semiconductor, or a half-metal magnetic oxide such as $CrO_2$, $Fe_3O_4$, or La1-XSrXMnO$_3$ (or half-metal magnetic nitride)" can be used.

As the above-described "magnetic semiconductor", a substance containing at least one magnetic element selected from iron (Fe), cobalt (Co), nickel (Ni), chromium (Cr), and manganese (Mn) and a compound semiconductor or oxide semiconductor can be used. More specifically, examples of the magnetic semiconductor are (Ga,Cr)N, (Ga,Mn)N, MnAs, CrAs, (Ga,Cr)As, ZnO:Fe, (Mg,Fe)O, and Co:TiO.

As the magnetic electrodes A and B and the magnetic layer C, a multilayered film including a magnetic layer, nonmagnetic layer, and magnetic layer which are antiferromagnetically coupled can also be used. In this case, a nonmagnetic metal layer such as ruthenium (Ru), iridium (Ir), or chromium (Cr), and an antiferromagnetic material are preferably used for the nonmagnetic layer. To obtain antiferromagnetic coupling, the nonmagnetic layer in the multilayered film preferably has a thickness of, e.g., 0.2 to 3 nm.

The magnetic electrodes A and B and the magnetic layer C can also use the following multilayered structure including multiple magnetic layers. For example, a layered body having a two-layered structure including [(Co or CoFe alloy)/(NiFe, a permalloy containing NiFeCo, or Ni)] or a three-layered structure including [(Co or CoFe alloy)/(NiFe, a permalloy containing NiFeCo, or Ni)/(Co or CoFe alloy)] may be used.

As the material of the magnetic electrodes A and B and the magnetic layer C, which exhibits no hysteresis at room temperature (which has no coercive force at room temperature), a magnetic material or magnetic semiconductor which exhibits magnetic fluctuation at room temperature can be used. The magnetic fluctuation can be defined by the material, size (thickness and dimensions), and anisotropy (including the shape).

A state wherein the magnetization is not definite in one direction within a given time range at room temperature is expressed as "the magnetization fluctuates". The given time range is related to the time for element operation and more specifically indicates a time of several ten sec or less.

Let Ku be the magnetic anisotropy of the magnetic electrodes A and B, and V be their volume. To obtain magnetic fluctuation by the size or magnetic anisotropy of the magnetic electrodes A and B, $KuV/kT<20$ preferably holds. If $20 \leq KuV/kT \leq 50$, the magnetic fluctuation is slow, and the reversal varies largely. If $KuV/kT<20$, appropriate magnetic fluctuation can be obtained within the current application time. Hence, the reversal current can be made small, and high-speed reversal can be implemented.

When a normal magnetic material is used, the more general in-plane size of the magnetic electrodes A and B and the magnetic layers C and D is 200 nm or less in the longitudinal direction, preferably, 100 nm or less, and more preferably, several ten nm. It is also preferable to make the thickness as small as several nm (<10 nm) or make the aspect ratio close to 1.

For example, if the element size or shape anisotropy must be large, the characteristic is implemented by selecting the material. More specifically, a granular film formed by dispersing magnetic fine particles in a nonmagnetic matrix, or a low-saturation magnetic material is preferably used.

Examples of the above-described "magnetic fine particles" are fine particles of "iron (Fe) alone", "cobalt (Co) alone", "nickel (Ni) alone", an "alloy containing at least one element selected from the group containing of iron (Fe), cobalt (Co), nickel (Ni), manganese (Mn), and chromium (Cr)", an "NiFe-based alloy called a permalloy", a "soft magnetic material such as a CoNbZr-based alloy, FeTac-based alloy, CoTaZr-based alloy, FeAlSi-based alloy, FeB-based alloy, or CoFeB-based alloy", a "Heusler alloy, a magnetic semiconductor, or a half-metal magnetic oxide such as $CrO_2$, $Fe_3O_4$, or La1-XSrXMnO$_3$ (or half-metal magnetic nitride)". Examples of the "magnetic semiconductor" have already been described above. To obtain fluctuation, the size of a magnetic fine particle is preferably 10 nm or less.

As the above-described "nonmagnetic matrix", a nonmagnetic metal such as Cu, Au, or Ag, or a semiconductor or dielectric material such as GaN, GaAs, ZnO, MgO, TiO, $Al_2O_3$, $SiO_2$, or AlN can be used. The above-described oxide or nitride generally contains element defects, though such a dielectric film can be used without problem.

When fluctuation is to be obtained in the magnetic electrodes A and B and the magnetic layer C by reducing the size or magnetic anisotropy, a material having a magnetic characteristic suitable for the application purpose is preferably selected from the following substances.

For example, "iron (Fe) alone", "cobalt (Co) alone", "nickel (Ni) alone", an "alloy containing at least one element selected from the group containing of iron (Fe), cobalt (Co), nickel (Ni), manganese (Mn), and chromium (Cr)", an "NiFe-based alloy called a permalloy", a "soft magnetic material such as a CoNbZr-based alloy, FeTac-based alloy, CoTaZr-based alloy, FeAlSi-based alloy, FeB-based alloy, or CoFeB-based alloy", a "Heusler alloy, a magnetic semiconductor, or a half-metal magnetic oxide such as $CrO_2$, $Fe_3O_4$, or La1-XSrXMnO$_3$ (or half-metal magnetic nitride)" can be used. Examples of the "magnetic semiconductor" have already been described above.

As the ferromagnetic material of the magnetic layer D and the magnetic electrode B which forms a magnetization fixing portion in magnetization fixing, a material having a magnetic characteristic suitable for the application purpose is preferably selected from the following substances.

For example, "iron (Fe) alone", "cobalt (Co) alone", "nickel (Ni) alone", "alloy containing at least one element selected from the group containing of iron (Fe), cobalt (Co), nickel (Ni), manganese (Mn), and chromium (Cr)", an "NiFe-based alloy called a permalloy", a "soft magnetic material such as a CoNbZr-based alloy, FeTac-based alloy, CoTaZr-based alloy, FeAlSi-based alloy, FeB-based alloy, or CoFeB-based alloy", a "Heusler alloy, a magnetic semiconductor, or a half-metal magnetic oxide such as $CrO_2$, $Fe_3O_4$, or La1-

XSrXMnO$_3$ (or half-metal magnetic nitride)" can be used. Examples of the "magnetic semiconductor" have already been described above.

The magnetic layer used for the fixing portion can be made of a continuous magnetic material or have a composite structure obtained by precipitating or forming fine particles of a magnetic material in a nonmagnetic matrix. A composite structure called, e.g., a "granular magnetic material" can be used.

The fixing portion can be formed by a multilayered film including a magnetic layer, nonmagnetic layer, and magnetic layer which are antiferromagnetically or ferromagnetically coupled. The magnetic/nonmagnetic/magnetic structure with antiferromagnetic coupling is especially preferable because the leakage field can be eliminated. A nonmagnetic metal layer such as ruthenium (Ru), iridium (Ir), or chromium (Cr), and an antiferromagnetic material are preferably used for the nonmagnetic layer of the multilayered film. To obtain antiferromagnetic coupling or ferromagnetic coupling, the nonmagnetic layer preferably has a thickness of, e.g., 0.2 to 3 nm.

The magnetic fixing portion can also use the following multilayered structure including multiple magnetic layers. For example, a layered body having a two-layered structure including [(Co or CoFe alloy)/(NiFe, a permalloy containing NiFeCo, or Ni)] or a three-layered structure including [(Co or CoFe alloy)/(NiFe, a permalloy containing NiFeCo, or Ni)/(Co or CoFe alloy)] may be used.

(b) Antiferromagnetic Layer S

When the magnetic layer D or magnetic electrode B is to be magnetically fixed, the fixing force can be increased by providing the antiferromagnetic layer S in direct contact with the magnetic layer D or magnetic electrode B. As the material of the antiferromagnetic layer S, iron manganese (FeMn), platinum manganese (PtMn), palladium manganese (PdMn), or palladium platinum manganese (PdPtMn) is preferably used.

(c) Intermediate Layer R

Figure 12:
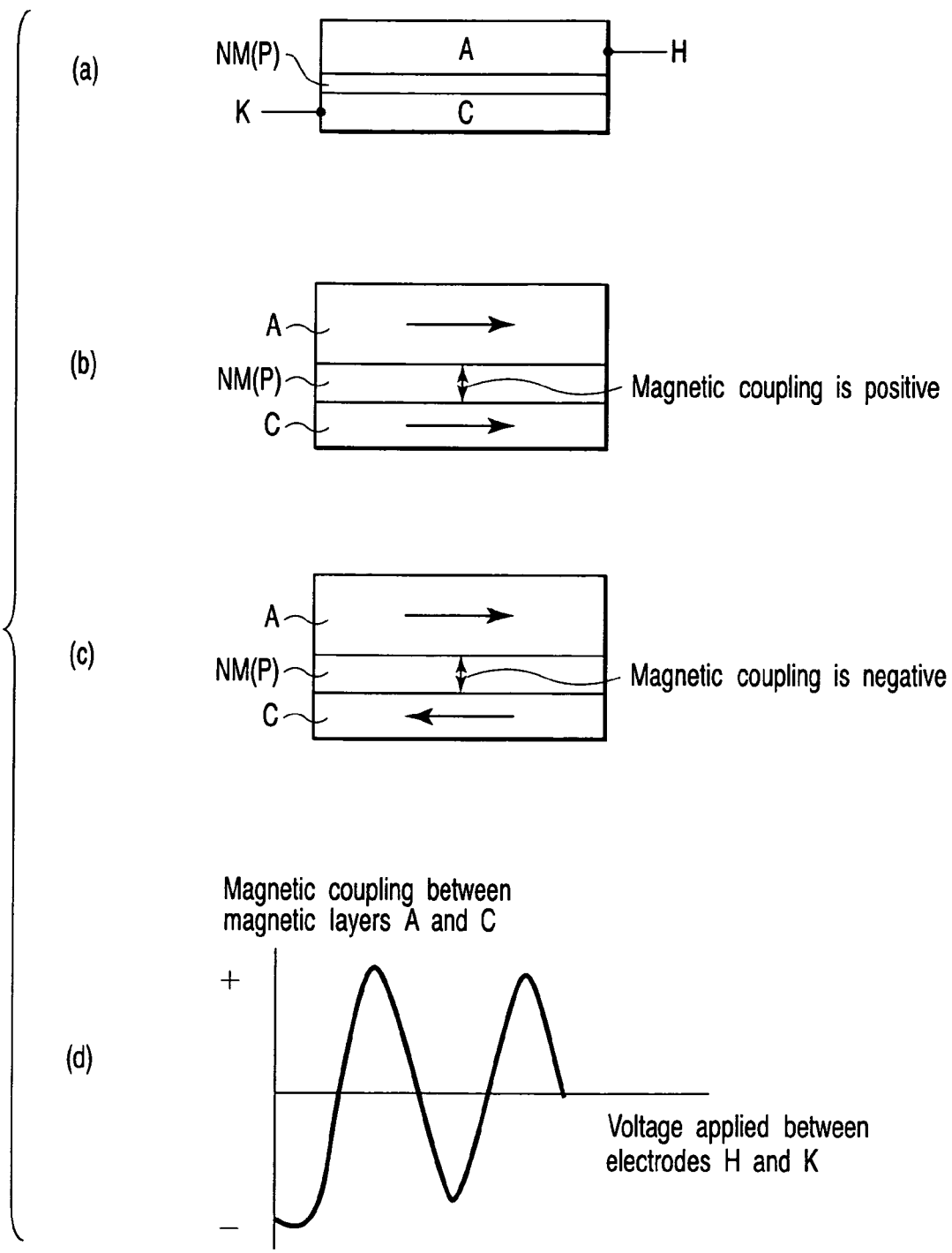
FIGS. 12(*a*) to 12(*d*) are schematic views showing a magnetic element which uses a voltage-controlled magnetic method according to the example of the present invention.

When the magnetization of the magnetic layer C is to be controlled by the spin-injection magnetization reversal method shown in FIG. 12(*a*), a low-resistance material is preferably used for the intermediate layer R. Examples of the low-resistance material are copper (Cu), gold (Au), silver (Ag), aluminum (Al), and an alloy containing at least one of them. The magnetization reversal effect can be obtained when the intermediate layer R has a thickness of, e.g., 1 to 60 nm.

When the magnetization of the magnetic layer C is to be controlled by the voltage-controlled magnetic method shown in FIG. 12(*b*), an insulating layer or a layered film including an insulating layer and metal layer is preferably used as the intermediate layer R. Examples of the combination of an insulating layer and metal layer of the layered film are MgO+Au, MgO+Ag, and MgO+Cr.

(d) Tunnel Barrier Layer TB

In the first embodiment, when a nonmagnetic tunnel barrier material is used for the channel layer O, a high output can be obtained. Examples of the material of the tunnel barrier layer TB are an insulator formed from an oxide (e.g., alumina (Al$_2$O$_3$—X), magnesium oxide (MgO), SiO$_2$, Si—O—N, Ta—O, or Al—Zr—O), nitride, or fluoride containing at least one element selected from the group containing of aluminum (Al), titanium (Ti), tantalum (Ta), cobalt (Co), nickel (Ni), silicon (Si), magnesium (Mg), and iron (Fe), and a semiconductor such as GaAlAs with a large gap. Even when a nanocontact MR material obtained by forming pinholes in the insulator and inserting a magnetic layer into the pinholes or a CCP-CPP (Current-Perpendicular-to-Plane)-MR (Magneto-Resistance effect) material formed by inserting Cu into the pinholes is used, a large reproduction output can be obtained. From the viewpoint of reproduction of a signal, the tunnel barrier layer TB preferably has a thickness of, e.g., 0.2 to 2 nm. When the latter nanocontact MR or CCP-CPP-MR is used, the thickness of the tunnel barrier layer TB preferably falls within the range of 0.4 to 40 nm.

(e) Insulating Layer IN

A magnetic insulating layer or nonmagnetic insulating layer can be used as the insulating layer IN depending on the magnetic coupling between the magnetic electrode A and the magnetic layer C.

In the direct exchange coupling method shown in FIG. 8, a magnetic insulating layer is used. As the magnetic insulating layer, an oxide magnetic material represented by spinel ferrite such as MnFe$_2$O$_4$ or hexagonal ferrite, which contains one of Fe, Co, Ni, Mn, V, and Cr, or a nitride magnetic material or fluoride magnetic material containing one of Fe, Co, Ni, Mn, V, and Cr can be used.

In the interlayer exchange coupling method shown in FIG. 9, a single-crystal or polycrystalline nonmagnetic insulator formed from a nonmagnetic oxide (e.g., alumina (Al$_2$O$_3$—X), magnesium oxide (MgO), SiO$_2$, Si—O—N, Ti—O, Ta—O, or Al—Zr—O), nitride, or fluoride containing at least one element selected from the group containing of aluminum (Al), titanium (Ti), tantalum (Ta), cobalt (Co), nickel (Ni), silicon (Si), magnesium (Mg), and iron (Fe) is used. A crystalline semiconductor such as GaAlAs with a large gap can also be used.

In the magnetostatic coupling method shown in FIG. 10, a single-crystal or polycrystalline nonmagnetic insulator such as MgO or Ti—O, like the above-described single-crystal and polycrystalline materials, or an amorphous insulator formed from a nonmagnetic oxide (e.g., alumina (Al$_2$O$_3$—X), magnesium oxide (MgO), SiO$_2$, Si—O—N, Ta—O, or Al—Zr—O), nitride, or fluoride containing at least one element selected from the group containing of aluminum (Al), titanium (Ti), tantalum (Ta), cobalt (Co), nickel (Ni), silicon (Si), magnesium (Mg), and iron (Fe) can be used. A crystalline semiconductor such as GaAlAs with a large gap can also be used.

Magnetostatic coupling may be added to the interlayer exchange interaction that acts between the magnetic electrodes A and B and the magnetic layer C to increase the coupling force.

In the precession method shown in FIGS. 11A to 11C, the same insulator as in magnetostatic coupling can be used.

The insulator here is a material which forms a potential barrier to ensure electrical isolation between the magnetic electrode A and the magnetic layer C. When the insulating layer is as thin as 1 nm or less, or oxygen, nitrogen, or fluorine contained in the insulator deviates from the stoichiometric composition, the isolation becomes poor. In this case, a material that ensures isolation not to influence the operation is preferably used.

(f) Electrodes H, J, K, and L

The material of the electrodes H, J, K, and L can be either the same as that of the magnetic electrodes or magnetic layers connected to them or different. When the same material is used, the electrodes can easily be formed. If a different material is used, the electrodes are preferably made of a metal material with a low resistance. Examples are copper (Cu), gold (Au), silver (Ag), aluminum (Al), and an alloy containing at least one of them.

As described above, according to the first embodiment, magnetic switching and signal processing can be done simultaneously without any interference. Hence, a magnetic element capable of implementing driving at low power consumption while reducing the size can be provided.

[6] Second Embodiment

In the second embodiment, an example of a spin diffusion magnetic element of type 1 will be described. In the second embodiment, voltage generation by the spin diffusion effect is used as a means for obtaining the output signal between magnetic electrodes A and B.

[6-1] Structure

FIGS. 16A to 16D are schematic views showing a magnetic element according to the second embodiment of the present invention. The structure of the magnetic element according to the second embodiment of the present invention will be described below.

Figure 16A:
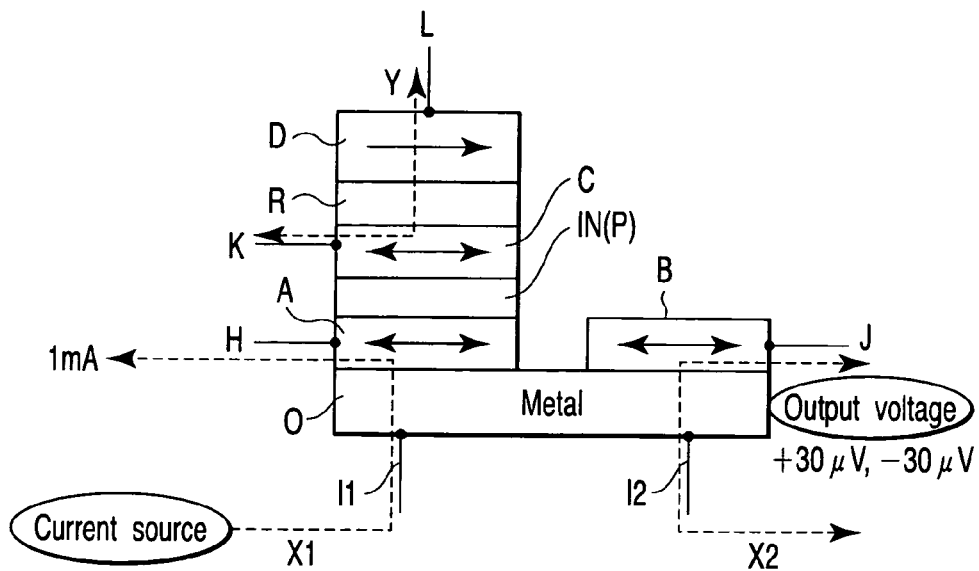
FIGS. 16A, 16B, 16C, and 16D are schematic views of a magnetic element according to the second embodiment of the present invention.

As shown in FIG. 16A, the magnetic element of the second embodiment is largely different from that of the first embodiment in that a metal layer is used as a channel layer O, and electrodes I1 and I2 are connected to the channel layer O.

More specifically, the magnetic electrodes A and B are provided in contact with the channel layer O made of a metal. The magnetic electrodes A and B are arranged adjacent on the same surface of the channel layer O without contacting each other. A magnetic layer C is provided on the side of the magnetic electrode A. A nonmagnetic or magnetic insulating layer IN (intermediate layer P) is provided between the magnetic layer C and the magnetic electrode A. A magnetic layer D is provided on a side of the magnetic layer C opposite to the magnetic electrode A. An intermediate layer R made of a metal or insulator is provided between the magnetic layers C and D. Electrodes H, J, K, and L are connected to the magnetic electrodes A and B and the magnetic layers C and D, respectively. The electrodes I1 and I2 are connected to the channel layer O.

A current (signal X1) is supplied between the magnetic electrode A and the channel layer O by using the electrodes H and I1. An output voltage (signal X2) generated between the magnetic electrode B and the channel layer O is extracted from the element by using the electrodes J and I2. A signal Y to control the magnetization direction of the magnetic layer C is supplied by using the electrodes K and L.

The magnetic element according to the second embodiment is not limited to the structure shown in FIG. 16A and may variously be changed to, e.g., the structures shown in FIGS. 16B to 16D to be described below. The structures shown in FIGS. 16A to 16D may be combined.

Figure 16B:
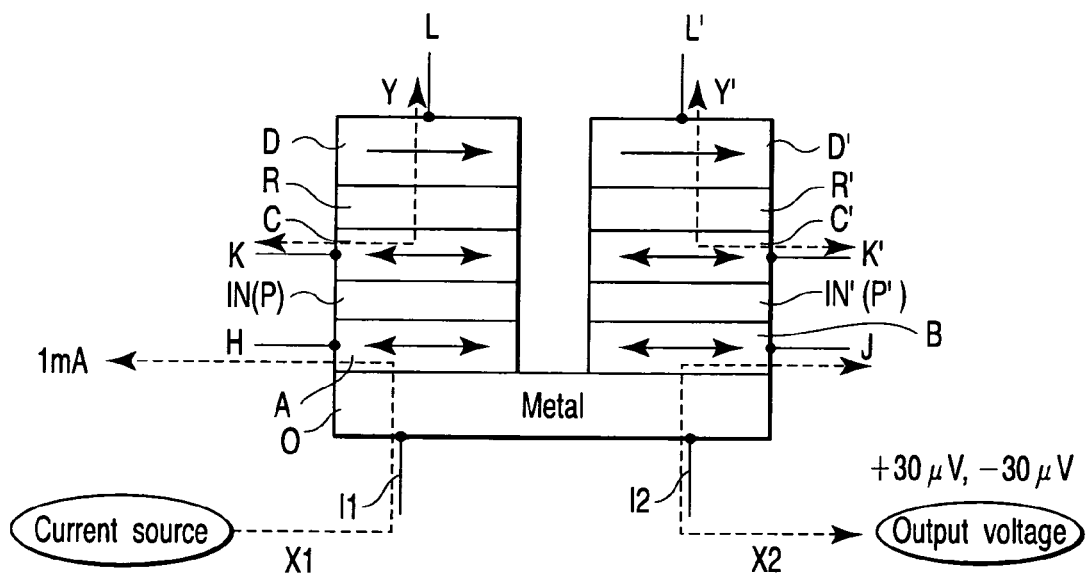

As shown in FIG. 16B, the magnetization of the magnetic electrode B may be reversible. In this case, a magnetic layer C' is provided above the magnetic electrode B. An insulating layer IN' (intermediate layer P') is provided between the magnetic layer C' and the magnetic electrode B. A magnetic layer D' is provided on a side of the magnetic layer C' opposite to the magnetic electrode B. An intermediate layer R' is provided between the magnetic layers C' and D'. Electrodes K' and L' are connected to the magnetic layers C' and D', respectively. The electrodes K' and L' are used to supply a signal Y' to control the magnetization direction of the magnetic layer C'.

Figure 16C:
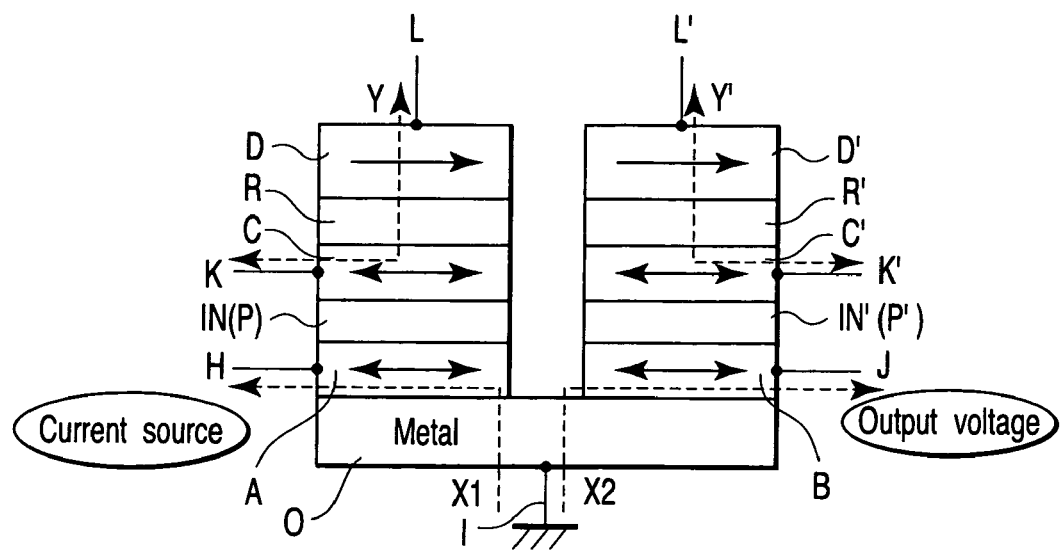

As shown in FIG. 16C, a single electrode I may be connected to the channel layer O. In this case, the electrode I is commonly used to supply the signal X1 between the electrodes H and I and supply the signal X2 between the electrodes J and I.

Figure 16D:
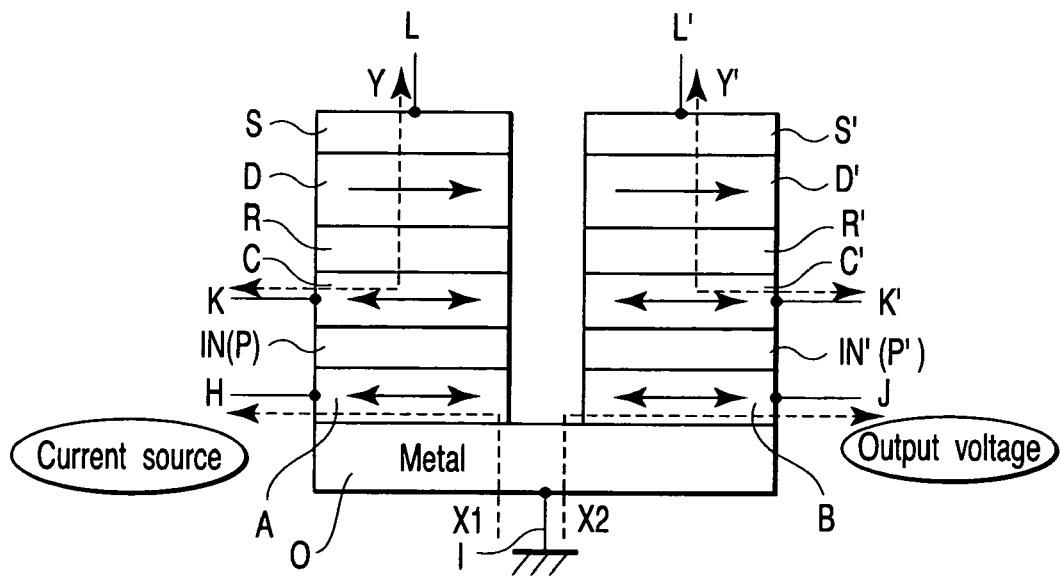

As shown in FIG. 16D, antiferromagnetic layers S and S' may be provided in contact with the magnetic layers D and D', respectively, to fix their magnetizations. The electrode L can be provided on either the magnetic layer D or antiferromagnetic layer S. The electrode L' can be provided on either the magnetic layer D' or antiferromagnetic layer S'. When the antiferromagnetic layers S and S' are provided, a unidirectional magnetic anisotropy is given so that the magnetization is fixed. The magnetization can also be fixed by using a material with a large magnetocrystalline anisotropy without forming the antiferromagnetic layers S and S'.

[6-2] Operation

The operation of the magnetic element according to the second embodiment of the present invention will be described below. The operation of the structure shown in FIG. 16A will be described here.

First, the signal Y is input between the electrodes K and L to control the magnetization of the magnetic layer C. As the method of controlling the magnetization of the magnetic layer C, the above-described spin-injection magnetization reversal method (FIG. 13) or voltage-controlled magnetic method (FIG. 14) can be used. More specifically, the magnetization direction of the magnetic layer C relative to the magnetic layer D is controlled by different mechanisms to be described below.

In the spin-injection magnetization reversal method, a conductive material and, preferably, a metal with a low resistance is used for the intermediate layer R. The magnetization direction of the magnetic layer C is controlled by the direction of the current to be supplied between the magnetic layers C and D. More specifically, when spin-polarized electrons are injected from the magnetic layer D to the magnetic layer C, the magnetization direction of the magnetic layer C is parallel to that of the magnetic layer D. When spin-polarized electrons are injected from the magnetic layer C to the magnetic layer D, the magnetization direction of the magnetic layer C is antiparallel to that of the magnetic layer D.

In the voltage-controlled magnetic method, a layered film including an insulating layer and metal layer is used as the intermediate layer R. A phenomenon that the magnetic coupling between the magnetic layers D and C is changed by the voltage applied between the electrodes L and K is used.

Second, the magnetic information of the magnetic layer C whose magnetization direction is controlled by the signal Y, as described above, is transferred to the magnetic electrode A by the magnetic coupling between the magnetic electrode A and the magnetic layer C through the insulating layer IN (by the magnetic coupling methods shown in FIGS. 8 to 11C). Since the insulating layer IN is provided between the magnetic layer C and the magnetic electrode A, only the magnetic information can be transmitted without any electrical signal interference.

Third, a driving current (signal X1) is supplied between the electrodes H and I1 to generate a spin diffusion effect. The voltage (signal X2) between the electrodes J and I2, which changes depending on the magnetic arrangement of the magnetic electrodes A and B, is output. More specifically, spin-polarized electrons generated by supplying a driving current of, e.g., 1 mA are accumulated in the metal channel layer O. The accumulated spin-polarized electrons contribute to magnetization of the magnetic electrode B. The chemical potential between the magnetic electrode B and the metal channel layer O changes. Depending on whether the magnetic arrangement of the magnetic electrodes A and B is parallel or antiparallel, the output voltage between the magnetic electrode B and the metal channel layer O changes to bipolar values of, e.g., +30 μV and −30 μV or different values of, e.g., +12 μV and +3 μV.

[6-3] Elements

The constituent elements (mainly materials) of the element will be described next in detail. The layers of the element whose description is omitted below are the same as in the above-described first embodiment.

(a) Channel Layer O

A metal layer having a high conductivity is preferably used as the channel layer O according to the second embodiment. More specifically, examples are copper (Cu), gold (Au), silver (Ag), aluminum (Al), and an alloy containing at least one of them. The distance between the magnetic electrodes A and B in contact with the channel layer O is preferably shorter than the length of spin diffusion in the metal.

(b) Electrodes I1 and I2

The material of the electrodes I1 and I2 can be either the same as that of the channel layer O connected to them or different. When the same material is used, the electrodes can easily be formed. If a different material is used, the electrodes are preferably made of a metal material with a low resistance. Examples are copper (Cu), gold (Au), silver (Ag), aluminum (Al), and an alloy containing at least one of them.

As described above, according to the second embodiment of the present invention, the same effect as in the first embodiment can be obtained.

[7] Third Embodiment

In the third embodiment, an example of a spin diffusion magnetic element of type 1 will be described, as in the second embodiment. In the third embodiment, a compound layer is provided.

[7-1] Structure

FIGS. 17A to 17D are schematic views showing a magnetic element according to the third embodiment of the present invention. The structure of the magnetic element according to the third embodiment of the present invention will be described below.

Figure 17A:
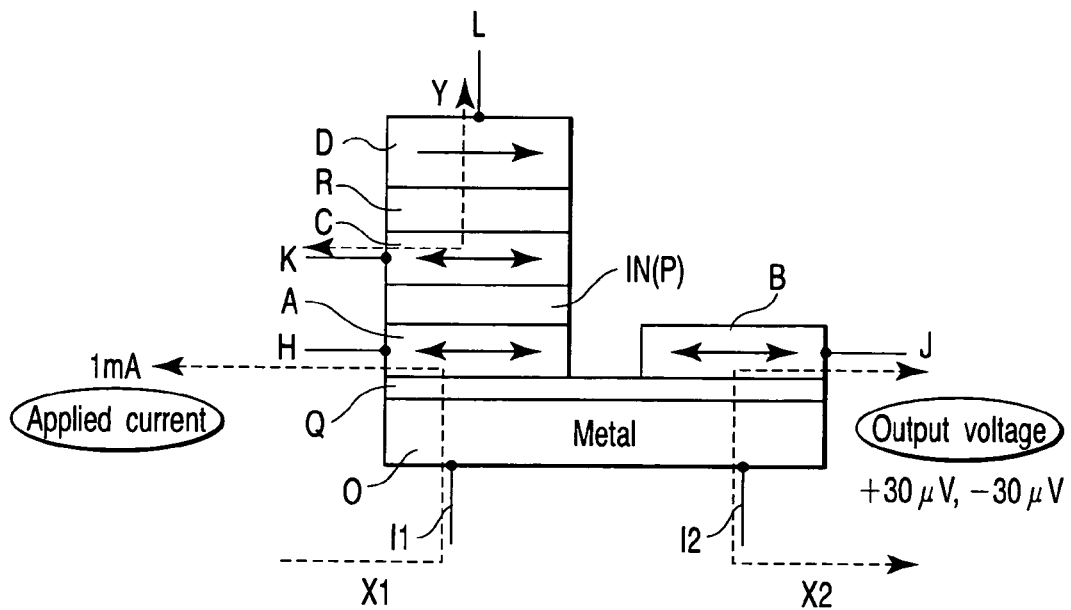
FIGS. 17A, 17B, 17C, and 17D are schematic views of a magnetic element according to the third embodiment of the present invention.

As shown in FIG. 17A, the magnetic element of the third embodiment is largely different from that of the second embodiment in that a compound layer Q is provided between a channel layer O and magnetic electrodes A and B.

More specifically, the compound layer Q containing at least one of oxygen, nitrogen, and fluorine is provided in contact with the channel layer O made of a metal. The magnetic electrodes A and B are provided in contact with the compound layer Q. The magnetic electrodes A and B are arranged adjacent on the same surface of the compound layer Q without contacting each other. A magnetic layer C is provided on the side of the magnetic electrode A. A nonmagnetic or magnetic insulating layer IN (intermediate layer P) is provided between the magnetic layer C and the magnetic electrode A. A magnetic layer D is provided on a side of the magnetic layer C opposite to the magnetic electrode A. An intermediate layer R made of a metal or insulator is provided between the magnetic layers C and D. Electrodes H, J, K, and L are connected to the magnetic electrodes A and B and the magnetic layers C and D, respectively. Electrodes I1 and I2 are connected to the channel layer O.

A current (signal X1) is supplied between the magnetic electrode A and the channel layer O by using the electrodes H and I1. An output voltage (signal X2) generated between the magnetic electrode B and the channel layer O is extracted from the element by using the electrodes J and I2. A signal Y to control the magnetization direction of the magnetic layer C is supplied by using the electrodes K and L.

The magnetic element according to the third embodiment is not limited to the structure shown in FIG. 17A and may be variously changed to, e.g., the structures shown in FIGS. 17B to 17D to be described below. The structures shown in FIGS. 17A to 17D may be combined.

Figure 17B:
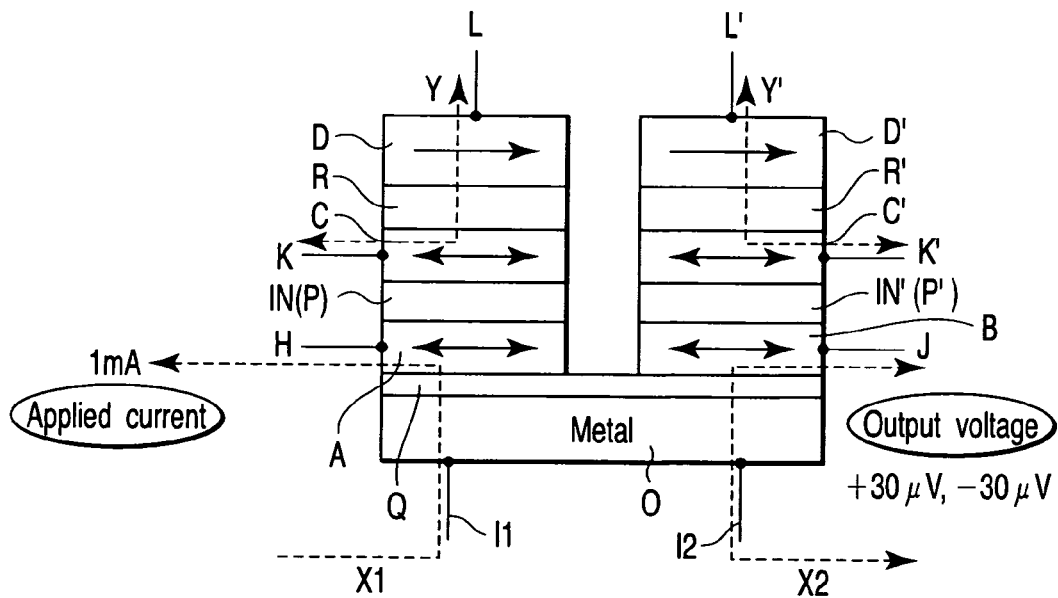

As shown in FIG. 17B, the magnetization of the magnetic electrode B may be reversible. In this case, a magnetic layer C' is provided above the magnetic electrode B. An insulating layer IN' (intermediate layer P') is provided between the magnetic layer C' and the magnetic electrode B. A magnetic layer D' is provided on a side of the magnetic layer C' opposite to the magnetic electrode B. An intermediate layer R' is provided between the magnetic layers C' and D'. Electrodes K' and L' are connected to the magnetic layers C' and D', respectively. The electrodes K' and L' are used to supply a signal Y' to control the magnetization direction of the magnetic layer C'.

Figure 17C:
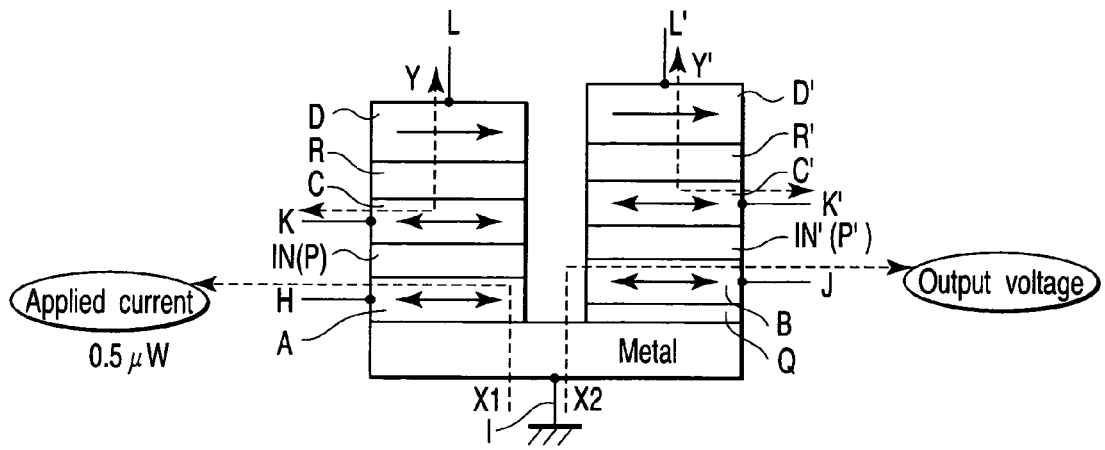

As shown in FIG. 17C, a single electrode I may be connected to the channel layer O. In this case, the electrode I is commonly used to supply the signal X1 between the electrodes H and I and supply the signal X2 between the electrodes J and I. The compound layer Q may be provided only between the magnetic electrode B and the channel layer O. When the compound layer Q is inserted only on the output side, the output voltage can be made high without increasing power consumption.

Figure 17D:
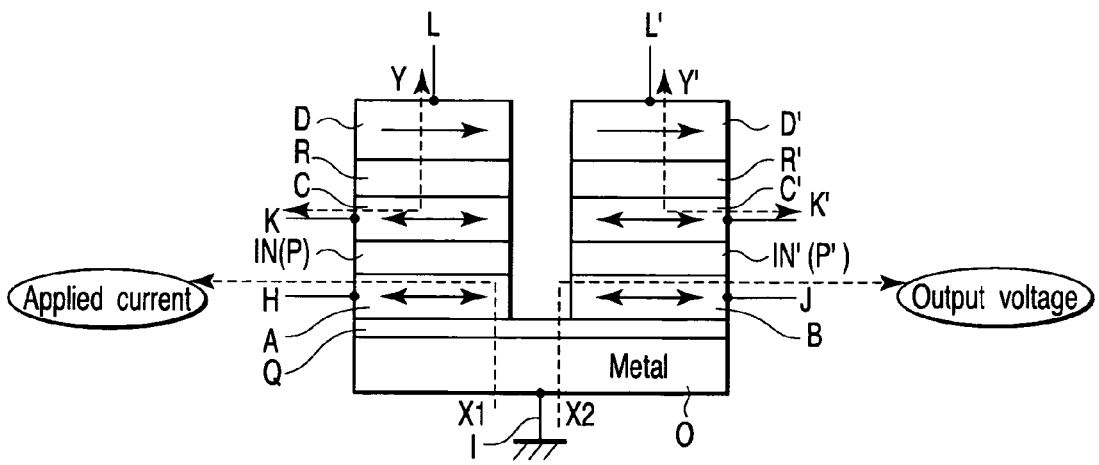

As shown in FIG. 17D, antiferromagnetic layers S and S' may be provided in contact with the magnetic layers D and D', respectively, to fix their magnetizations. The electrode L can be provided on either the magnetic layer D or antiferromagnetic layer S. The electrode L' can be provided on either the magnetic layer D' or antiferromagnetic layer S'. When the antiferromagnetic layers S and S' are provided, a unidirectional magnetic anisotropy is given so that the magnetization is fixed. The magnetization can also be fixed by using a material with a large magnetocrystalline anisotropy without forming the antiferromagnetic layers S and S'.

[7-2] Operation

The operation of the magnetic element according to the third embodiment of the present invention is the same as in the second embodiment, and a description thereof will be omitted.

[7-3] Elements

The constituent elements (mainly materials) of the element will be described next in detail. The layers of the element whose description is omitted below are the same as in the above-described first and second embodiments.

(a) Compound Layer Q

For the compound layer Q, a material containing an oxide (e.g., alumina ($Al_2O_3$—X), magnesium oxide (MgO), $SiO_2$, Si—O—N, Ta—O, or Al—Zr—O), nitride, or fluoride containing at least one element selected from the group containing of aluminum (Al), titanium (Ti), tantalum (Ta), cobalt (Co), nickel (Ni), silicon (Si), magnesium (Mg), and iron (Fe) can be used.

As described above, according to the third embodiment of the present invention, the same effect as in the second embodiment can be obtained. In addition, when the compound layer Q is provided, the output voltage can be made high.

[8] Fourth Embodiment

In the fourth embodiment, an example of a gate driving magnetic element of type 1 will be described.

[8-1] Structure

FIGS. 18A to 18D are schematic views showing a magnetic element according to the fourth embodiment of the present invention. The structure of the magnetic element according to the fourth embodiment of the present invention will be described below.

Figure 18A:
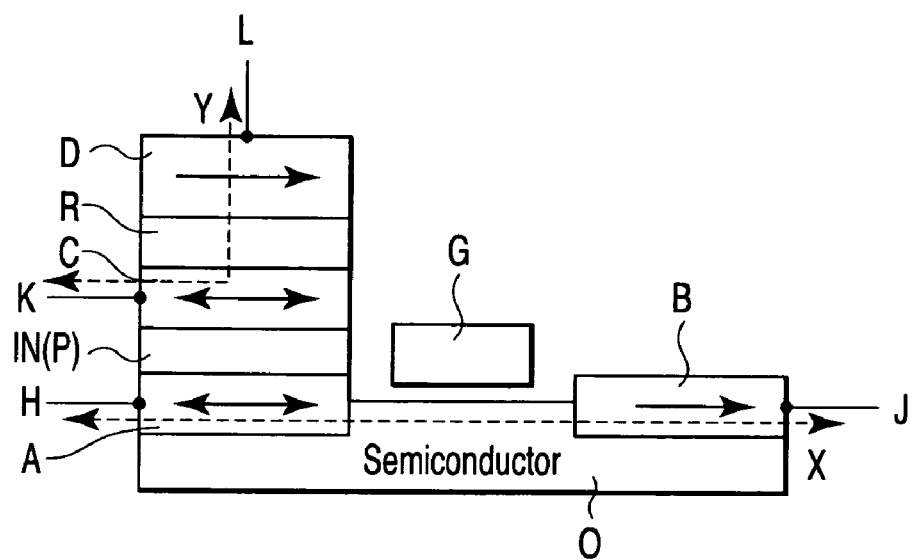
FIGS. 18A, 18B, 18C, and 18D are schematic views of a magnetic element according to the fourth embodiment of the present invention.

As shown in FIG. 18A, the magnetic element of the fourth embodiment is largely different from that of the first embodiment in that a semiconductor layer is used as a channel layer O, and a gate electrode G is provided above the channel layer O.

More specifically, the gate electrode G is provided above the channel layer O made of a semiconductor while being insulated from the channel layer O. Magnetic electrodes A and B serving as a source and drain, respectively, are provided on both sides of the gate electrode G. The magnetic electrodes A and B are arranged in contact with the channel layer O and adjacent on the same surface of the channel layer O without contacting each other. A magnetic layer C is provided on the side of the magnetic electrode A. A nonmagnetic or magnetic insulating layer IN (intermediate layer P) is provided between the magnetic layer C and the magnetic electrode A. A magnetic layer D is provided on a side of the magnetic layer C opposite to the magnetic electrode A. An intermediate layer R made of a metal or insulator is provided between the magnetic layers C and D. Electrodes H, J, K, and L are connected to the magnetic electrodes A and B and the magnetic layers C and D, respectively.

A voltage is applied to the gate electrode G to open the channel, and a signal X which changes depending on the magnetic arrangement of the magnetic electrodes A and B is output by using the electrodes H and J. A signal Y to control the magnetization direction of the magnetic layer C is supplied by using the electrodes K and L.

The magnetic element according to the fourth embodiment is not limited to the structure shown in FIG. 18A and may be variously changed to, e.g., the structures shown in FIGS. 18B to 18D to be described below. The structures shown in FIGS. 18A to 18D may be combined.

Figure 18B:
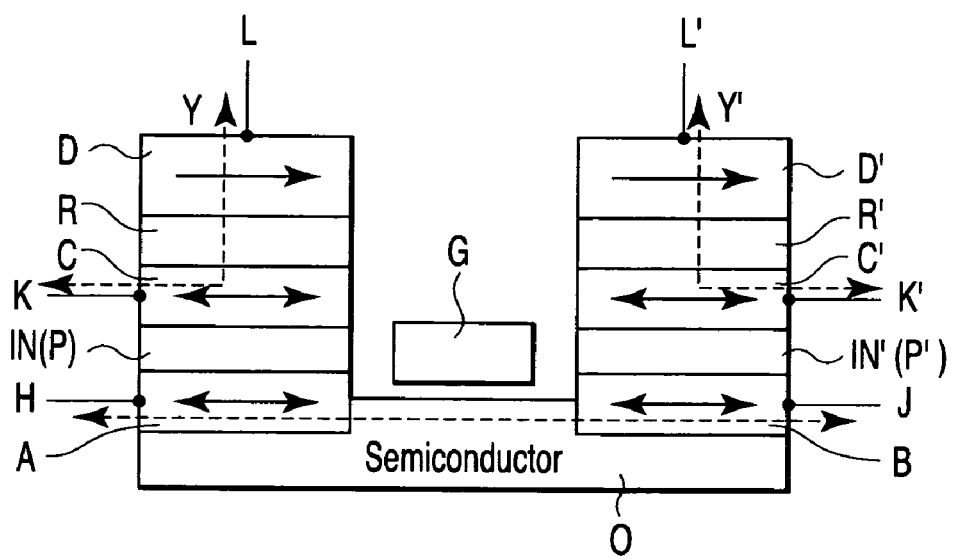

As shown in FIG. 18B, the magnetization of the magnetic electrode B may be reversible. In this case, a magnetic layer C' is provided above the magnetic electrode B. An insulating layer IN' (intermediate layer P') is provided between the magnetic layer C' and the magnetic electrode B. A magnetic layer D' is provided on a side of the magnetic layer C' opposite to the magnetic electrode B. An intermediate layer R' is provided between the magnetic layers C' and D'. Electrodes K' and L' are connected to the magnetic layers C' and D', respectively. The electrodes K' and L' are used to supply a signal Y' to control the magnetization direction of the magnetic layer C'.

Figure 18C:
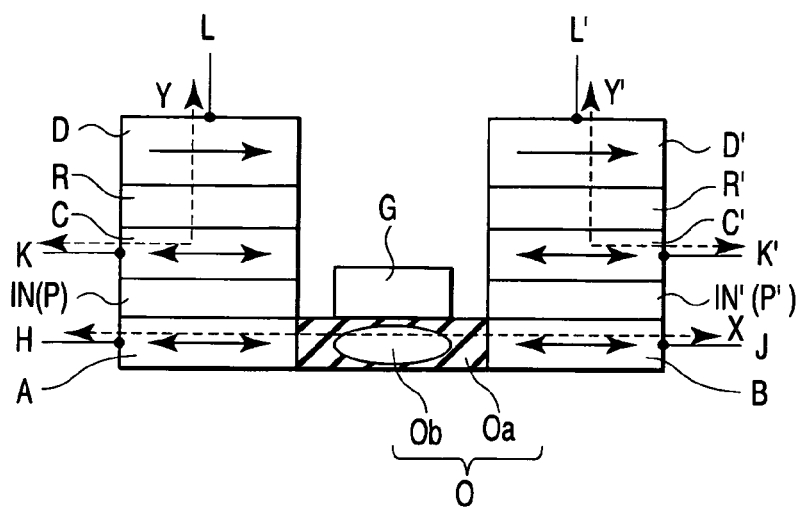

As shown in FIG. 18C, the channel layer O may have a conductive island portion Ob in an insulator Oa. The conductive island portion Ob is made of a semiconductor or metal. This element is a single-electron transistor.

Figure 18D:
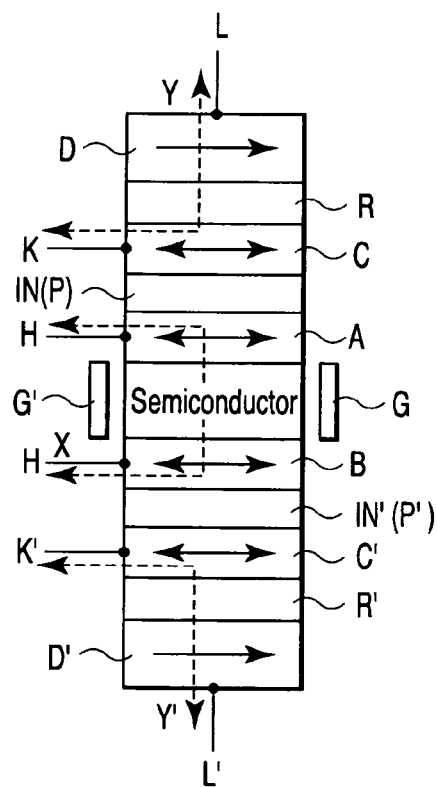

As shown in FIG. 18D, the magnetization of the magnetic electrode B may be reversible, and the layers may be stacked in one direction (Y direction). In this case, the magnetic layer C' is provided under the magnetic electrode B. The insulating layer IN' (intermediate layer P') is provided between the magnetic layer C' and the magnetic electrode B. The magnetic layer D' is provided on a side of the magnetic layer C' opposite to the magnetic electrode B. The intermediate layer R' is provided between the magnetic layers C' and D'. The electrodes K' and L' are connected to the magnetic layers C' and D', respectively. The electrodes K' and L' are used to supply the signal Y' to control the magnetization direction of the magnetic layer C'. Two gate electrodes G and G' may be provided above the channel layer O.

[8-2] Operation

The operation of the magnetic element according to the fourth embodiment of the present invention will be described below. The operation of the structure shown in FIG. 18A will be described here. In this embodiment, two input systems, i.e., input to the gate electrode G and input between the electrodes L and K can be used.

First, the signal Y is input between the electrodes K and L to control the magnetization of the magnetic layer C. As the method of controlling the magnetization of the magnetic layer C, the above-described spin-injection magnetization reversal method (FIG. 13) or voltage-controlled magnetic method (FIG. 14) can be used. More specifically, the magnetization direction of the magnetic layer C relative to the magnetic layer D is controlled by different mechanisms to be described below.

In the spin-injection magnetization reversal method, a conductive material and, preferably, a metal with a low resistance is used for the intermediate layer R. The magnetization direction of the magnetic layer C is controlled by the direction of the current to be supplied between the magnetic layers C and D. More specifically, when spin-polarized electrons are injected from the magnetic layer D to the magnetic layer C, the magnetization direction of the magnetic layer C is parallel to that of the magnetic layer D. When spin-polarized electrons are injected from the magnetic layer C to the magnetic layer D, the magnetization direction of the magnetic layer C is antiparallel to that of the magnetic layer D.

In the voltage-controlled magnetic method, a layered film including an insulating layer and metal layer is used as the intermediate layer R. A phenomenon that the magnetic coupling between the magnetic layers D and C is changed by the voltage applied between the electrodes L and K is used.

Second, the magnetic information of the magnetic layer C whose magnetization direction is controlled by the signal Y, as described above, is transferred to the magnetic electrode A by the magnetic coupling between the magnetic electrode A and the magnetic layer C through the insulating layer IN (by the magnetic coupling methods shown in FIGS. 8 to 11C). Since the insulating layer IN is provided between the magnetic layer C and the magnetic electrode A, only the magnetic information can be transmitted without any electrical signal interference.

Third, in gate voltage driving, a predetermined voltage is applied to the gate electrode G to open the channel, as in a normal FET. The current (signal X) flowing between the magnetic electrodes A and B is output by using the electrodes H and J. The value of the current changes depending on the magnetic arrangement of the magnetic electrodes A and B.

[8-3] Elements

The constituent elements (mainly materials) of the element will be described next in detail. The layers of the element whose description is omitted below are the same as in the above-described first embodiment.

(a) Channel Layer O (Common to the Fourth and Eighth Embodiments)

A normal semiconductor such as silicon (Si) is used as the material of the channel layer O.

In, e.g., the structure shown in FIG. 18C, as the material of the channel layer O, the conductive island portion Ob surrounded by the insulator Oa is used.

(b) Gate Electrode G

A conductive material can be used for the gate electrode G. Polysilicon or a metal silicide such as nickel silicide can be used.

As described above, according to the fourth embodiment of the present invention, the same effect as in the first embodiment can be obtained.

[9] Fifth Embodiment

In the fifth embodiment, an example of a TMR magnetic element of type 2 will be described.

[9-1] Structure

FIGS. 19A to 19E are schematic views showing a magnetic element according to the fifth embodiment of the present invention. The structure of the magnetic element according to the fifth embodiment of the present invention will be described below.

Figure 19A:
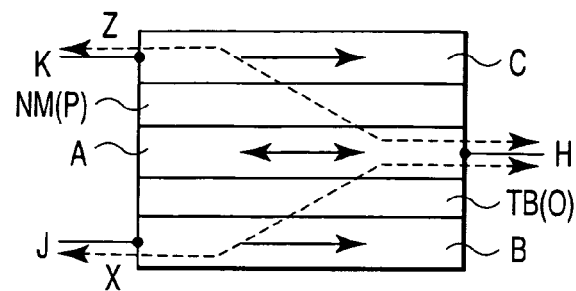
FIGS. 19A, 19B, 19C, 19D, and 19E are schematic views of a magnetic element according to the fifth embodiment of the present invention.

As shown in FIG. 19A, the magnetic element of the fifth embodiment is largely different from that of the first embodiment in that the magnetic layer D and intermediate layer R shown in FIG. 15A are omitted, the magnetization direction of a magnetic layer C is fixed, and an intermediate layer P is made of a nonmagnetic layer NM.

More specifically, magnetic electrodes A and B are provided while sandwiching a tunnel barrier layer TB serving as a channel layer O. The magnetic electrodes A and B are arranged on different surfaces of the tunnel barrier layer TB without contacting each other. The magnetic layer C is provided on the side of the magnetic electrode A. The nonmagnetic layer NM (intermediate layer P) is provided between the magnetic layer C and the magnetic electrode A. Electrodes H, J, and K are connected to the magnetic electrodes A and B and magnetic layer C, respectively.

A signal X which changes depending on the magnetic arrangement of the magnetic electrodes A and B is output by using the electrodes H and J. A signal Z to control the magnetization direction of the magnetic electrode A is supplied by using the electrodes H and K.

The magnetic element according to the fifth embodiment is not limited to the structure shown in FIG. 19A and may variously be changed to, e.g., the structures shown in FIGS. 19B to 19E to be described below. The structures shown in FIGS. 19A to 19E may be combined.

Figure 19B:
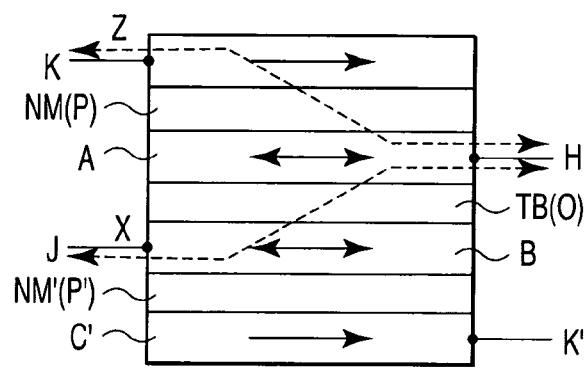

As shown in FIG. 19B, the magnetization of the magnetic electrode B may be reversible. In this case, a magnetic layer C' is provided on the side of the magnetic electrode B. A nonmagnetic layer NM' (intermediate layer P') is provided between the magnetic layer C' and the magnetic electrode B. An electrode K' is connected to the magnetic layer C'. The electrodes K' and J are used to supply a signal Z' to control the magnetization direction of the magnetic electrode B.

Figure 19C:
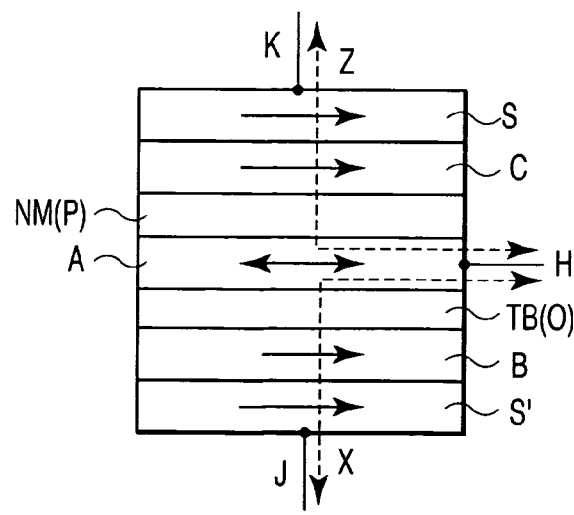

As shown in FIG. 19C, antiferromagnetic layers S and S' may be provided in contact with the magnetic electrode B and magnetic layer C, respectively, to fix their magnetizations. The electrode K can be provided on either the magnetic layer C or antiferromagnetic layer S. The electrode J can be provided on either the magnetic electrode B or antiferromagnetic layer S'. When the antiferromagnetic layers S and S' are provided, a unidirectional magnetic anisotropy is given so that the magnetization is fixed. The magnetization can also be fixed by using a material with a large magnetocrystalline anisotropy without forming the antiferromagnetic layers S and S'.

Figure 19D:
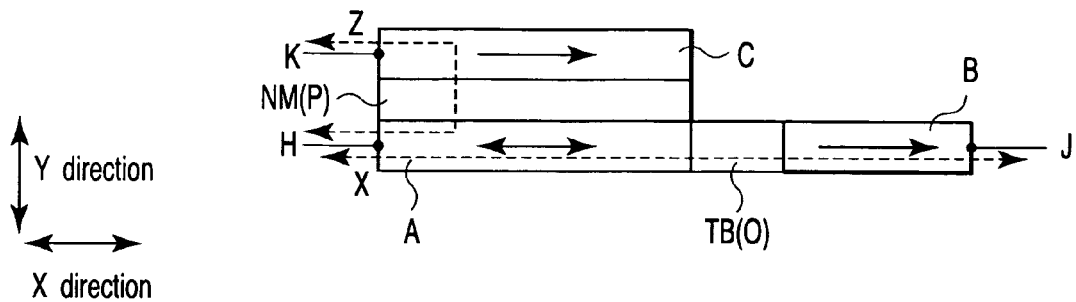

As shown in FIG. 19D, the magnetic electrode B and tunnel barrier layer TB may be stacked in the X direction at an angle with respect to the magnetic electrode A, nonmagnetic layer NM, and magnetic layer C which are stacked in the Y direction.

Figure 19E:
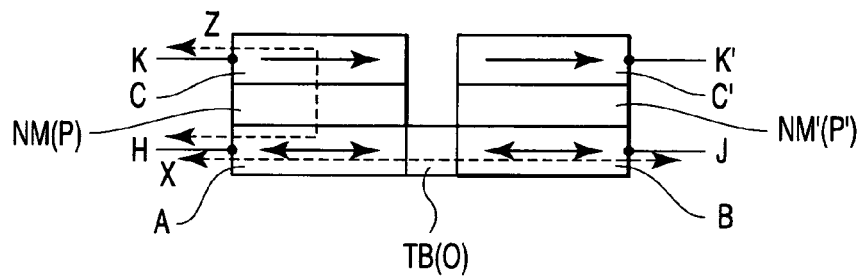

As shown in FIG. 19E, the magnetization of the magnetic electrode B may be reversible in the structure shown in FIG. 19D. In this case, the magnetic layer C' is provided above the magnetic electrode B. The nonmagnetic layer NM' (intermediate layer P') is provided between the magnetic layer C' and the magnetic electrode B. The electrode K' is connected to the magnetic layer C'. The electrodes K' and J are used to supply the signal Z' to control the magnetization direction of the magnetic electrode B.

[9-2] Operation

The operation of the magnetic element according to the fifth embodiment of the present invention will be described below. The operation of the structure shown in FIG. 19A will be described here.

First, a voltage (signal Z) is applied between the electrodes H and K. The magnetization direction of the magnetic electrode A is controlled by using a phenomenon wherein the magnetic coupling between the magnetic electrode A and the magnetic layer C is changed by the voltage.

Second, a voltage or current is applied between the electrodes H and J, and a tunnel current or voltage (signal X) which changes depending on the magnetic arrangement of the magnetic electrodes A and B is output.

[9-3] Elements

The constituent elements (mainly materials) of the magnetic element will be described next in detail. The layers of the element whose description is omitted below are the same as in the above-described first embodiment.

(a) Nonmagnetic Layer NM

The nonmagnetic layer NM is formed from a nonmagnetic insulating layer or a layered film including a nonmagnetic insulating layer and nonmagnetic metal layer.

Examples of the material of the nonmagnetic insulating layer are an insulator formed from an oxide (e.g., alumina ($Al_2O_3$—X), magnesium oxide (MgO), $SiO_2$, Si—O—N, Ta—O, or Al—Zr—O), nitride, or fluoride containing at least one element selected from the group containing of aluminum (Al), titanium (Ti), tantalum (Ta), cobalt (Co), nickel (Ni), silicon (Si), magnesium (Mg), and iron (Fe), and a semiconductor such as GaAlAs with a large gap.

Examples of the material of the nonmagnetic metal layer are copper (Cu), gold (Au), silver (Ag), aluminum (Al), chromium (Cr), vanadium (V), ruthenium (Ru), iridium (Ir), rhodium (Rh), rhenium (Re), osmium (Os), and an alloy containing at least one of them.

A combination of a nonmagnetic insulating layer and nonmagnetic metal layer can be obtained by, e.g., MgO+Au, MgO+Ag, or MgO+Cr. However, the present invention is not limited to these, and the above-described materials can be obtained.

As described above, according to the fifth embodiment of the present invention, the same effect as in the first embodiment can be obtained. In the fifth embodiment of type 2, the element has a simple structure and can easily be manufactured as compared to the first embodiment of type 1.

[10] Sixth Embodiment

In the sixth embodiment, an example of a spin diffusion magnetic element of type 2 will be described. In the sixth embodiment, voltage generation by the spin diffusion effect is used as a means for obtaining the output signal between magnetic electrodes A and B.

[10-1] Structure

Figure 20A:
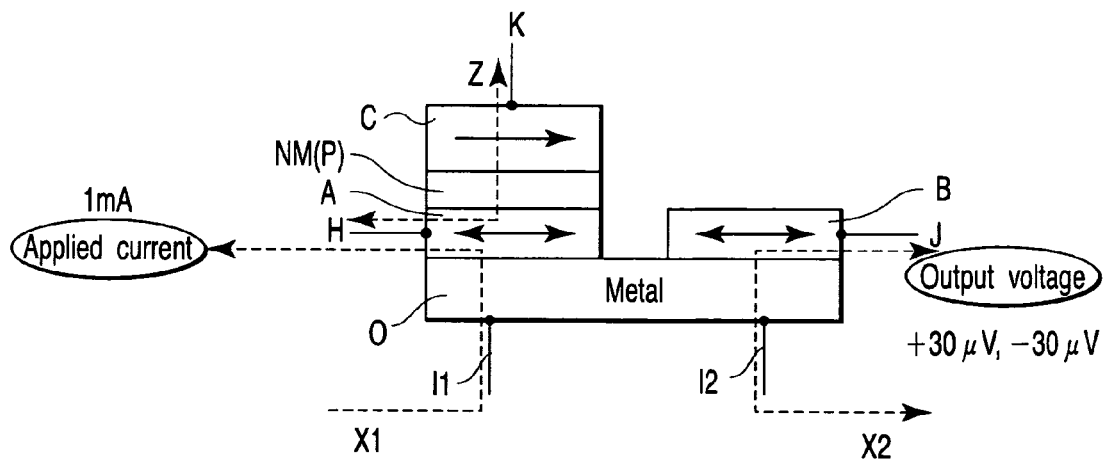
FIGS. 20A, 20B, 20C, and 20D are schematic views of a magnetic element according to the sixth embodiment of the present invention.
Figure 20B:
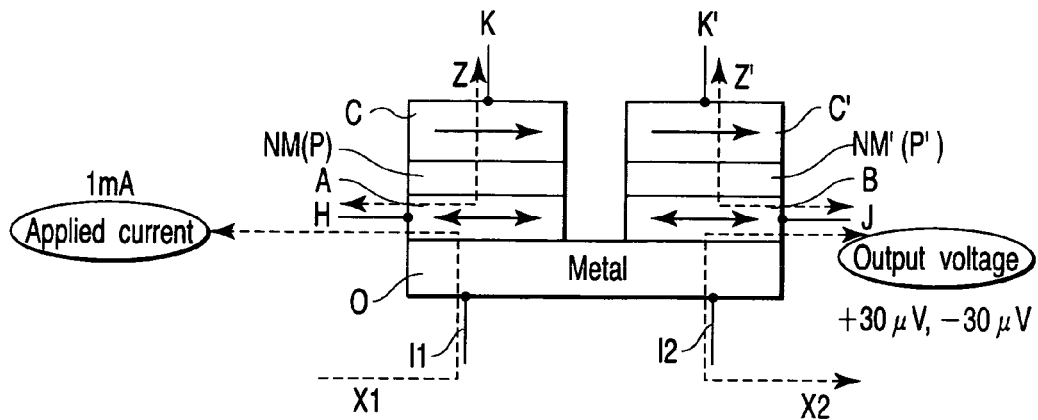
Figure 20C:
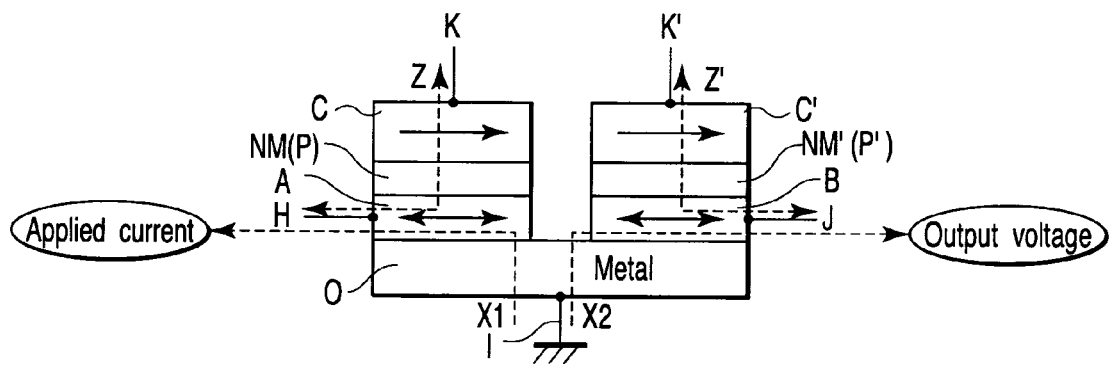

FIGS. 20A to 20C are schematic views showing a magnetic element according to the sixth embodiment of the present invention. The structure of the magnetic element according to the sixth embodiment of the present invention will be described below.

As shown in FIG. 20A, the magnetic element of the sixth embodiment is largely different from that of the fifth embodiment in that a metal layer is used as a channel layer O, and electrodes I1 and I2 are connected to the channel layer O.

More specifically, the magnetic electrodes A and B are provided in contact with the channel layer O made of a metal. The magnetic electrodes A and B are arranged adjacent on the same surface of the channel layer O without contacting each other. A magnetic layer C is provided on the side of the magnetic electrode A. A nonmagnetic layer NM (intermediate layer P) is provided between the magnetic layer C and the magnetic electrode A. Electrodes H, J, and K are connected to the magnetic electrodes A and B and the magnetic layer C, respectively. The electrodes I1 and I2 are connected to the channel layer O.

A current (signal X1) is supplied between the magnetic electrode A and the channel layer O by using the electrodes H and I1. An output voltage (signal X2) generated between the magnetic electrode B and the channel layer O is extracted from the element by using the electrodes J and I2. A signal Z to control the magnetization direction of the magnetic electrode A is supplied by using the electrodes K and H.

The magnetic element according to the sixth embodiment is not limited to the structure shown in FIG. 20A and may be variously changed to, e.g., the structures shown in FIGS. 20B to 20C to be described below. The structures shown in FIGS. 20A to 20C may be combined.

As shown in FIG. 20B, the magnetization of the magnetic electrode B may be reversible. In this case, a magnetic layer C' is provided above the magnetic electrode B. A nonmagnetic layer NM' (intermediate layer P') is provided between the magnetic layer C' and the magnetic electrode B. An electrode K' is connected to the magnetic layer C'. The electrodes K' and J are used to supply a signal Z' to control the magnetization direction of the magnetic electrode B.

As shown in FIG. 20C, a single electrode I may be connected to the channel layer O. In this case, the electrode I is commonly used to supply the signal X1 between the electrodes H and I and supply the signal X2 between the electrodes J and I.

[10-2] Operation

The operation of the magnetic element according to the sixth embodiment of the present invention will be described below. The operation of the structure shown in FIG. 20A will be described here.

First, a driving current (signal X1) is supplied between the electrodes H and I1 to generate a spin diffusion effect. The voltage (signal X2) between the electrodes J and I2, which changes depending on the magnetic arrangement of the magnetic electrodes A and B, is output. More specifically, spin-polarized electrons generated by supplying a driving current of, e.g., 1 mA are accumulated in the metal channel layer 0. The accumulated spin-polarized electrons contribute to magnetization of the magnetic electrode B. The chemical potential between the magnetic electrode B and the metal channel layer O changes. Depending on whether the magnetic arrangement of the magnetic electrodes A and B is parallel or antiparallel, the output voltage between the magnetic electrode B and the metal channel layer O changes to bipolar values of, e.g., +30 µV and −30 µV or −12 µV or −26 µV.

Second, a voltage (signal Z) is applied between the electrodes H and K. The magnetization direction of the magnetic electrode A is controlled by using a phenomenon that the magnetic coupling between the magnetic electrode A and the magnetic layer C is changed by the voltage.

[10-3] Elements

The constituent elements (mainly materials) of the magnetic element according to the sixth embodiment are the same as in the above-described first and second embodiments, and a description thereof will be omitted.

[10-4] Manufacturing Method

Figure 20D:
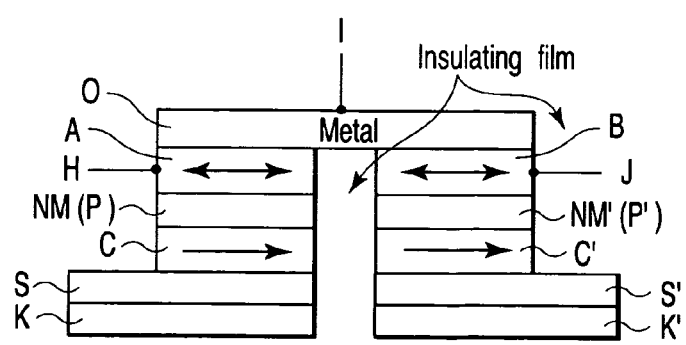

An example of a method of manufacturing the magnetic element according to the sixth embodiment will be described next with reference to FIG. 20D.

First, a metal layer serving as the electrodes K and K', a PtMn layer serving as the antiferromagnetic layers S and S', an FeCo layer (4 nm) serving as the magnetic layers C and C', a Cr (0.4 nm)/MgO (0.8 nm) layer serving as the nonmagnetic layer (insulating layer+metal layer) NM, a CoFeNoB amorphous alloy layer (2 nm) serving as the magnetic electrodes A and B, and the metal channel layer O are sequentially deposited on a substrate (not shown) by using an ultra-high vacuum sputtering apparatus. The layered film is extracted from the ultra-high vacuum sputtering apparatus.

Magnetic annealing is executed at 270° C. for 5 hrs to introduce unidirectional magnetic anisotropy to the FeCo layer. When an EB resist is applied, and EB exposure is executed, a mask conforming to the lower electrode shape is formed. Then, the film is processed by ion etching.

Next, an $SiO_2$ film is buried, and the surface is planarized. The structure from the metal channel layer O to the magnetic layers C and C' is processed by using EB lithography again and ion milling. With this process, the size of the magnetic electrodes A and B is set to 30 nm×30 nm. The distance between the magnetic electrodes A and B is set to 30 nm. The $SiO_2$ film is buried again, and surface planarization and surface exposure are executed.

The wafer is introduced in the ultra-high vacuum sputtering apparatus again. After a metal channel material is deposited thin on the surface, the channel layer O is processed into a predetermined shape. Finally, the electrodes H and J, magnetic electrodes A and B, and electrode I are formed.

As described above, according to the sixth embodiment of the present invention, the same effect as in the fifth embodiment can be obtained.

[11] Seventh Embodiment

In the seventh embodiment, an example of a spin diffusion magnetic element of type 2 will be described, as in the sixth embodiment. In the seventh embodiment, a compound layer is provided.

[11-1] Structure

FIGS. 21A to 21E are schematic views showing a magnetic element according to the seventh embodiment of the present invention. The structure of the magnetic element according to the seventh embodiment of the present invention will be described below.

Figure 21A:
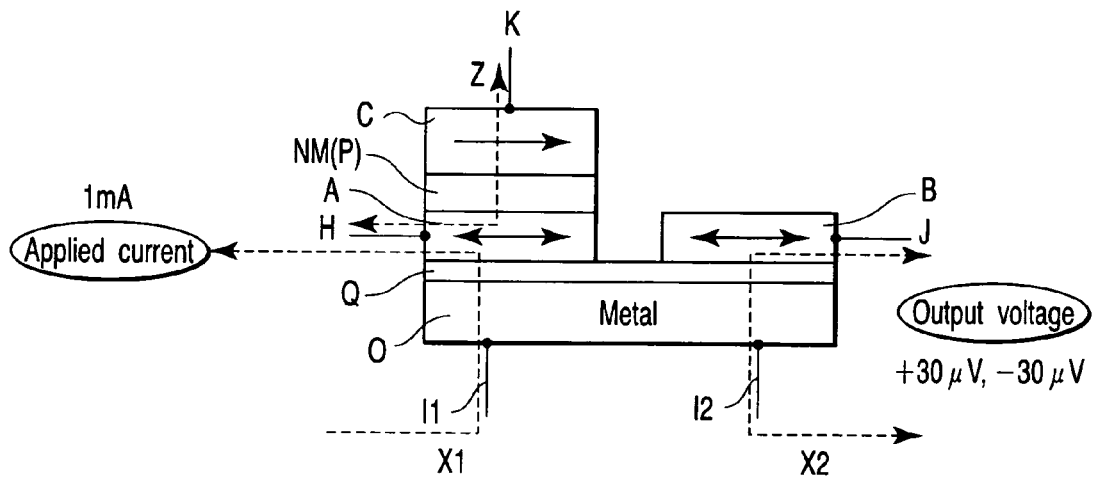

As shown in FIG. 21A, the magnetic element of the seventh embodiment is largely different from that of the sixth embodiment in that a compound layer Q is provided between a channel layer O and magnetic electrodes A and B.

More specifically, the compound layer Q is provided in contact with the channel layer O made of a metal. The magnetic electrodes A and B are provided in contact with the compound layer Q. The magnetic electrodes A and B are arranged adjacent on the same surface of the compound layer Q without contacting each other. A magnetic layer C is provided on the side of the magnetic electrode A. A nonmagnetic layer NM (intermediate layer P) is provided between the magnetic layer C and the magnetic electrode A. Electrodes H, J, and K are connected to the magnetic electrodes A and B and the magnetic layer C. Electrodes I1 and I2 are connected to the channel layer O.

A current (signal X1) is supplied between the magnetic electrode A and the channel layer O by using the electrodes H and I1. An output voltage (signal X2) generated between the magnetic electrode B and the channel layer O is extracted from the element by using the electrodes J and I2. A signal Z to control the magnetization direction of the magnetic electrode A is supplied by using the electrodes K and H.

The magnetic element according to the seventh embodiment is not limited to the structure shown in FIG. 21A and may be variously changed to, e.g., the structures shown in FIGS. 21B to 21E to be described below. The structures shown in FIGS. 21A to 21E may be combined.

Figure 21B:
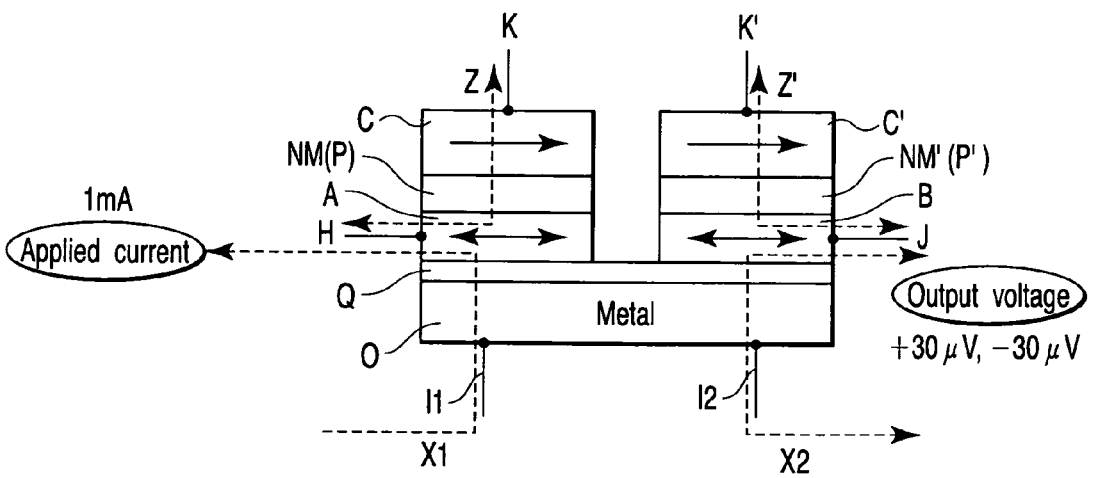

As shown in FIG. 21B, the magnetization of the magnetic electrode B may be reversible. In this case, a magnetic layer C' is provided above the magnetic electrode B. A nonmagnetic layer NM' (intermediate layer P') is provided between the magnetic layer C' and the magnetic electrode B. An electrode K' is connected to the magnetic layer C'. The electrodes K' and J are used to supply a signal Z' to control the magnetization direction of the magnetic electrode B.

As shown in FIG. 21C, a single electrode I may be connected to the channel layer O. In this case, the electrode I is commonly used to supply the signal X1 between the electrodes H and I and supply the signal X2 between the electrodes J and I. The compound layer Q may be provided only between the magnetic electrode B and the channel layer O. When the compound layer Q is inserted only on the output side, the output voltage can be made high without increasing power consumption.

As shown in FIG. 21D, antiferromagnetic layers S and S' may be provided in contact with the magnetic layers C and C', respectively, to fix their magnetizations. The electrode K can be provided on either the magnetic layer C or antiferromagnetic layer S. The electrode K' can be provided on either the magnetic layer C' or antiferromagnetic layer S'. When the antiferromagnetic layers S and S' are provided, a unidirectional magnetic anisotropy is given so that the magnetization is fixed. The magnetization can also be fixed by using a material with a large magnetocrystalline anisotropy without forming the antiferromagnetic layers S and S'.

As shown in FIG. 21E, the magnetization of the magnetic electrode B may be reversible, and the layers may be stacked in one direction (Y direction). In this case, the magnetic layer C' is provided under the magnetic electrode B. The nonmagnetic layer NM' (intermediate layer P') is provided between the magnetic layer C' and the magnetic electrode B. The electrode K' is connected to the magnetic layer C'. The electrodes K' and J are used to supply the signal Z' to control the magnetization direction of the magnetic electrode B.

[11-2] Operation

The operation of the magnetic element according to the seventh embodiment of the present invention is the same as in the sixth embodiment, and a description thereof will be omitted.

[11-3] Elements

The constituent elements (mainly materials) of the magnetic element according to the seventh embodiment are the same as in the above-described first to third embodiments, and a description thereof will be omitted.

As described above, according to the seventh embodiment of the present invention, the same effect as in the fifth embodiment can be obtained.

[12] Eighth Embodiment

In the eighth embodiment, an example of a gate driving magnetic element of type 2 will be described.

[12-1] Structure

FIGS. 22A to 22D are schematic views showing a magnetic element according to the eighth embodiment of the present invention. The structure of the magnetic element according to the eighth embodiment of the present invention will be described below.

Figure 22A:
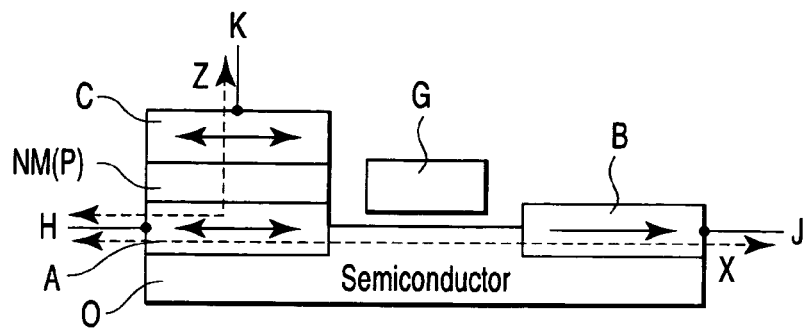
FIGS. 22A, 22B, 22C, and 22D are schematic views of a magnetic element according to the eighth embodiment of the present invention.

As shown in FIG. 22A, the magnetic element of the eighth embodiment is largely different from that of the fifth embodiment in that a semiconductor layer is used as a channel layer O, and a gate electrode G is provided above the channel layer O.

More specifically, the gate electrode G is provided above the channel layer O made of a semiconductor while being insulated from the channel layer O. Magnetic electrodes A and B serving as a source and drain, respectively, are provided on both sides of the gate electrode G. The magnetic electrodes A and B are arranged in contact with the channel layer O and adjacent on the same surface of the channel layer O without contacting each other. A magnetic layer C is provided on the side of the magnetic electrode A. A nonmagnetic layer NM (intermediate layer P) is provided between the magnetic layer C and the magnetic electrode A. Electrodes H, J, and K are connected to the magnetic electrodes A and B and the magnetic layer C, respectively.

A signal X which changes depending on the magnetic arrangement of the magnetic electrodes A and B is output by using the gate electrode G and electrodes H and J. A signal Z to control the magnetization direction of the magnetic electrode A is supplied by using the electrodes K and H.

The magnetic element according to the eighth embodiment is not limited to the structure shown in FIG. 22A and may be variously changed to, e.g., the structures shown in FIGS. 22B to 22D to be described below. The structures shown in FIGS. 22A to 22D may be combined.

Figure 22B:
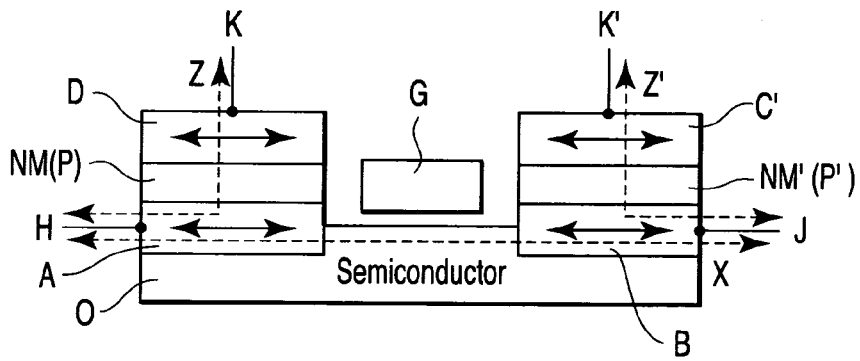

As shown in FIG. 22B, the magnetization of the magnetic electrode B may be reversible. In this case, a magnetic layer C' is provided above the magnetic electrode B. A nonmagnetic layer NM' (intermediate layer P') is provided between the magnetic layer C' and the magnetic electrode B. An electrode K' is connected to the magnetic layer C'. The electrodes K' and J are used to supply a signal Z' to control the magnetization direction of the magnetic electrode B.

Figure 22C:
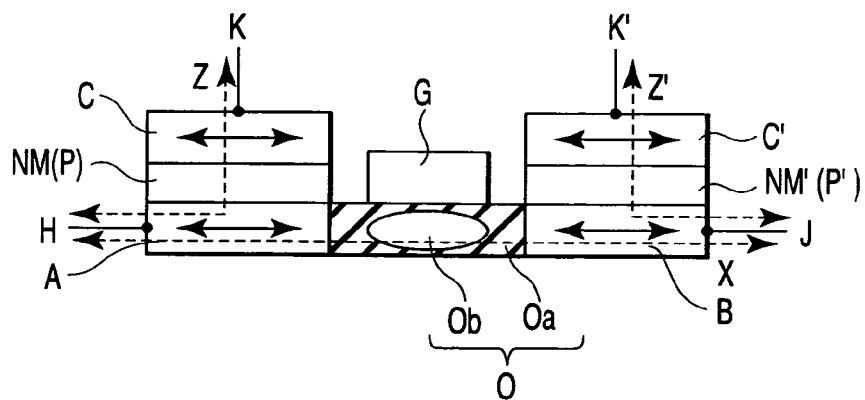

As shown in FIG. 22C, the channel layer O may have a conductive island portion Ob in an insulator Oa. The conductive island portion Ob is made of a semiconductor or metal. This element is a single-electron transistor.

Figure 22D:
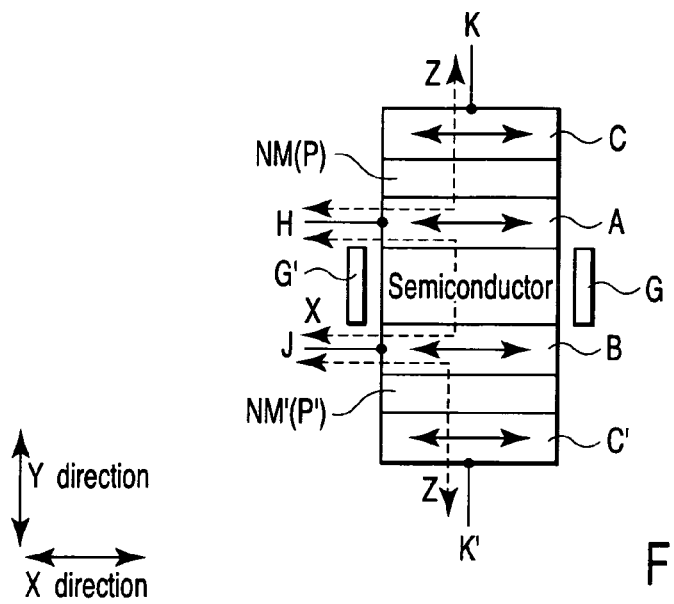
Figure 23A:
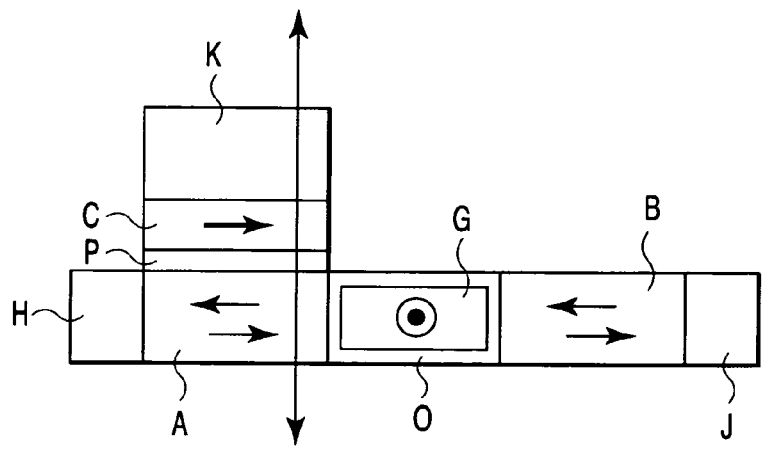
FIGS. 23A, 23B, 23C, and 23D are views showing the layout of a gate driving (spin MOSFET) magnetic element according to the eighth embodiment of the present invention.
Figure 23B:
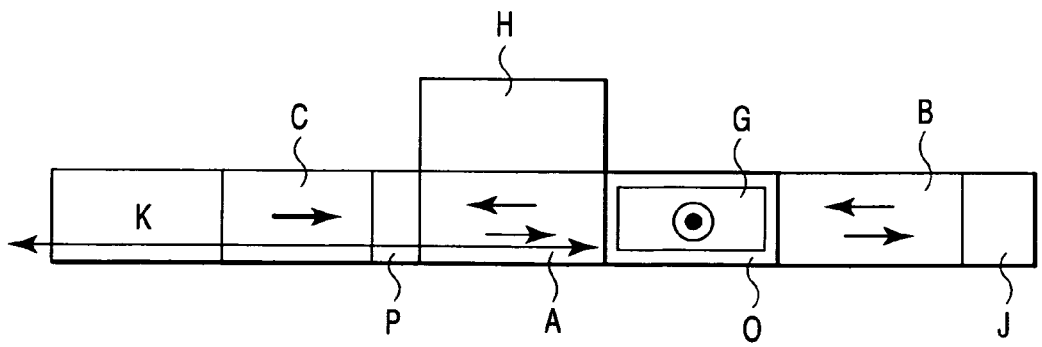
Figure 23C:
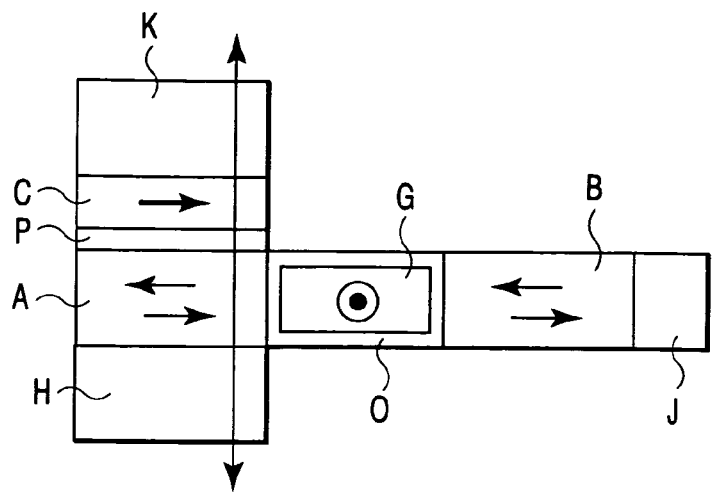
Figure 23D:
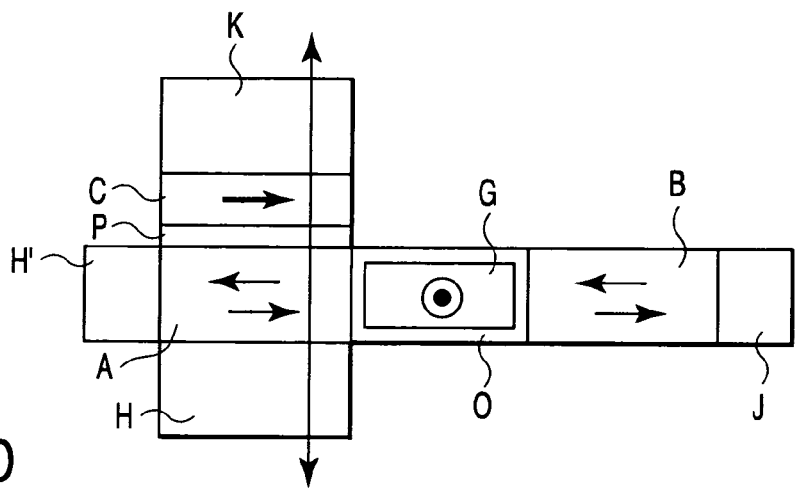

As shown in FIG. 22D, the magnetization of the magnetic electrode B may be reversible, and the layers may be stacked in one direction (Y direction). In this case, the magnetic layer C' is provided under the magnetic electrode B. The nonmagnetic layer NM' (intermediate layer P') is provided between the magnetic layer C' and the magnetic electrode B. The electrode K' is connected to the magnetic layer C'. The electrodes K' and J are used to supply the signal Z' to control the magnetization direction of the magnetic electrode B. Two gate electrodes G and G' may be provided above the channel layer O.

Figure 24A:
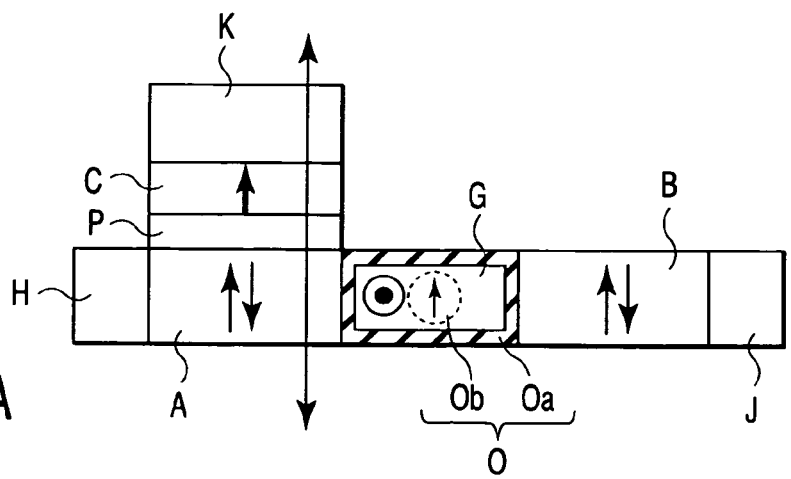
FIGS. 24A, 24B, and 24C are views showing the layout of a gate driving (spin SET) magnetic element according to the eighth embodiment of the present invention.
Figure 24B:
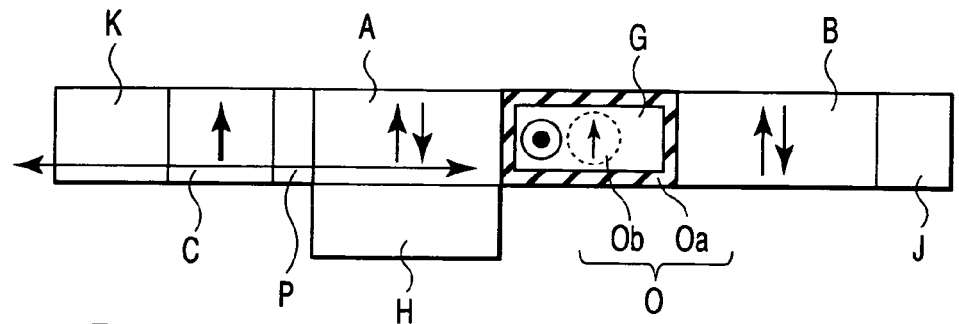
Figure 24C:
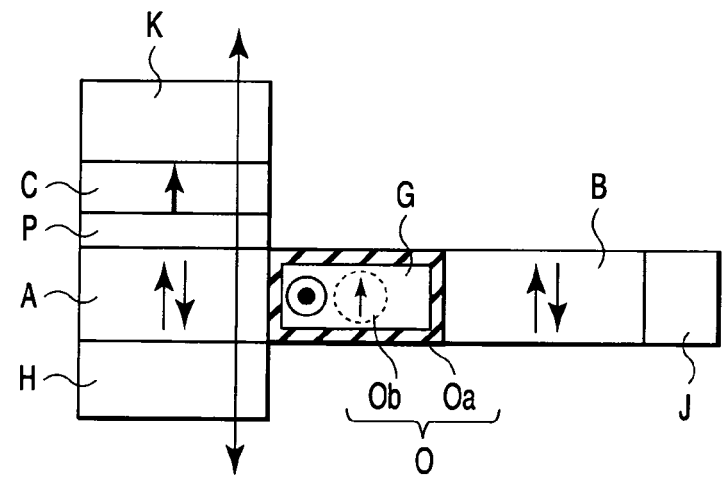
Figure 25A:
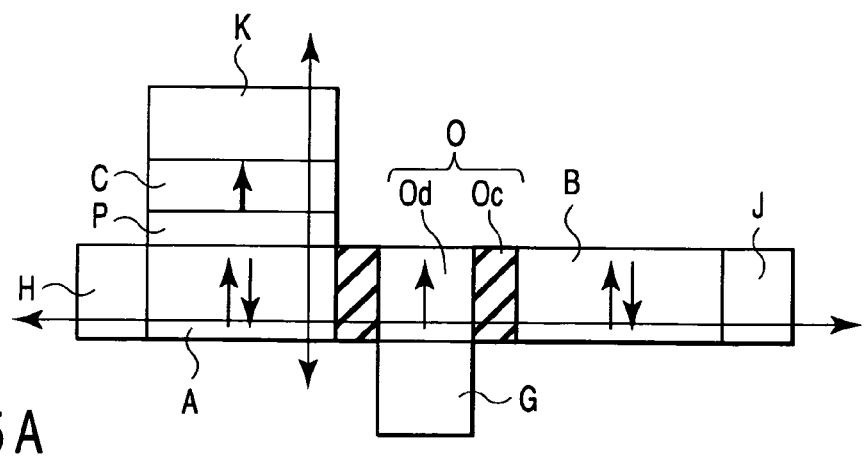
FIGS. 25A, 25B, and 25C are views showing the layout of a gate driving (spin resonance tunneling transistor) magnetic element according to the eighth embodiment of the present invention.
Figure 25B:
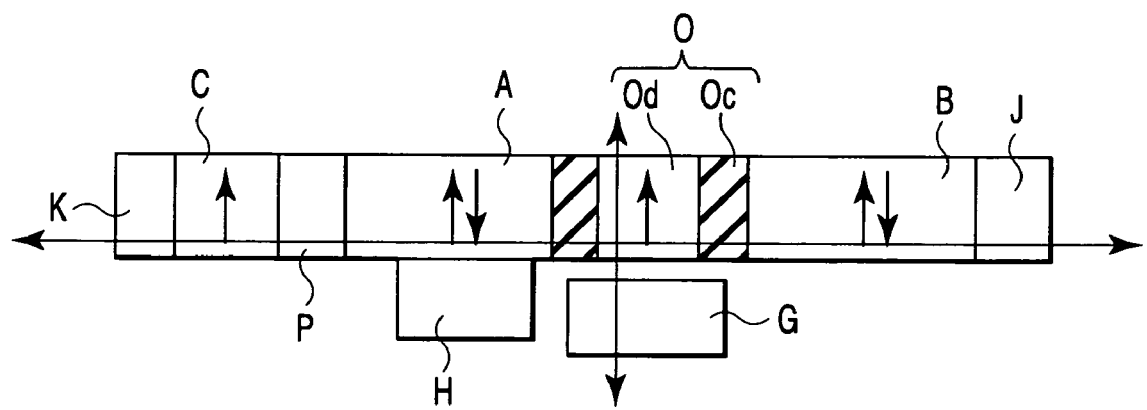
Figure 25C:
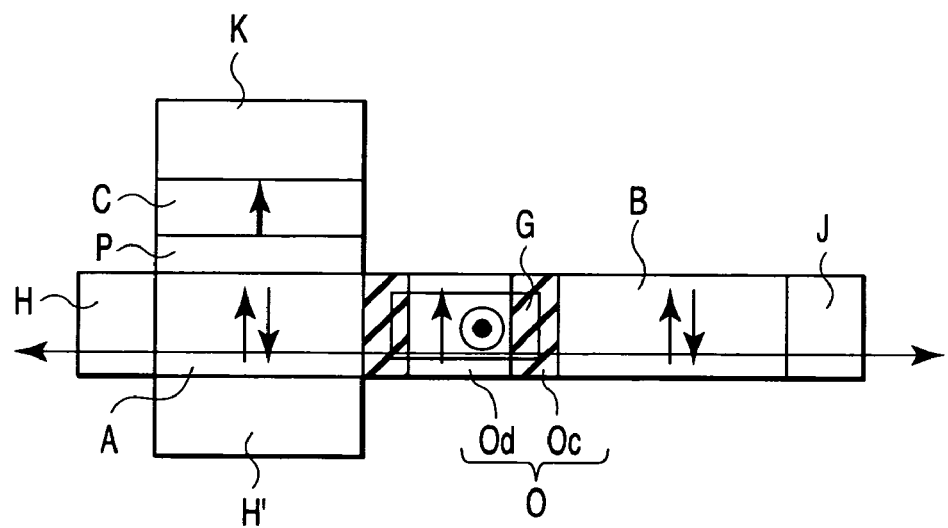

FIGS. 23A to 23D are views showing the layout of a gate driving (spin MOSFET) magnetic element according to the eighth embodiment of the present invention. FIGS. 24A to 24C are views showing the layout of a gate driving (spin SET) magnetic element according to the eighth embodiment of the present invention. FIGS. 25A to 25C are views showing the layout of a gate driving (spin resonance tunneling transistor) magnetic element according to the eighth embodiment of the present invention. The layout of the magnetic element according to the eighth embodiment of the present invention will be described below. The views of the layouts can be regarded as either the plan views or sectional views of the magnetic element.

As shown in FIGS. 23A to 23D, the axis that connects the magnetic electrode A and the magnetic layer C is almost perpendicular to the axis that connects the gate electrode G and the channel layer O (in a direction perpendicular to the drawing surface from the far side to this side). With this structure, spatial interference of interconnections can be prevented. In addition, any operation error of the element caused by interaction between the current flowing through the magnetic electrode A and the electrode K and the bias voltage to the gate electrode G can be prevented. Furthermore, the magnetization of the magnetic electrode A can be prevented from being influenced by a leakage current which is generated when the insulating film (not shown) between the gate electrode G and the channel layer O becomes thin.

Referring to FIGS. 24A to 24C, the channel layer O includes the insulator Oa and the conductive island portion Ob provided in the insulator Oa. The axis that connects the magnetic electrode A and the magnetic layer C is almost perpendicular to the axis that connects the gate electrode G and the conductive island portion Ob of the channel layer O (in a direction perpendicular to the drawing surface from the far side to this side). With this structure, the interconnection leading region can be ensured, and any operation error of the element can be prevented, as in FIGS. 23A to 23D.

Referring to FIGS. 25A to 25C, the channel layer O includes a magnetic electrode Od sandwiched between two insulating layers Oc. The gate electrode G contacts the magnetic electrode Od. The axis that connects the magnetic electrode A and the magnetic layer C is almost perpendicular to the axis that connects the gate electrode G and the channel layer O (in a direction perpendicular to the drawing surface from the far side to this side). With this structure, the interconnection leading region can be ensured, and any operation error of the element can be prevented, as in FIGS. 23A to 23D.

[12-2] Operation

The operation of the magnetic element according to the eighth embodiment of the present invention will be described below. The operation of the structure shown in FIG. 22A will be described here. In this embodiment, two input systems, i.e., input to the gate electrode G and input between the electrodes L and K can be used.

First, a voltage (signal Z) is applied between the electrodes H and K. The magnetization direction of the magnetic electrode A is controlled by using a phenomenon that the magnetic coupling between the magnetic electrode A and the magnetic layer C is changed by the voltage.

Second, in gate voltage driving, a predetermined voltage is applied to the gate electrode G to turn on the channel layer O, as in a normal FET. The current (signal X) flowing between the magnetic electrodes A and B is output by using the electrodes H and J. The value of the current changes depending on the magnetic arrangement of the magnetic electrodes A and B.

[12-3] Elements

The constituent elements (mainly materials) of the magnetic element according to the eighth embodiment are the same as in the above-described first and fourth embodiments, and a description thereof will be omitted.

As described above, according to the eighth embodiment of the present invention, the same effect as in the fifth embodiment can be obtained.

[13] Ninth Embodiment

In the ninth embodiment, an example of a magnetic signal processing device for arithmetic processing, which includes a plurality of magnetic elements, will be described.

Figure 26A:
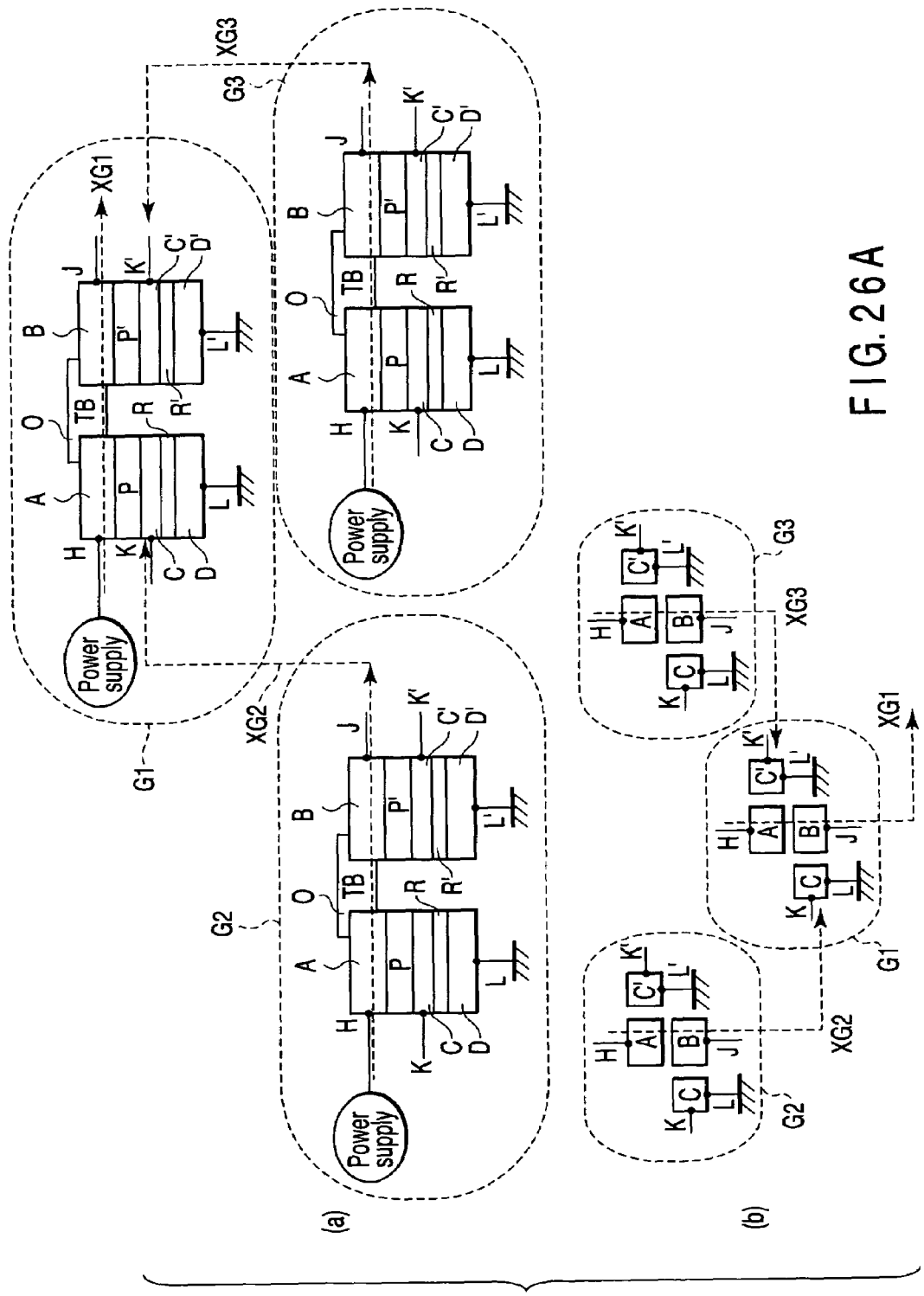
FIGS. 26A(a) and 26A(b) are schematic views of a magnetic signal processing device having a plurality of TMR magnetic elements according to the ninth embodiment of the present invention.

FIGS. 26A(a) and 26A(b) are schematic views of a magnetic signal processing device having a plurality of TMR magnetic elements according to the ninth embodiment of the present invention. The magnetic signal processing device having a plurality of TMR magnetic elements according to the ninth embodiment will be described below.

In the structure shown in FIGS. 26A(a) and 26A(b), a plurality of magnetic elements G1, G2, and G3 shown in FIG. 15E are used. Output signals XG2 and XG3 from the magnetic elements G2 and G3 are input to the remaining magnetic element G1. Hence, the plurality of magnetic elements G1, G2, and G3 can be dependent-connected.

More specifically, the signal XG2 based on the magnetic arrangement between magnetic electrodes A and B of the magnetic element G2 is input to a magnetic layer C of the magnetic element G1. The magnetization direction of the magnetic layer C of the magnetic element G1 is controlled by the signal XG2. The magnetic information of the magnetic layer C is transmitted to the magnetic electrode A by the magnetic coupling between the magnetic electrode A and the magnetic layer C through an insulating layer IN so that the magnetization direction of the magnetic electrode A of the magnetic element G1 is controlled.

Similarly, the signal XG3 based on the magnetic arrangement between magnetic electrodes A and B of the magnetic element G3 is input to a magnetic layer C' of the magnetic element G1. The magnetization direction of the magnetic layer C' of the magnetic element G1 is controlled by the signal XG3. The magnetic information of the magnetic layer C' is transmitted to the magnetic electrode B by the magnetic coupling between the magnetic electrode B and the magnetic layer C' through an insulating layer IN' so that the magnetization direction of the magnetic electrode B of the magnetic element G1 is controlled.

The magnetic information of the magnetic electrodes A and B controlled in the above-described way is output as an output signal XG1 by using electrodes H and J.

Signals equivalent to the TMR output signals XG2 and XG3 may directly be input between electrodes K and L or between electrodes K' and L' of the first magnetic elements G2 and G3. The electrodes L and L' are connected to ground. However, the electrodes K and K' may be connected to ground.

Figure 26B:
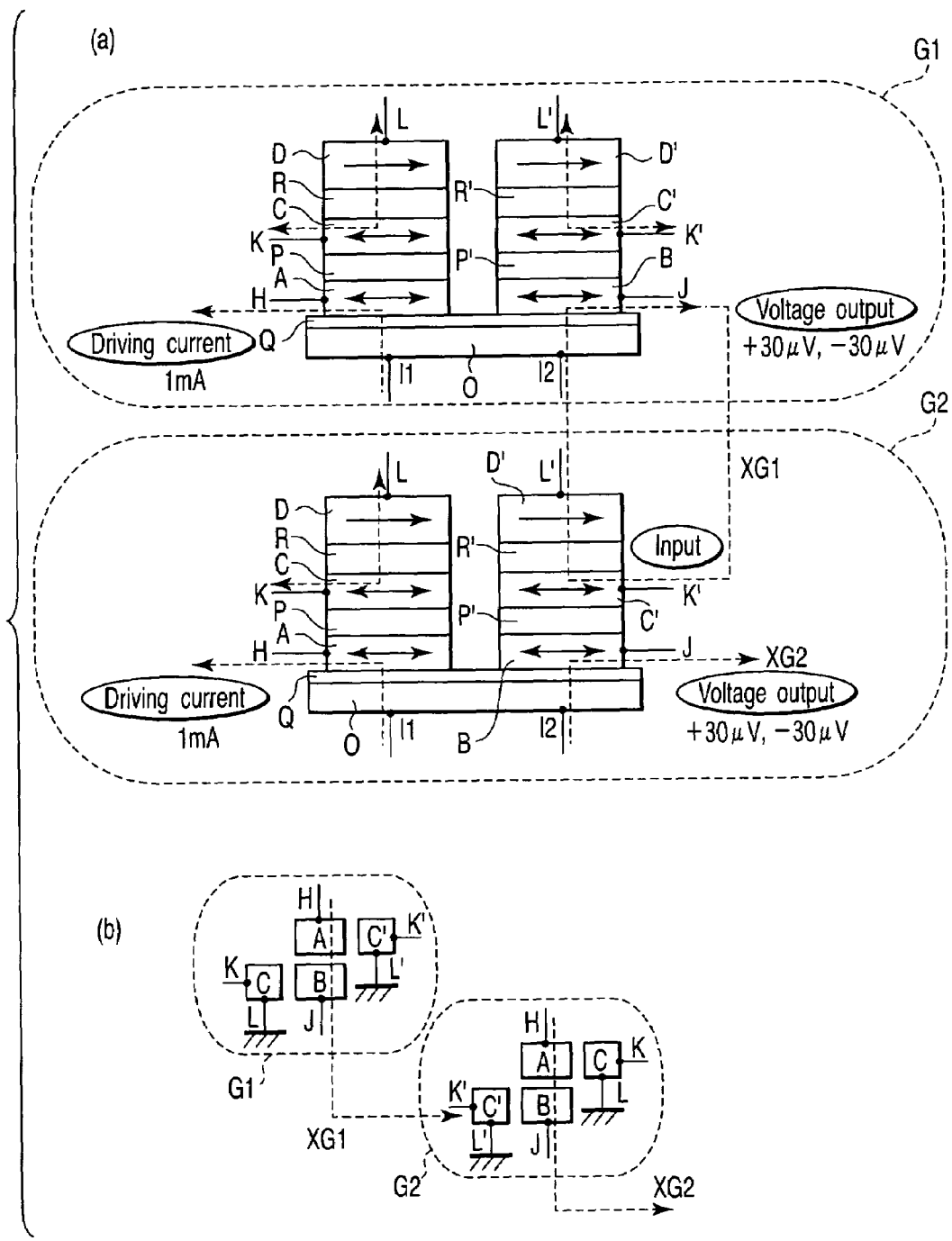
FIGS. 26B(a) and 26B(b) are schematic views of a magnetic signal processing device having a plurality of spin diffusion magnetic elements according to the ninth embodiment of the present invention.

FIGS. 26B(a) and 26B(b) are schematic views of a magnetic signal processing device having a plurality of spin diffusion magnetic elements according to the ninth embodiment of the present invention. The magnetic signal processing device having a plurality of spin diffusion magnetic elements according to the ninth embodiment will be described below.

In the structure shown in FIGS. 26B(a) and 26B(b), the plurality of magnetic elements G1 and G2 shown in FIG. 17B are used. The output signal XG1 from the magnetic element G1 is input to the other magnetic element G2. Hence, the plurality of magnetic elements G1 and G2 can be cascade-connected.

More specifically, the output signal XG1 between the electrodes J and I2 of the magnetic element G1 is input between the electrodes K' and L' of the magnetic element G2. The magnetization direction of the magnetic layer C of the magnetic element G2 is controlled by the signal XG1. The magnetic information of the magnetic layer C is transmitted to the magnetic electrode B by the magnetic coupling between the magnetic electrode B and the magnetic layer C through the insulating layer IN'. The magnetic information based on the magnetic arrangement between the magnetic electrodes A and B is output as the output signal XG2.

A signal equivalent to the output signal XG1 may be directly input between the electrodes K and L or between the electrodes K' and L' of the first magnetic element G1.

Figure 27:
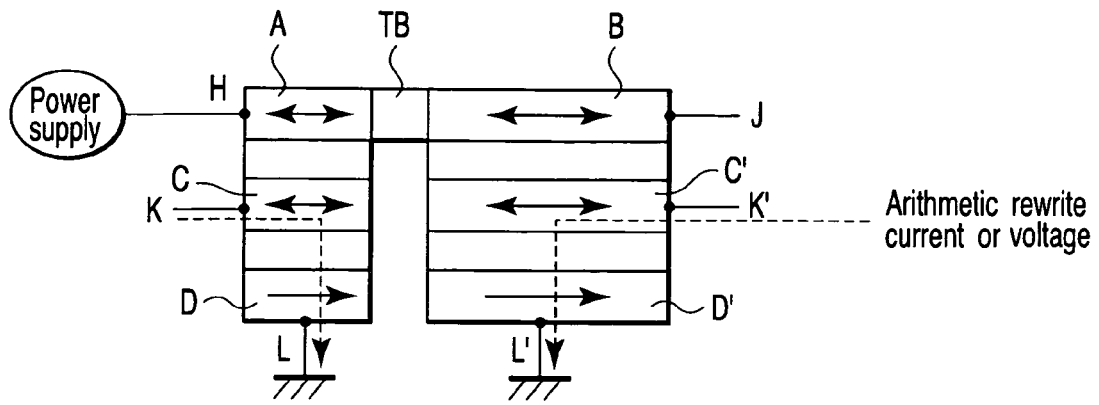
FIG. 27 is a schematic view of a magnetic signal processing device having a plurality of TMR magnetic elements according to the ninth embodiment of the present invention.

As shown in FIG. 27, the input signal to the magnetic layer C' is not limited to the output signal from another magnetic element. A signal (e.g., a current or voltage for an arithmetic rewrite) may be input without intervention of another magnetic element. The manner the plurality of magnetic elements are connected is not limited to the examples shown in FIGS. 26A(a) and 26A(b) and FIGS. 26B(a) and 26B(b), and various changes and modifications can also be made.

As described above, according to the ninth embodiment of the present invention, the same effect as in the first embodiment can be obtained. In addition, an arithmetic device based on a spin combination, which can easily implement cascade connection and output a signal simultaneously with magnetic switching, can be provided.

[14] 10th Embodiment

In the 10th embodiment, an example will be described in which an exclusive OR and inverted logic of an exclusive OR are executed by using a TMR magnetic element.

Figure 28:
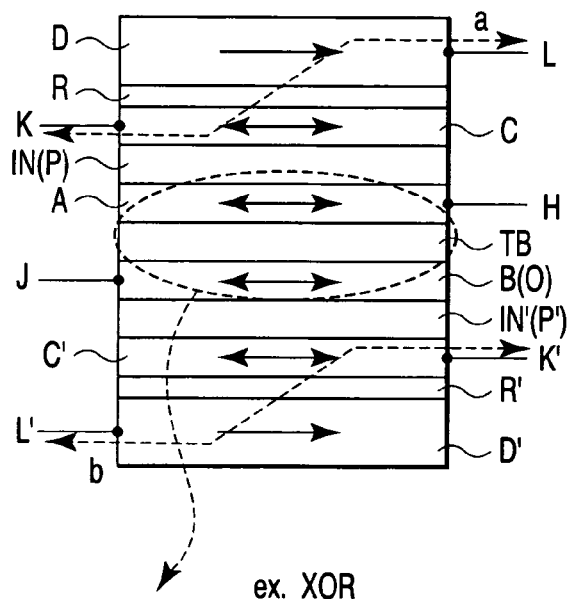
FIG. 28 shows a schematic view and truth table of a magnetic signal processing device having a TMR magnetic element according to the 10th embodiment of the present invention.

FIG. 28 shows a schematic view and truth table of a magnetic signal processing device having a TMR magnetic element according to the 10th embodiment of the present invention. The magnetic signal processing device having a TMR magnetic element according to the 10th embodiment of the present invention will be described below.

As shown in FIG. 28, the TMR magnetic element shown in FIG. 15C is used as the 10th embodiment. Arithmetic processing of an exclusive OR and inverted logic of an exclusive OR is executed in correspondence with two inputs a and b.

Magnetic layers D and D' are made of CoFe. Intermediate layers R and R' are made of Cu. Magnetic layers C and C' are made of FeCoNiB. Intermediate layers P and P' are made of $MnFe_2O_4$ as an insulating ferromagnetic material. Magnetic electrodes A and B are formed from a two-layered film containing FeCoNiB/Co. A tunnel barrier layer TB (channel layer O) is made of MgO.

The two inputs a and b correspond to a current (or voltage) flowing between electrodes K and L and a current (or voltage) flowing between electrodes K' and L', respectively. The current (or voltage) is supplied such that a current Ix or a current of zero (or almost zero) flows when the input signals a and b are 0 or 1. The current value Ix is larger than a critical current value Ixc at which the magnetic layers C and C' cause current-driven magnetization reversal and, more preferably, almost equal to Ip to be described later. The "current value of almost zero" is preferably almost equal to Iap to be described later. In addition, a weak magnetic coupling is preferably present between the magnetic layers C and D and between the magnetic layers C' and D' (in this layer structure example, a negative magnetic coupling by magnetostatic coupling is used). The current corresponding to the input signal a is set such that spin-polarized electrons e flow from the magnetic layer D to the magnetic layer C. The current corresponding to the input signal b is set such that the spin-polarized electrons e flow from the magnetic layer D' to the magnetic layer C'.

The two signals a and b are input. When the signals are 0, the magnetization of the magnetic layers C and C' reverses leftward. When the signals are 1, the magnetization of the magnetic layers C and C' is kept directed rightward. The pieces of magnetic information of the magnetic layers C and C' are transmitted to the magnetic electrodes A and B through the intermediate layers P and P', respectively. As a result, the magnetizations of the magnetic electrodes A and B are combined as shown in the truth table.

As for the output, a voltage is applied between the magnetic electrodes A and B by using a power supply. The combined state of the magnetizations of the magnetic electrodes A and B is extracted as a TMR effect. More specifically, the current Ip which flows when the magnetizations are parallel is large. The current Iap in the antiparallel state is small. When the currents Ip and Iap are set to 0 and 1, respectively, the relationship shown in the truth table is obtained. Hence, an XOR can be executed by one element.

The output currents preferably satisfy Ip>Ixc>Iap because another element can be operated by connecting the output signal to the input of another magnetic element, as shown in FIG. 26A.

In the above-described "exclusive OR", the magnetizations of the magnetic layers D and D' are set to be parallel to each other, as shown in FIG. 28. When the magnetizations of the magnetic layers D and D' are set to be antiparallel to each other, "inverted logic of an exclusive OR" can be executed by using the above-described principle. That is, the element is reconfigurable so that the arithmetic function can be changed by changing the magnetization of the magnetic layer D or D'.

To make the magnetic element reconfigurable, magnetization reversal of the magnetic layers D and D' is executed in the following way. (a) To generate a magnetic field, an interconnection is provided near the magnetic layers D and D', and an external magnetic field is applied. (b) A ferromagnetic portion is provided indirectly or directly adjacent to the magnetic layers D and D' to supply a spin current, thereby executing current-driven magnetization reversal. (c) A ferromagnetic portion is provided adjacent to the magnetic layers D and D' through an insulator+conductive portion, and a voltage is applied between the ferromagnetic portion and the magnetic layer D or C, thereby executing voltage-driven magnetization reversal.

The definitions of the signal setting method, current flow direction, and magnetization direction are not limited to those described above and may be reversed. In accordance with the settings, an exclusive OR or inverted logic of an exclusive OR is executed. The film composition is not limited to the above-described example. The magnetic coupling method is not limited to the above-described example, either.

As described above, according to the 10th embodiment of the present invention, the same effect as in the first embodiment can be obtained. In addition, an exclusive OR and inverted logic of an exclusive OR can be executed by an arithmetic device based on a spin combination.

[15] 11th Embodiment

In the 11th embodiment, an example will be described in which negative (NOT) and affirmative arithmetic processing is executed in correspondence with one input by using a TMR magnetic element similar to the 10th embodiment.

Figure 29:
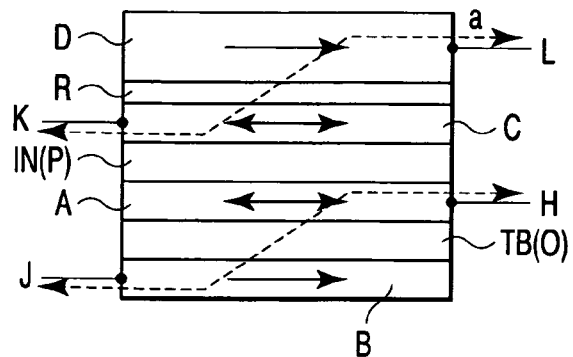
FIG. 29 is a schematic view of a magnetic signal processing device having a TMR magnetic element according to the 11th embodiment of the present invention.

FIG. 29 is a schematic view of a magnetic signal processing device having a TMR magnetic element according to the 11th embodiment of the present invention. The magnetic signal processing device having a TMR magnetic element according to the 11th embodiment of the present invention will be described below.

As shown in FIG. 29, as the 11th embodiment, 1-input arithmetic processing is executed by using the TMR magnetic element shown in FIG. 15A.

One input a corresponds to a current (or voltage) flowing between electrodes K and L. A current Ix or a current (or voltage) of zero (or almost zero) is applied for an input signal of 0 or 1. The current value Ix is larger than a critical current value Ixc at which a magnetic layer C causes current-driven magnetization reversal and, more preferably, almost equal to Ip to be described later. The "current value of almost zero" is preferably almost equal to Iap to be described later. In addition, a weak magnetic coupling is preferably present between the magnetic layers C and D (in this layer structure example, a negative magnetic coupling by magnetostatic coupling is used). The current is set such that spin-polarized electrons e flow from the magnetic layer D to the magnetic layer C.

The signal a is input. When the signal is 0, the magnetization of the magnetic layer C reverses leftward. When the signal is 1, the magnetization of the magnetic layers C and C' is directed rightward. As a result, the combination of the magnetizations of magnetic electrodes A and B is parallel when the input signal a is 1 and antiparallel when the input signal a is 0. When the same definition as in the 10th embodiment is applied to the output, the outputs are 1 and 0, respectively. Hence, negative (NOT) arithmetic processing can be executed.

Referring to FIG. 29, the magnetization of the magnetic layer B is set rightward. When the magnetization is set leftward, affirmative arithmetic processing can be executed. Even when the magnetization of the magnetic layer D is set leftward instead of changing the magnetization direction of the magnetic layer B, affirmative arithmetic processing can be executed. Even in this case, the signal setting method is not limited to that described above and may be reversed. In accordance with the setting, negative or affirmative arithmetic processing is executed.

As described above, according to the 11th embodiment of the present invention, the same effect as in the first embodiment can be obtained. In addition, negative and affirmative arithmetic processing can be executed in correspondence with one input.

[16] 12th Embodiment

In the 12th embodiment, an example will be described in which an exclusive OR and inverted logic of an exclusive OR are executed by using a spin diffusion magnetic element.

Figure 30:
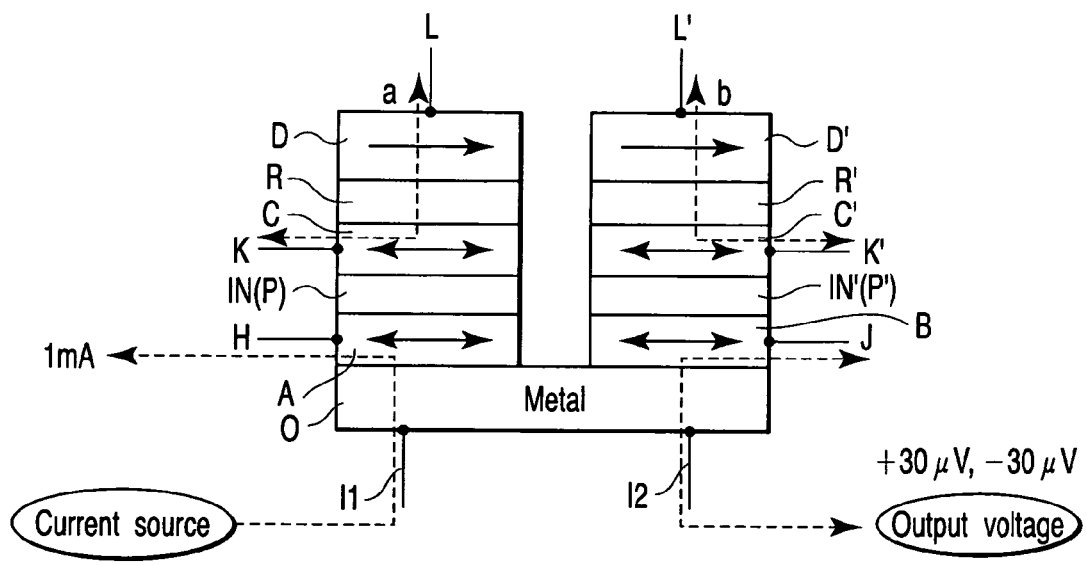
FIG. 30 is a schematic view of a magnetic signal processing device having a spin diffusion magnetic element according to the 12th embodiment of the present invention.

FIG. 30 is a schematic view of a magnetic signal processing device having a spin diffusion magnetic element according to the 12th embodiment of the present invention. The magnetic signal processing device having a spin diffusion magnetic element according to the 12th embodiment of the present invention will be described below.

As shown in FIG. 30, the spin diffusion magnetic element shown in FIG. 16B is used as the 12th embodiment. Arithmetic processing of an exclusive OR and inverted logic of an exclusive OR is executed in correspondence with two inputs a and b.

The two inputs a and b correspond to a current flowing between electrodes K and L and a current flowing between electrodes K' and L', respectively. A voltage is supplied such that a current Iy or Iz (≠Iy) is generated in accordance with the input signals of 0 or 1. Iy and a critical current value when magnetic layers C and C' cause current-driven magnetization reversal and become parallel to magnetic layers D and D' have a relationship |Iy|>|Iyc|. Iz and a critical current value Izc when the magnetization of the magnetic layers C and C' becomes antiparallel to the magnetic layers D and D' have a relationship |Iz|>|Izc|. The signals a and b are input. When the signals are 0, the magnetization of the magnetic layers C and C' is directed rightward. When the signals are 1, the magnetization of the magnetic layers C and C' is directed leftward.

As the output, a voltage generated between electrodes I2 and J when a current is supplied between electrodes I1 and H is used. The generated voltage is Vf or Vaf in accordance with the magnetization relationship (parallel or antiparallel) between magnetic electrodes A and B. When Vf and Vaf are made to correspond to 0 and 1, respectively, an exclusive OR XOR can be executed by one element, as in the 10th embodiment.

When the output is input to another magnetic element, as shown in FIG. 26B, the signal can be transmitted.

Even in the spin diffusion type, when the magnetization relationship between the magnetic layers D and D' is changed, the function can be rewritten (made reconfigurable). To make the magnetic element reconfigurable, magnetization reversal of the magnetic layers D and D' is executed by the methods (a) to (c) described in the 10th embodiment.

The definitions of the signal setting method, current flowing direction, and magnetization direction are not limited to those described above and may be reversed. In accordance with the settings, an exclusive OR or inverted logic of an exclusive OR is executed.

As described above, according to the 12th embodiment of the present invention, the same effect as in the first embodiment can be obtained. In addition, an exclusive OR and inverted logic of an exclusive OR can be executed by an arithmetic device based on a spin combination.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic element comprising:
a channel layer;
a first magnetic electrode which is in contact with the channel layer;
a second magnetic electrode which is in contact with the channel layer and is insulated from the first magnetic electrode;
a first intermediate layer which is provided adjacent to the first magnetic electrode and has a first insulating layer;
a first magnetic layer which is provided in contact with a surface of the first intermediate layer on an opposite side to a surface contacting the first magnetic electrode to transfer magnetization to the first magnetic electrode;
a first electrode which is connected to the first magnetic electrode;
a second electrode which is connected to the second magnetic electrode, at least one of the first electrode and the second electrode outputting a first signal which changes depending on a magnetic arrangement of the first magnetic electrode and the second magnetic electrode;
a second magnetic layer;
a second intermediate layer which is formed between the first magnetic layer and the second magnetic layer;
a third electrode which is connected to the first magnetic layer; and
a fourth electrode which is connected to the second magnetic layer, the third electrode and the fourth electrode supplying a second signal to control a magnetization direction of the first magnetic layer, and
in which a magnetic coupling acts between the first magnetic electrode and the first magnetic layer through the first intermediate layer.

2. The element according to claim 1, wherein
the second signal is supplied by spin-polarized electrons which are injected to one of the first magnetic layer and the second magnetic layer, and
the magnetization direction of the first magnetic layer is controlled by a direction of injection of the spin-polarized electrons.

3. The element according to claim 1, wherein
the second signal is supplied by a voltage applied between the first magnetic layer and the second magnetic layer, and
the magnetization direction of the first magnetic layer is controlled by changing a magnetic coupling between the first magnetic layer and the second magnetic layer by a magnitude of the voltage.

4. The element according to claim 1, wherein the first intermediate layer is essentially made of an insulating magnetic material to transfer parallelly the magnetization direction of the first magnetic layer to the magnetization direction of the first magnetic electrode.

5. The element according to claim 1, wherein the first intermediate layer is essentially made of an insulating non-magnetic material to transfer parallelly or antiparallelly the magnetization direction of the first magnetic layer to the magnetization direction of the first magnetic electrode.

6. The element according to claim 1, wherein the first intermediate layer is essentially made of an insulating non-magnetic material to transfer antiparallelly the magnetization direction of the first magnetic layer to the magnetization direction of the first magnetic electrode.

7. The element according to claim 1, wherein a microwave is generated from the first magnetic layer by causing precession of the magnetization of the first magnetic layer, and the magnetization direction of the first magnetic electrode is controlled by the microwave.

8. The element according to claim 1, wherein
the channel layer is a tunnel barrier layer, and
a tunnel current or voltage serving as the first signal is changed by the magnetic arrangement of the first magnetic electrode and the second magnetic electrode.

9. The element according to claim 1, in which the channel layer is a metal layer,
which further comprises a fifth electrode connected to the channel layer, and
in which one of a voltage and a current is detected, the one of the voltage and current being generated between the second magnetic electrode and the channel layer in accordance with the magnetic arrangement of the first magnetic electrode and the second magnetic electrode by supplying one of a current and a voltage between the first magnetic electrode and the fifth electrode.

10. The element according to claim 9, further comprising a compound layer which is provided between the second magnetic electrode and the channel layer and contains at least one of oxygen, nitrogen, and fluorine.

11. The element according to claim 9, wherein
the fifth electrode has a first electrode portion and a second electrode portion,
the first electrode portion is used to supply one of the current and the voltage between the first magnetic electrode and the fifth electrode, and
the second electrode portion is used to detect one of the voltage and the current generated between the second magnetic electrode and the channel layer in accordance with the magnetic arrangement of the first magnetic electrode and the second magnetic electrode.

12. The element according to claim 1, wherein the first magnetic electrode is essentially made of one of a magnetic material and a magnetic semiconductor which exhibits magnetic fluctuation at room temperature.

13. A magnetic element comprising:
a channel layer;
a first magnetic electrode which is in contact with the channel layer;
a second magnetic electrode which is in contact with the channel layer and is insulated from the first magnetic electrode;
a first intermediate layer which is provided adjacent to the first magnetic electrode and has a first insulating layer;
a first magnetic layer which is provided in contact with a surface of the first intermediate layer on an opposite side to a surface contacting the first magnetic electrode to transfer magnetization to the first magnetic electrode;
a first electrode which is connected to the first magnetic electrode;
a second electrode which is connected to the second magnetic electrode, at least one of the first electrode and the second electrode outputting a first signal which changes depending on a magnetic arrangement of the first magnetic electrode and the second magnetic electrode,
the channel layer is a semiconductor layer and further comprises a gate electrode which is provided on the semiconductor layer via a second insulating layer, or
the channel layer is a layer having a conductive portion in a third insulating layer and further comprises a gate electrode which is provided on the third insulating layer.

14. A magnetic signal processing device comprising a magnetic element,
the magnetic element comprising:
a channel layer;
a first magnetic electrode which is in contact with the channel layer;
a second magnetic electrode which is in contact with the channel layer and is insulated from the first magnetic electrode;
a first intermediate layer which is provided adjacent to the first magnetic electrode and has a first insulating layer;
a first magnetic layer which is provided in contact with a surface of the first intermediate layer on an opposite side to a surface contacting the first magnetic electrode to transfer magnetization to the first magnetic electrode;
a second magnetic layer to transfer magnetization to the second magnetic electrode;
a second intermediate layer which is provided between the second magnetic layer and the second magnetic electrode and has a second insulating layer; and
a first electrode which is connected to the first magnetic electrode; and
a second electrode which is connected to the second magnetic electrode, at least one of the first electrode and the second electrode outputting a first signal which changes depending on a magnetic arrangement of the first magnetic electrode and the second magnetic electrode, and a magnetization direction of the second magnetic layer being transferred to a magnetization direction of the second magnetic electrode by a magnetic coupling which acts between the second magnetic electrode and the second magnetic layer through the second intermediate layer.

15. The device according to claim 14, wherein arithmetic processing of an exclusive OR or an inverted logic of an exclusive OR is executed by inputting a first input signal of 1 or 0 to the first magnetic layer and a second input signal of 0 or 1 to the second magnetic layer, and an execution result is output as the first signal.

16. A magnetic signal processing device comprising a magnetic element,
the magnetic element comprising:
a channel layer;
a first magnetic electrode which is in contact with the channel layer;
a second magnetic electrode which is in contact with the channel layer and is insulated from the first magnetic electrode;
a first intermediate layer which is provided adjacent to the first magnetic electrode and has a first insulating layer;
a first magnetic layer which is provided in contact with a surface of the first intermediate layer on an opposite side to a surface contacting the first magnetic electrode to transfer magnetization to the first magnetic electrode;
a second magnetic layer to transfer magnetization to the second magnetic electrode;
a second intermediate layer which is provided between the second magnetic layer and the second magnetic electrode and has a second insulating layer;
a first electrode which is connected to the first magnetic electrode; and
a second electrode which is connected to the second magnetic electrode, at least one of the first electrode and the second electrode outputting a first signal which changes depending on a magnetic arrangement of the first magnetic electrode and the second magnetic electrode, negative or affirmative arithmetic processing being executed by inputting an input signal of 1 or 0 to the first magnetic layer, and an execution result being output as the first signal.

* * * * *